US012762300B2

(12) United States Patent
Johnson et al.

(10) Patent No.: US 12,762,300 B2
(45) Date of Patent: Oct. 13, 2026

(54) METHODS FOR DEVELOPING PATH PLANS FOR ROLLOUT COMPACTION OF COMPOSITE PLIES DURING COMPOSITE MANUFACTURING

(71) Applicants: The Boeing Company, Arlington, VA (US); University of Southern California, Los Angeles, CA (US)

(72) Inventors: Brice A. Johnson, Seattle, WA (US); Sangvavann Heng, Buena Park, CA (US); Christopher R. Brown, Seattle, WA (US); Lisa C. Zgherea, Auburn, WA (US); Brian J. Smith, Seattle, WA (US); Ricardo A. Fritzke, Sammamish, WA (US); Erik N. Wienhold, Seattle, WA (US); Satyandra Kumar Gupta, Los Angeles, CA (US); Alec Christopher Kanyuck, Laurel, MD (US); Minseok Jeon, Los Angeles, CA (US)

(73) Assignees: The Boeing Company, Arlington, VA (US); University of Southern California, Los Angeles, CA (US)

( * ) Notice: Subject to any disclaimer, the term of this patent is extended or adjusted under 35 U.S.C. 154(b) by 187 days.

(21) Appl. No.: 18/892,684

(22) Filed: Sep. 23, 2024

(65) Prior Publication Data

US 2025/0170755 A1 May 29, 2025

Related U.S. Application Data

(60) Provisional application No. 63/603,718, filed on Nov. 29, 2023.

(51) Int. Cl.
*G06F 30/17* (2020.01)
*B28B 17/00* (2006.01)
(Continued)

(52) U.S. Cl.
CPC .......... *G06F 30/17* (2020.01); *B28B 17/0081* (2013.01); *B28B 23/02* (2013.01);
(Continued)

(58) Field of Classification Search
CPC ......... G06F 30/17; G06T 7/001; B29C 70/38; B29C 70/386
See application file for complete search history.

(56) References Cited

U.S. PATENT DOCUMENTS 11,130,329 B2 9/2021 McIver et al.
2016/0341671 A1 11/2016 Maass et al.
(Continued)

FOREIGN PATENT DOCUMENTS

CN 117261284 A 12/2023
EP 3552809 A1 10/2019

OTHER PUBLICATIONS

European Patent Office, Netherlands Search Report and Written Opinion, NL App. No. 2036862 (Jul. 15, 2024).
(Continued)

*Primary Examiner* — Atul P. Khare
(74) *Attorney, Agent, or Firm* — Walters & Wasylyna LLC

(57) ABSTRACT

Methods for developing a path plan for rollout compaction of a composite ply during composite manufacturing include: selecting a working path plan data file from a working path plan repository, running a path adaptation application program to access compaction history data files in a compaction history repository relating to the working path plan data file and to identify an inconsistency in the compaction history data files that is not resolved in the working path plan data file and generating a path adaptation for the working path plan data file based on the inconsistency that is not resolved to form an adapted path plan data file defining an adapted
(Continued)

path plan that includes the path adaptation. Additional methods include using path plans for compaction on the layup tool, capturing image data and processing the image data to build and/or add to the compaction history data file.

20 Claims, 35 Drawing Sheets

(51) Int. Cl.

| | |
|---|---|
| ***B28B 23/02*** | (2006.01) |
| ***B29C 70/38*** | (2006.01) |
| ***G06T 7/00*** | (2017.01) |

(52) U.S. Cl.

CPC ............ *B29C 70/38* (2013.01); *B29C 70/386* (2013.01); *G06T 7/001* (2013.01); *G06T 2207/30108* (2013.01)

(56) References Cited

U.S. PATENT DOCUMENTS

| | | | | |
|---|---|---|---|---|
| 2021/0394432 | A1 | 12/2021 | Lalonde et al. | |
| 2023/0051895 | A1 | 2/2023 | Winfree et al. | |
| 2023/0173748 | A1 | 6/2023 | Johnson et al. | |
| 2024/0280544 | A1* | 8/2024 | Goertz | G01N 29/265 |
| 2025/0170757 | A1* | 5/2025 | Johnson | B28B 3/12 |
| 2025/0170787 | A1* | 5/2025 | Johnson | G05B 19/4207 |

OTHER PUBLICATIONS

Malhan et al: "Automated planning for robotic layup of composite prepreg," Robotics and Computer Integrated Manufacturing, vol. 67, pp. 1-27 (Feb. 1, 2021).

Wikipedia: "Ceramic matrix composite," (Mar. 17, 2020). URL: https://en.wikipedia.org/wiki/Ceramic_matrix_composite.

European Patent Office, Netherlands Search Report and Written Opinion, NL App. No. 2036864 (Jul. 15, 2024).

Malhan et al: "Determining Feasible Robot Placements in Robotic Cells for Composite Prepreg Sheet Layup," vol. 1: Additive Manufacturing; Manufacturing Equipment and Systems; Bio and Sustainable Manufacturing (Jun. 10, 2019).

Ammar et al: "Developing a Trajectory Planning for Curved-Contoured Surfaces for Use by 8-DoF Workcell in Robotic Fibre Placement," IOP Conference Series: Materials Science and Engineering, vol. 859, No. 1, pp. 012018 (May 1, 2020).

Parmar et al: "Advanced robotics and additive manufacturing of composites: towards a new era in Industry 4.0," Materials and Manufacturing Processes, vol. 37, No. 5, pp. 483-517 (Feb. 5, 2021).

European Patent Office, Netherlands Search Report and Written Opinion, NL App. No. 2036863 (Jul. 17, 2024).

Chen et al: "Intelligent Inspection System Based on Infrared Vision for Automated Fiber Placement," 2018 IEEE International Conference on Mechatronics and Automation (ICMA), IEEE, pp. 918-923 (Aug. 5, 2018).

European Search Report, Extended European Search Report, App. No. 24202434.7 (Mar. 21, 2025).

European Patent Office, Extended European Search Report, App. No. 24202436.2 (Mar. 31, 2025).

European Patent Office, Extended European Search Report, App. No. 24202435.4 (Mar. 31, 2025).

* cited by examiner

METHODS FOR DEVELOPING PATH PLANS FOR ROLLOUT COMPACTION OF COMPOSITE PLIES DURING COMPOSITE MANUFACTURING

PRIORITY

This application claims priority from U.S. Ser. No. 63/603,718 filed on Nov. 29, 2023, the entire contents of which are incorporated herein by reference.

GOVERNMENT CONTRACT

This invention was made with Government support under contract number ARM-TEC-22-01-F-02 awarded by the Department of Defense. The government has certain rights in this invention.

FIELD

The present disclosure relates generally to developing path plans for rollout compaction of composite plies during composite manufacturing and, particularly, to adapting existing path plans to improve compaction based on inconsistencies in compaction history data. The disclosed path plans are for use with ceramic matrix composite plies. However, certain aspects of the methods may be used for other types of plies. The path plans are designed for automated compaction rollers in a composite manufacturing layup cell. For example, the layup cell may be equipped with surface imaging technology to identify irregularities and potential inconsistencies in areas in the ceramic matrix composite ply after the compaction. Detected inconsistencies in the compaction are resolved by adaptation of the path plan. The path plans and the surface imaging technology have applications relating to various industries and products such as aircraft as well as other types of vehicles and transportation equipment. Applications in the manufacture of various other types of products with composite parts are also contemplated.

BACKGROUND

Currently, compaction of ceramic matrix composite plies on layup tools is a manual operation performed using compaction roller hand tools. Existing manual compaction operations also include the use of sweeps, hand pressure and vacuum bags, generally ply by ply. This results in variable quality and inconsistencies in the compaction. The manual operations using the compaction roller hand tools require skilled technicians. Additionally, such manual operations are time intensive, require inspection and rework and lead to overall increased life cycle time for compaction of the ceramic matrix composite ply on the layup tool or on the prior placed ply.

Accordingly, those skilled in the art continue with research and development efforts to introduce automated techniques for compaction of certain composite plies on layup tools, particularly ceramic matrix composite plies.

SUMMARY

Disclosed are examples of methods for developing a path plan for rollout compaction of a composite ply during composite manufacturing. The following is a non-exhaustive list of examples, which may or may not be claimed, of the subject matter according to the present disclosure.

In an example, the disclosed method for developing a path plan for rollout compaction of a composite ply during composite manufacturing includes: (1) selecting a working path plan data file from a working path plan repository, the working path plan data file defining the path plan for a compaction roller to compact a ceramic matrix composite ply on a layup tool or on a prior placed ply during the composite manufacturing; (2) running a path adaptation application program to access compaction history data files in a compaction history repository relating to the working path plan data file and to identify at least one inconsistency in the compaction history data files that is not resolved in the working path plan data file; and (3) generating at least one path adaptation for the working path plan data file based on the at least one inconsistency that is not resolved to form an adapted path plan data file defining an adapted path plan that includes the at least one path adaptation.

In another example, the disclosed method for developing a path plan for rollout compaction of a composite ply during composite manufacturing includes: (1) selecting a working path plan data file from a working path plan repository; (2) running a compaction application program using the working path plan data file for automated manipulation of a compaction roller to compact a ceramic matrix composite ply on a layup tool or on a prior placed ply; (3) capturing image data of the ceramic matrix composite ply after compaction on the layup tool or on the prior placed ply using a surface imaging device; (4) at least temporarily storing the image data for the ceramic matrix composite ply after the compaction in a ply image data file; and (5) processing the ply image data file to determine if one or more irregularity is present in the ceramic matrix composite ply on the layup tool or on the prior placed ply after the compaction.

In yet another example, the disclosed method for developing a path plan for rollout compaction of a composite ply during composite manufacturing includes: (1) selecting a nominal path plan data file from a nominal path plan repository; (2) running a compaction application program using the nominal path plan data file for automated manipulation of a compaction roller to compact a ceramic matrix composite ply on a layup tool or on a prior placed ply; (3) capturing image data of the ceramic matrix composite ply after compaction on the layup tool or on the prior placed ply using a surface imaging device; (4) at least temporarily storing the image data for the ceramic matrix composite ply after the compaction in a ply image data file; and (5) processing the ply image data file to identify one or more inconsistency in the ceramic matrix composite ply on the layup tool or on the prior placed ply after the compaction and to form a compaction history data file with the image data of the ply image data file and additional data regarding the one or more inconsistency.

Other examples of the disclosed methods for developing a path plan for rollout compaction of a composite ply during composite manufacturing will become apparent from the following detailed description, the accompanying drawings and the appended claims.

DETAILED DESCRIPTION

Various examples of methods for developing path plans for rollout compaction of composite plies during composite manufacturing are disclosed herein. The various examples provide techniques for automated robotic path planning using machine learning to adapt from previous path plans to optimize a first run compaction routine as a combination of autogenerated paths as well as corrective paths. Over time, the system will adapt and modify the run to become more efficient. The use of machine learning optimizes robotic path planning to achieve reduced touch-time and first-time quality. The disclosed methods also provide a way to automate adaptive path planning for unique tools and unique materials.

Various examples of the methods disclosed herein refer to composite plies. The composite plies are formed by cutting woven fabric to a desired size for the rollout compaction on a layup tool. The woven fabric can be in various weave styles. For example, the fabric may have an orthogonal weave of zero-degree and 90-degree fibers in the warp and weft directions. Where a single fiber orientation is referenced below, it is understood to refer to a primary fiber of an interwoven fabric that also includes at least one secondary fiber. The single fiber orientation described may be based on the warp fibers, the weft fibers or any directional set of interwoven fibers.

Figure 38:
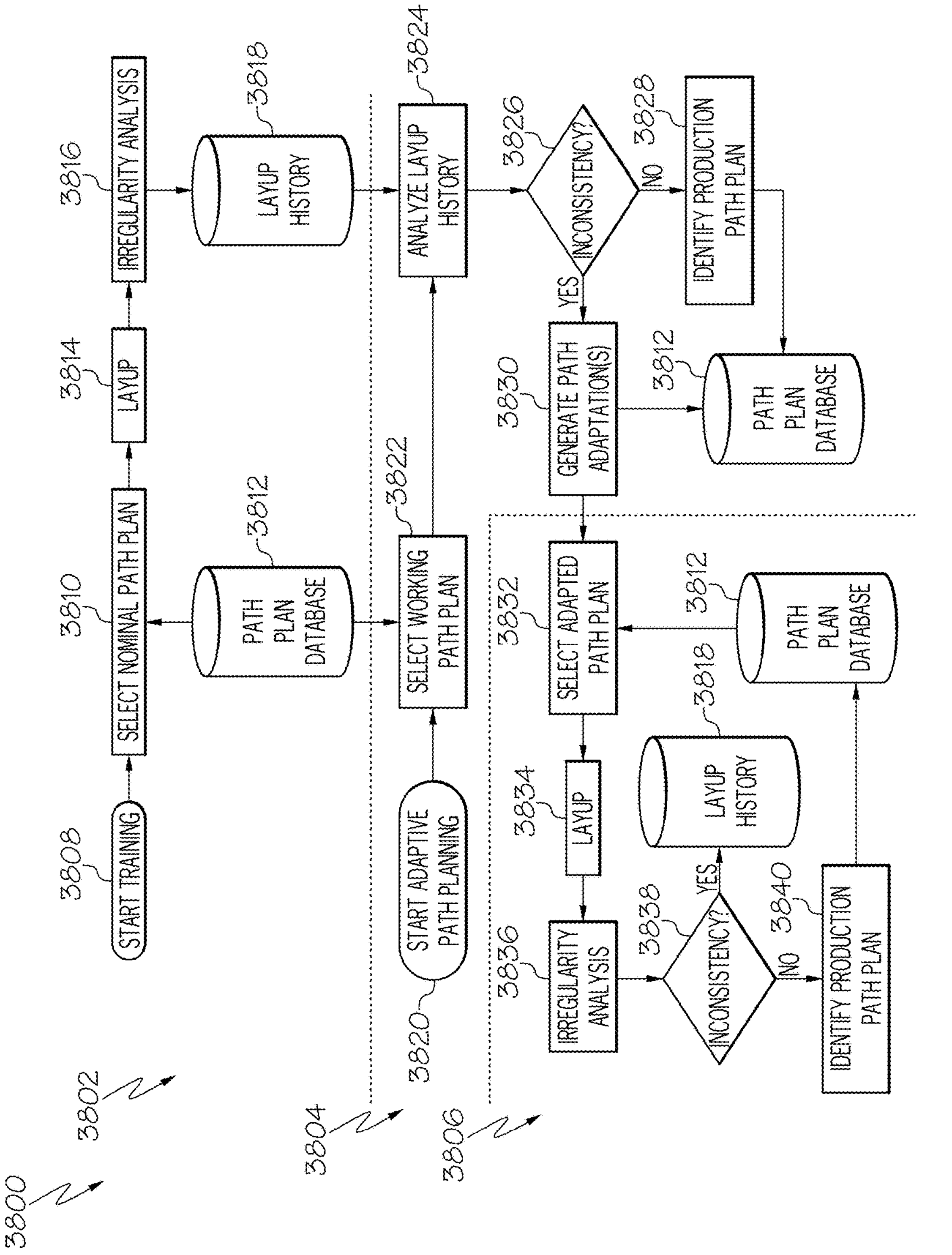
FIG. 38 is a flow diagram of another example of a method for developing a path plan for rollout compaction of a composite ply during composite manufacturing.

With reference to FIG. 38, an example of an overall process 3800 for developing a path plan 3500 for rollout compaction of a composite ply during composite manufacturing 3402 includes i) a training process 3802, ii) an adaptive path planning process 3804 and iii) an adaptive path plan utilization and analysis process 3806. Various examples of the training process 3802 are disclosed in FIG. 19-30 and the paragraphs referring thereto. Various examples of the adaptive path planning process 3804 are disclosed in FIG. 1-8 and the paragraphs referring thereto. Various examples of the adaptive path plan utilization and analysis process 3806 are disclosed in FIG. 9-18 and the paragraphs referring thereto.

The training process 3802 begins at 3808 and proceeds with selection of a nominal path plan 3810 from a path plan database 3812. At 3814, a ceramic matrix composite ply 3106 is placed on a layup tool 3108 and compacted using a compaction roller 3102 based on the nominal path plan. At 3816, an irregularity analysis is performed to identify irregularities and determine whether each irregularity is an inconsistency or a tolerable irregularity. The results of the irregularity analysis, particularly the inconsistencies, are stored in a layup history storage area 3818. The layup 3814 and irregularity analysis 3816 of the training process 3802 may be repeated until a usable training data set is stored in the layup history storage area 3818.

The adaptive path planning process 3804 begins at 3820 with selection of a working path plan 3822 from the path plan database 3812. For example, the working path plan has a usable training data set stored in the layup history storage area 3818. At 3824, compaction history data that is relevant to the working path plan is retrieved from the layup history storage area 3818 and analyzed. At 3826, if no inconsistencies are present in the compaction history data, the working path plan is identified as a production path plan 3828 and stored as such in the path plan database 3812. Conversely, at 3826, if inconsistencies are present the adaptive path planning process 3804 focuses on the inconsistencies and continues. For example, at 3830, a path adaptation is selected from various types of path adaptations to resolve each inconsistency from the compaction history data. Upon completion of 3830, an adapted path plan is stored in the path plan database 3812.

The adaptive path plan utilization and analysis process 3806 begins with selection of an adapted path plan 3832 from the generation of path adaptation(s) 3830 or from the path plan database 3812. At 3834, a ceramic matrix composite ply 3106 is placed on a layup tool 3108 and compacted using the compaction roller 3102 based on the adapted path plan. At 3836, an irregularity analysis is performed to identify irregularities and determine whether each irregularity is an inconsistency or a tolerable irregularity. At 3838, if no inconsistencies are present, the adapted path plan is identified as a production path plan 3840 and stored as such in the path plan database 3812. Conversely, at 3838, if inconsistencies are present the results of the irregularity analysis, particularly the inconsistencies, are stored in the layup history storage area 3818 and the overall process 3800 may continue to 3804 for further adaptive path planning.

Figure 31:
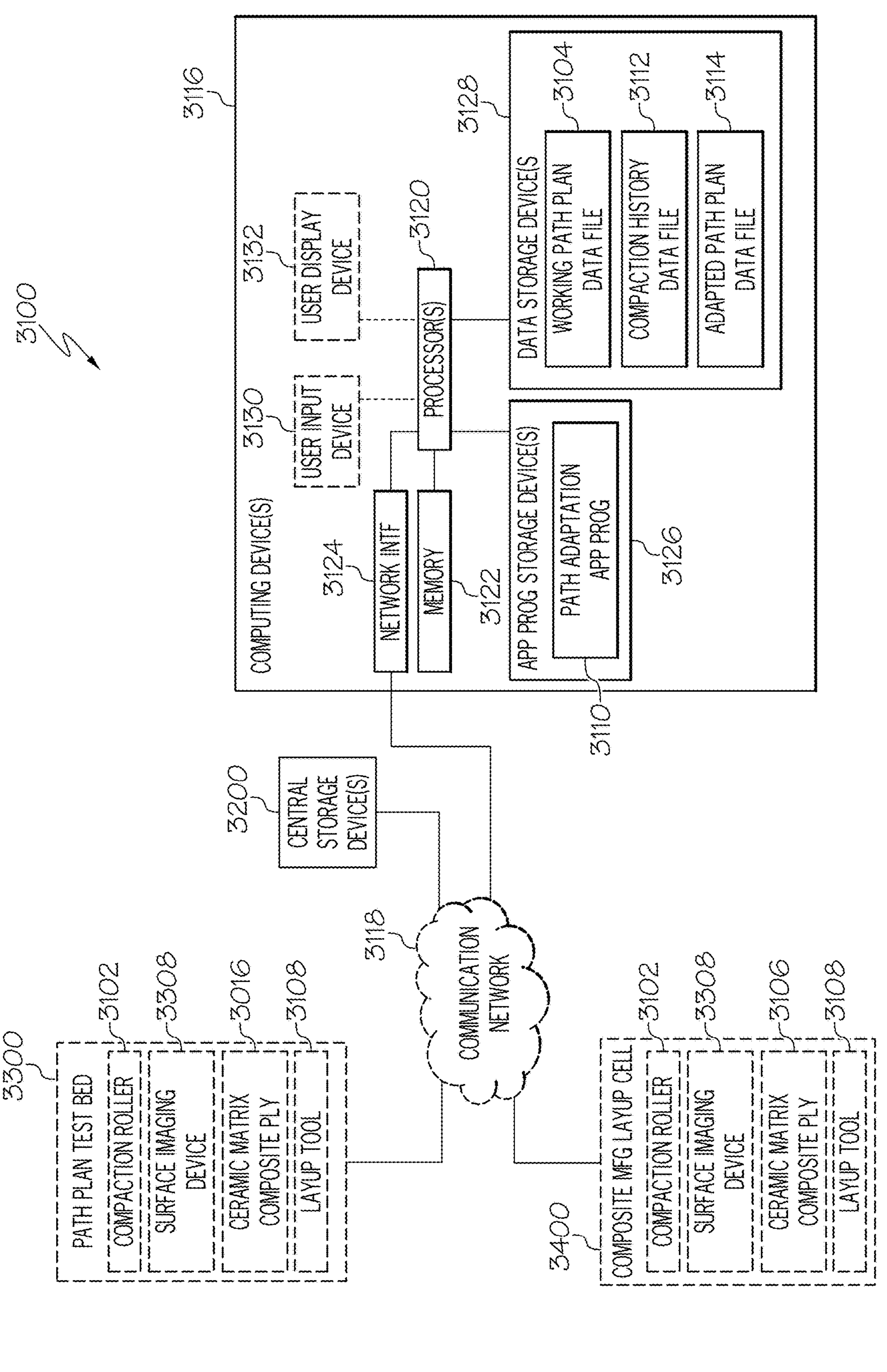
FIG. 31 is a functional block diagram of an example of a path planning development environment.
Figure 32:
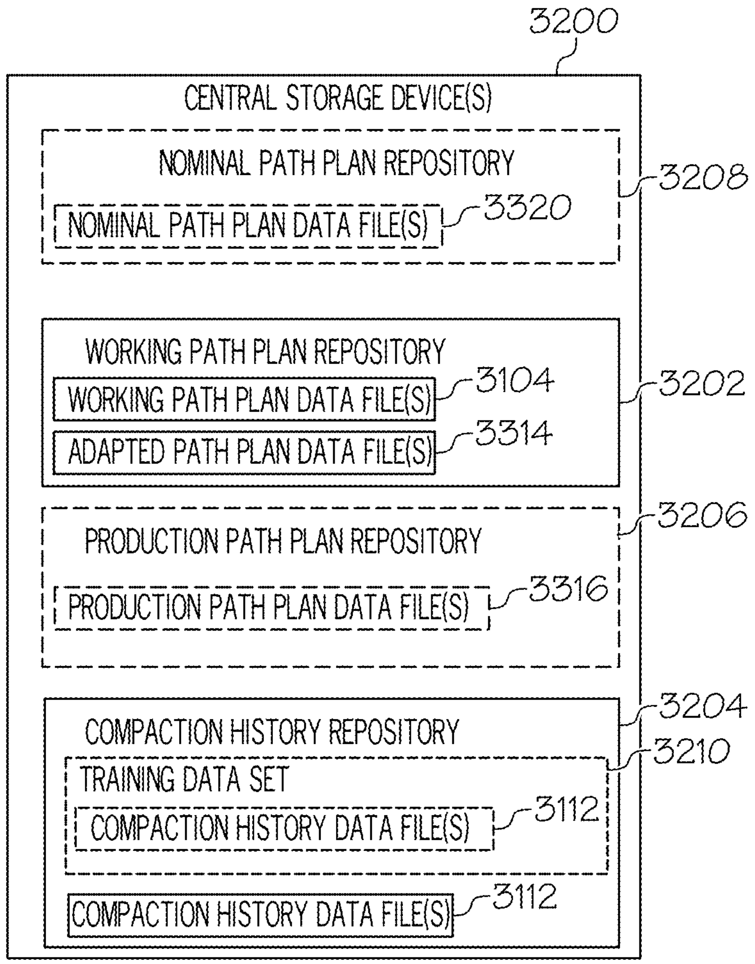
FIG. 32 is a functional block diagram of an example of a central storage device.
Figure 33:
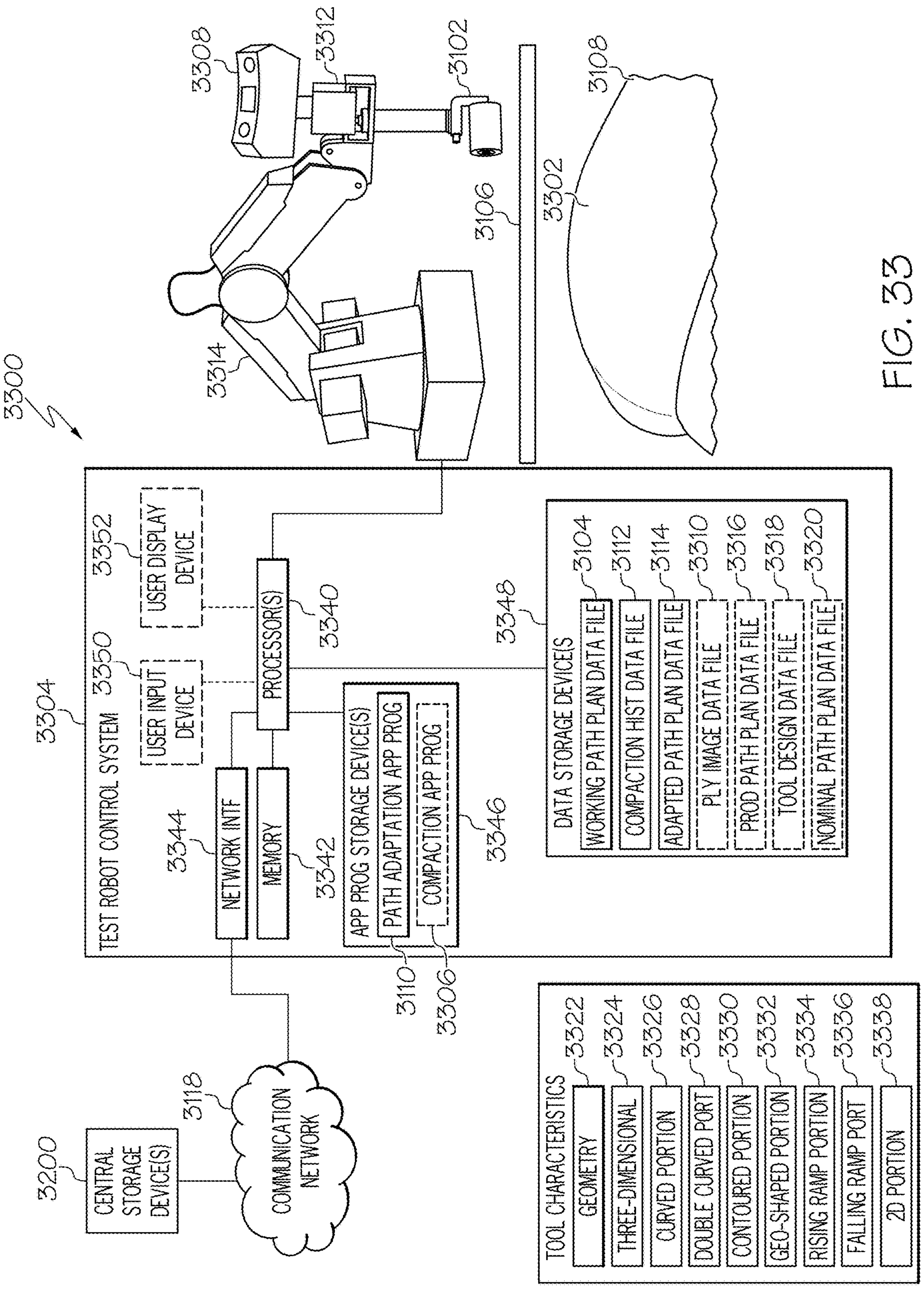
FIG. 33 is a functional block diagram of an example of a path plan test bed.
Figure 34:
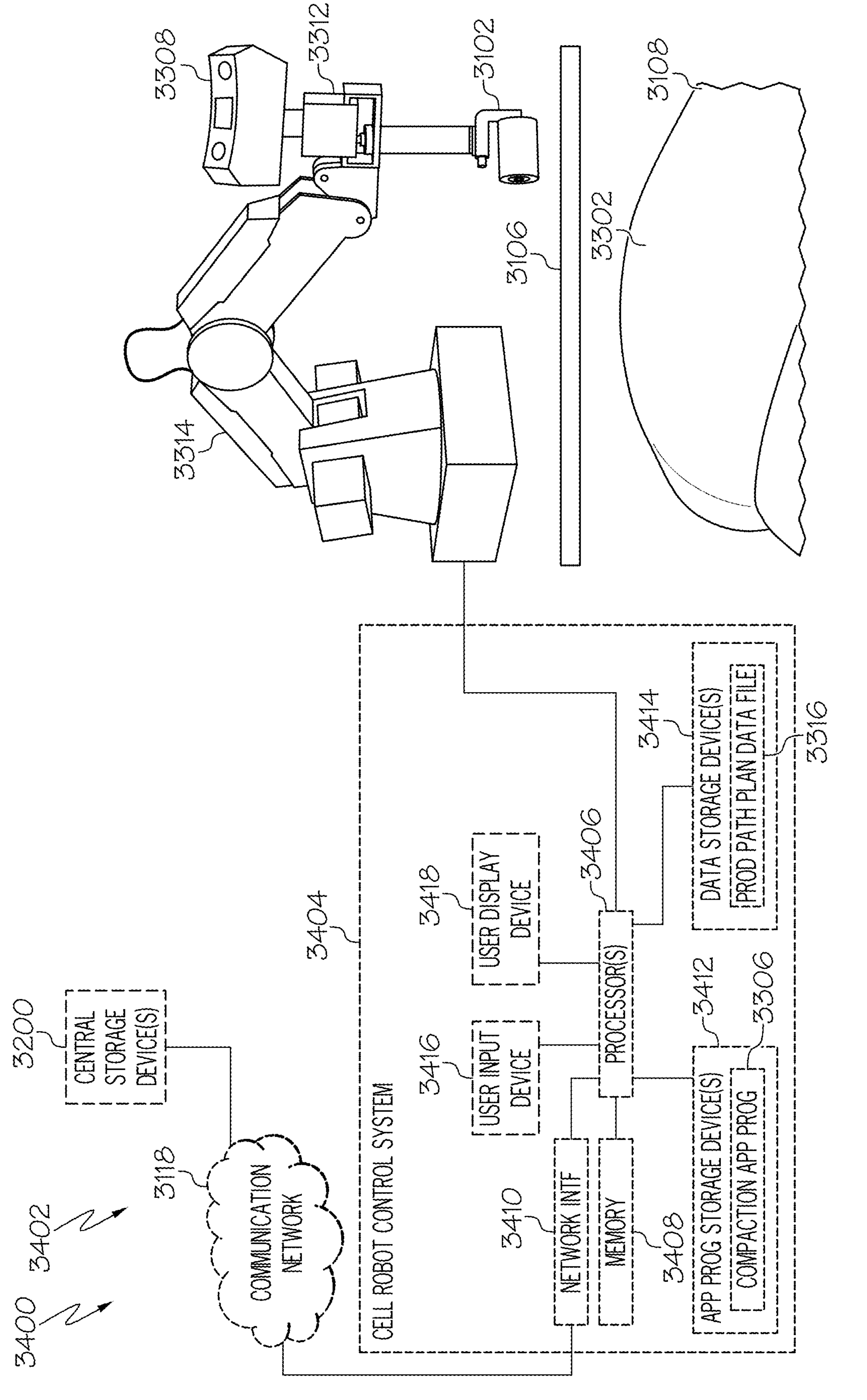
FIG. 34 is a functional block diagram of an example of a composite manufacturing layup cell.
Figure 35:
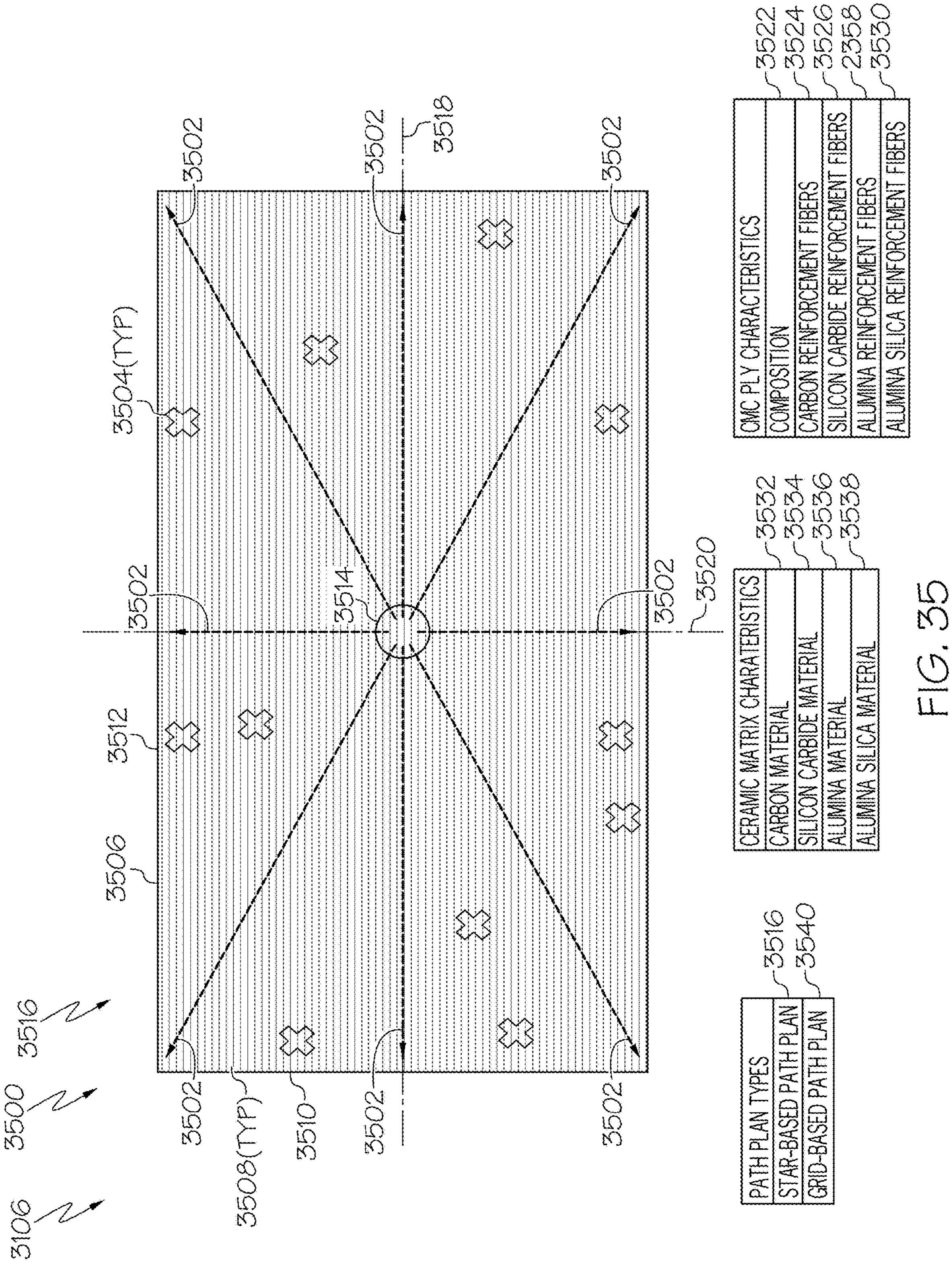
FIG. 35 is a functional diagram of an example of a path plan for a ceramic matrix composite ply in which ceramic reinforcement fibers are at a zero-degree orientation.
Figure 36:
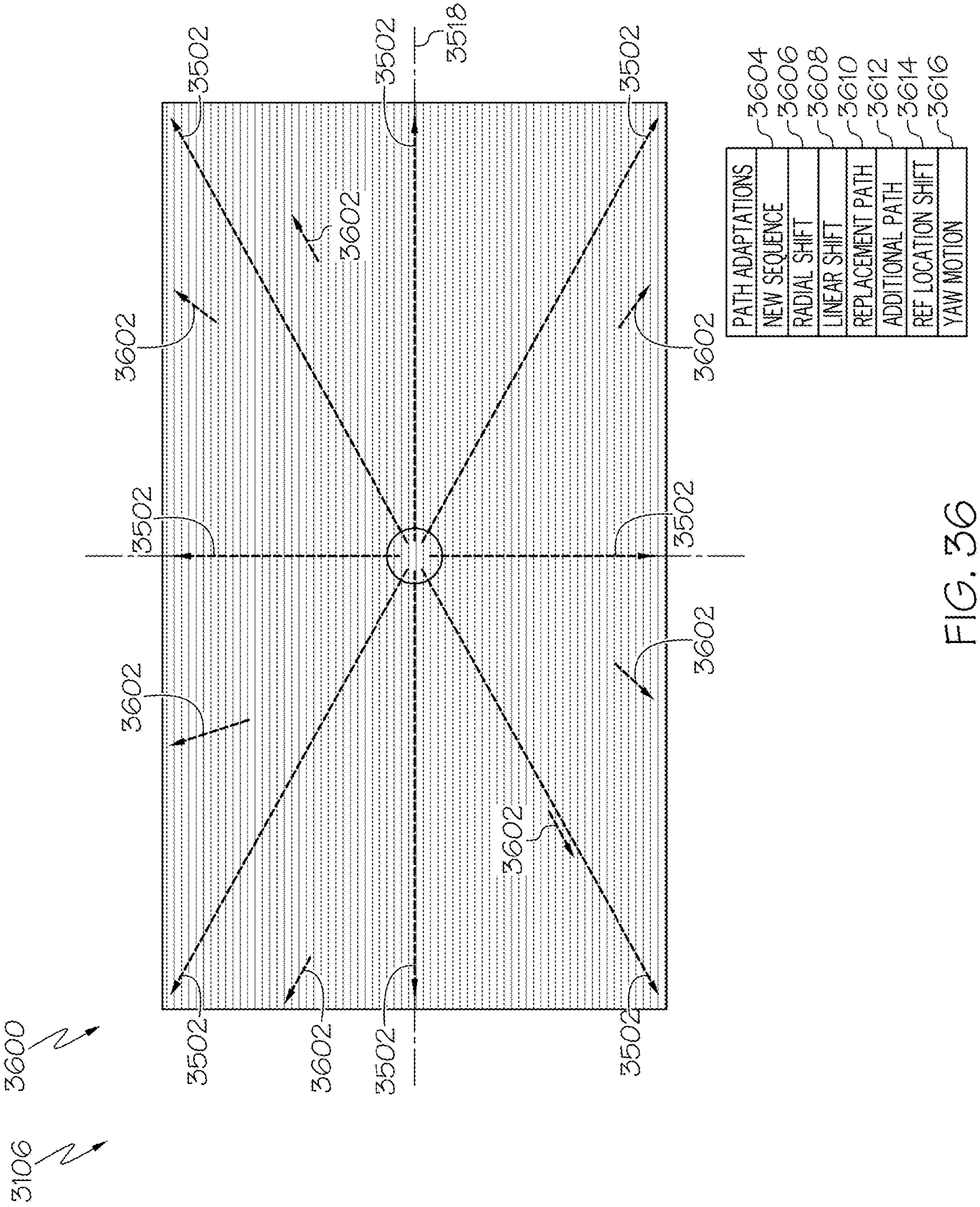
FIG. 36 is a functional diagram of an example of an adapted path plan for a ceramic matrix composite ply in which ceramic reinforcement fibers are at a zero-degree orientation.
Figure 37A:
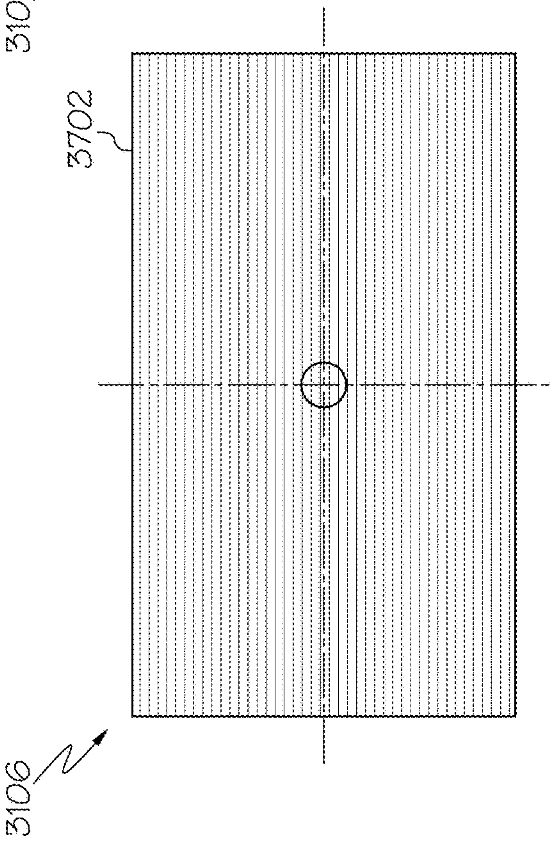
FIGS. 37A-D are functional diagrams of examples of composite plies in which reinforcement fibers are at a zero-degree orientation, a 45-degree orientation, a 90-degree orientation and a −45-degree orientation.
Figure 37B:
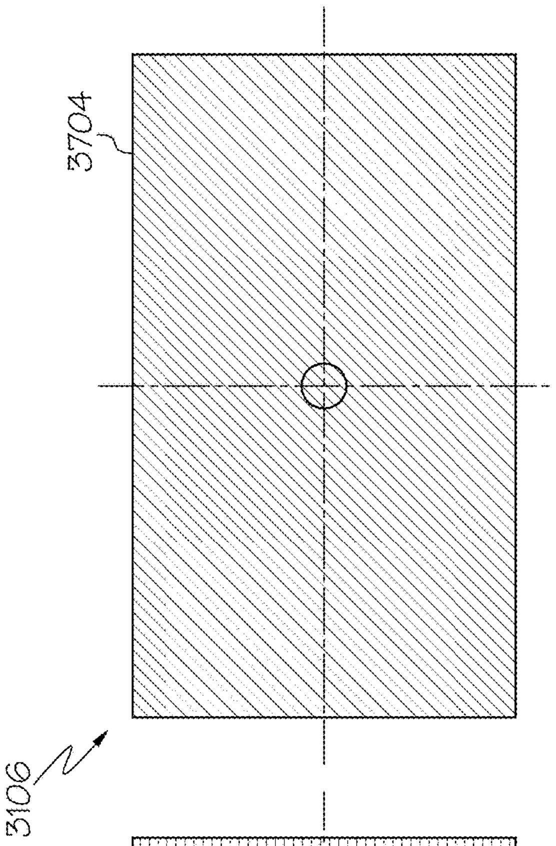
Figure 37C:
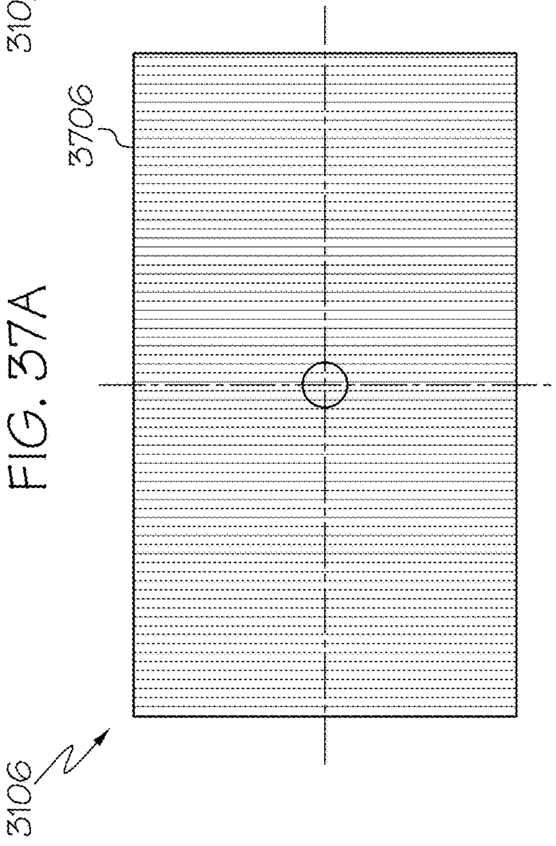
Figure 37D:
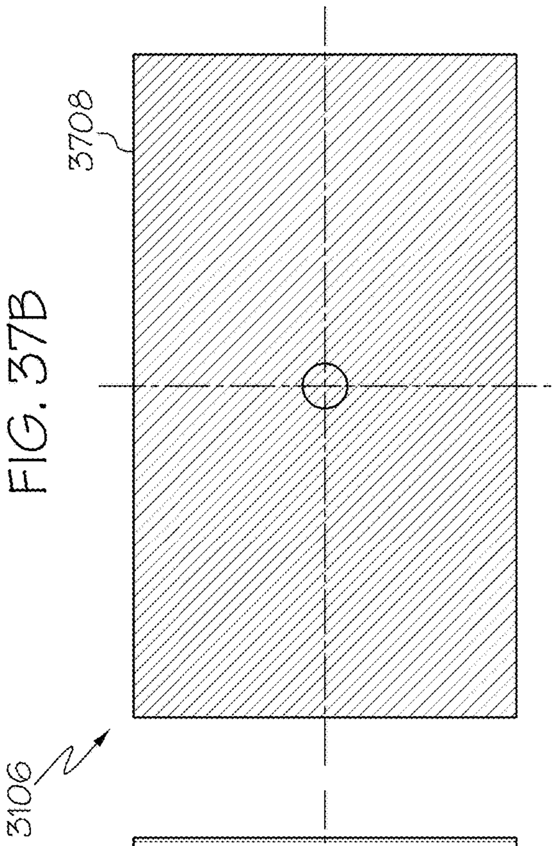

Referring generally to FIGS. 1-8, 31-36 and 37A-D, by way of examples, the present disclosure is directed to a method 100 for developing a path plan 3500 for rollout compaction of a composite ply during composite manufacturing 3402. FIGS. 1-8 disclose various examples of method 100. FIG. 31 discloses an example of a path planning development environment 3100 for composite manufacturing 3402. FIG. 32 discloses an example of at least one central storage device 3200. FIG. 33 discloses an example of a path plan test bed 3300. FIG. 34 discloses an example of a composite manufacturing layup cell 3400. FIG. 35 discloses an example an example of a path plan 3500 for a ceramic matrix composite ply 3106 in which ceramic reinforcement fibers 3508 are at a zero-degree orientation 3702. FIG. 36 discloses an example of an adapted path plan 3600 for a ceramic matrix composite ply 3106 in which ceramic reinforcement fibers 3508 are at a zero-degree orientation 3702. FIGS. 37A-D disclose examples of composite plies in which reinforcement fibers are at a zero-degree orientation 3702, a 45-degree orientation 3704, a 90-degree orientation 3706 and a −45-degree orientation 3708.

With reference again to 1-8, 31-36 and 37A-D, in one or more examples, a method 100 (see FIG. 1) for developing a path plan 3500 for rollout compaction of a composite ply during composite manufacturing 3402 includes selecting 102 a working path plan data file 3104 from a working path plan repository 3202. The working path plan data file 3104 defining the path plan 3500 for a compaction roller 3102 to compact a ceramic matrix composite ply 3106 on a layup tool 3108 or on a prior placed ply during the composite manufacturing 3402. At 104, a path adaptation application program 3110 is run to access compaction history data files 3112 in a compaction history repository 3204 relating to the working path plan data file 3104 and to identify at least one inconsistency 3504 in the compaction history data files 3112 that is not resolved in the working path plan data file 3104. At 106, at least one path adaptation 3602 for the working path plan data file 3104 is generated based on the at least one inconsistency 3504 that is not resolved to form an adapted path plan data file 3114 defining an adapted path plan 3600 that includes the at least one path adaptation 3602.

In another example of the method 100, the selecting 102 of the working path plan data file 3104 is based at least in part on identification of the ceramic matrix composite ply 3106, identification of the layup tool 3108 upon which the ceramic matrix composite ply 3106 is to be compacted and identification of an orientation 3506 of the ceramic matrix composite ply 3106 on the layup tool 3108 or on the prior placed ply. In a further example, the identification of the ceramic matrix composite ply 3106 is based at least in part on selection of a desired composition 3522 of the ceramic matrix composite ply 3106 from a plurality of ceramic matrix composite plies 3106 having a corresponding plurality of available compositions 3522. In another further example, the identification of the layup tool 3108 is based at least in part on selection of a desired geometry 3322 of the layup tool 3108 from a plurality of layup tools 3108 having a corresponding plurality of available geometries 3322. In yet another further example, the identification of the orientation 3506 of the ceramic matrix composite ply 3106 is based at least in part on selection of a desired orientation 3506 of ceramic reinforcement fibers 3508 within the ceramic matrix composite ply 3106 from a plurality of available orientations 3506 of the ceramic reinforcement fibers 3508. In an even further example, the plurality of available orientations 3506 include a zero-degree orientation 3702, a 45-degree orientation 3704, a 60-degree orientation, a 90-degree orientation 3706, a −45-degree orientation 3708, a −60-degree orientation or any other suitable orientation.

In yet another example of the method 100, the ceramic matrix composite ply 3106 includes ceramic reinforcement fibers 3508 and a ceramic matrix 3510. In a further example, the ceramic reinforcement fibers 3508 include carbon reinforcement fibers 3524, silicon carbide reinforcement fibers 3526, alumina reinforcement fibers 3528, alumina silica reinforcement fibers 3530 or any other suitable ceramic reinforcement fibers in any suitable combination. In another further example, the ceramic matrix 3510 includes carbon material 3532, silicon carbide material 3534, alumina material 3536, alumina silica material 3538 or any other suitable ceramic material in any suitable combination. In yet another further example, the ceramic matrix 3510 is deposited on the ceramic reinforcement fibers 3508 to form the ceramic matrix composite ply 3106. In still another further example, the ceramic reinforcement fibers 3508 are embedded in the ceramic matrix 3510 to form the ceramic matrix composite ply 3106.

In still another example of the method 100, the layup tool 3108 includes a working surface 3302 upon which the ceramic matrix composite ply 3106 is placed during the composite manufacturing 3402. In a further example, the working surface 3302 of the layup tool 3108 is three-dimensional 3324. In another further example, the working surface 3302 of the layup tool 3108 includes a curved portion 3326, a double curved portion 3328, a contoured portion 3330, a geometrically-shaped portion 3332, a rising ramp portion 3334, a falling ramp portion 3336, a two-dimensional portion 3338 or any other suitable shaped portion in any suitable combination.

In still yet another example of the method 100, the selecting 102 of the working path plan data file 3104, the running 104 of the path adaptation application program 3110 and the generating 106 of the at least one path adaptation 3602 are performed by at least one computing device 3116 in a path planning development environment 3100. In another example of the method 100, the selecting 102 of the working path plan data file 3104, the running 104 of the path adaptation application program 3110 and the generating 106 of the at least one path adaptation 3602 are performed by a test robot control system 3304 in a path plan test bed 3300.

In yet another example of the method 100, the at least one inconsistency 3504 includes a bubble in the ceramic matrix composite ply 3106, a blister in the ceramic matrix composite ply 3106, a crease in the ceramic matrix composite ply 3106, a wrinkle in the ceramic matrix composite ply 3106, a bridge in the ceramic matrix composite ply 3106, a void in the ceramic matrix composite ply 3106, an untacked edge in the ceramic matrix composite ply 3106, a free edge in the ceramic matrix composite ply 3106, a pleat in the ceramic matrix composite ply 3106 or any other suitable type of inconsistency in any suitable combination.

In another example of the method 100, the running 104 of the path adaptation application program 3110 includes processing 108 the compaction history data files 3112 to identify prior inconsistencies 3504 relating to the working path plan data file 3104, to identify prior path adaptations 3602 that resolved the prior inconsistencies 3504 and to identify at least one prior inconsistency 3504 that is not resolved in the working path plan data file 3104. In a further example of the method 100, the generating 106 of the at least one path adaptation 3602 includes analyzing 202 (see FIG. 2) the working path plan data file 3104 in relation to the at least one prior inconsistency 3504 that is not resolved in the working path plan data file 3104. At 204, that process identifies the at least one path adaptation 3602 to the working path plan data file 3104 that would resolve the at least one prior inconsistency 3504 that is not resolved. At 206, the at least one path adaptation 3602 is incorporated into the working path plan data file 3104 to form the adapted path plan 3600 in the adapted path plan data file 3114.

In an even further example of the method 100, the generating 106 of the at least one path adaptation 3602 also includes at least temporarily storing 208 the adapted path plan data file 3114. At 210, the adapted path plan data file 3114 is sent to the working path plan repository 3202. In an even yet further example, the working path plan repository 3202 is accessible to at least one of a path planning development environment 3100 and a path plan test bed 3300.

In another even further example of the method 100, the identifying 204 of the at least one path adaptation 3602 includes identifying 302 (see FIG. 3) a new sequence 3604 of paths 3502 for compaction of the ceramic matrix composite ply 3106 to resolve the at least one prior inconsistency 3504. In this example, the incorporating 206 the at least one path adaptation 3602 includes reordering 304 a sequence of paths 3502 in the working path plan data file 3104 based at least in part on the new sequence 3604 of paths 3502 to form the adapted path plan data file 3114.

In yet another even further example of the method 100, the identifying 204 of the at least one path adaptation 3602 includes identifying 402 (see FIG. 4) a radial shift 3606 for at least a portion of paths 3502 for compaction of the ceramic matrix composite ply 3106 to resolve the at least one prior inconsistency 3504. In this example, the incorporating 206 the at least one path adaptation 3602 includes radially shifting 404 at least the portion of the paths 3502 in the working path plan data file 3104 based at least in part on the identified radial shift 3606 to form the adapted path plan data file 3114.

In still another even further example of the method 100, the identifying 204 of the at least one path adaptation 3602 includes identifying 502 (see FIG. 5) a linear shift 3608 for at least a portion of paths 3502 for compaction of the ceramic matrix composite ply 3106 to resolve the at least one prior inconsistency 3504. In this example, the incorporating 206 the at least one path adaptation 3602 includes linearly shifting 504 at least the portion of the paths 3502 in the working path plan data file 3104 based at least in part on the identified linear shift 3608 to form the adapted path plan data file 3114.

In still yet another even further example of the method 100, the identifying 204 of the at least one path adaptation 3602 includes identifying 602 (see FIG. 6) at least one replacement path 3610 to replace a corresponding at least one existing path 3502 for compaction of the ceramic matrix composite ply 3106 to resolve the at least one prior inconsistency 3504. In this example, the incorporating 206 the at least one path adaptation 3602 includes removing 604 the at least one existing path 3502 associated with the at least one replacement path 3610 from the working path plan data file 3104. At 606, the at least one replacement path 3610 is incorporated in the working path plan data file 3104 based at least in part on the identified at least one replacement path 3610 to form the adapted path plan data file 3114. In an even yet further example, the at least one replacement path 3610 includes one or more replacement path 3610 that uses a back-and-forth yaw motion 3616 while advancing along the one or more replacement path 3610 to a periphery 3512 of the ceramic matrix composite ply 3106.

In another even further example of the method 100, the identifying 204 of the at least one path adaptation 3602 includes identifying 702 (see FIG. 7) at least one additional path 3612 for compaction of the ceramic matrix composite ply 3106 to resolve the at least one prior inconsistency 3504. In this example, the incorporating 206 the at least one path adaptation 3602 includes incorporating 704 the at least one additional path 3612 in the working path plan data file 3104 based at least in part on the identified at least one additional path 3612 to form the adapted path plan data file 3114. In an even yet further example, the at least one additional path 3612 includes one or more additional path 3612 that uses a back-and-forth yaw motion 3616 while advancing along the one or more additional path 3612 to a periphery 3512 of the ceramic matrix composite ply 3106.

In yet another even further example, the identifying 204 of the at least one path adaptation 3602 includes identifying 802 (see FIG. 8) a reference location shift 3614 for at least a portion of paths 3502 for compaction of the ceramic matrix composite ply 3106 to resolve the at least one prior inconsistency 3504. In this example, the incorporating 206 the at least one path adaptation 3602 includes shifting 804 a reference location for at least the portion of the paths 3502 in the working path plan data file 3104 based at least in part on the identified reference location shift 3614 to form the adapted path plan data file 3114. In an even yet further example, the reference location in the working path plan data file 3104 is a central reference location 3514 and the working path plan data file 3104 defines a star-based path plan 3516. In another even yet further example, the reference location in the working path plan data file 3104 is a longitudinal axis 3518 or a transverse axis 3520, the longitudinal axis 3518 and the transverse axis 3520 intersecting at a central reference location 3514 and the working path plan data file 3104 defines a grid-based path plan 3540.

Figure 1:
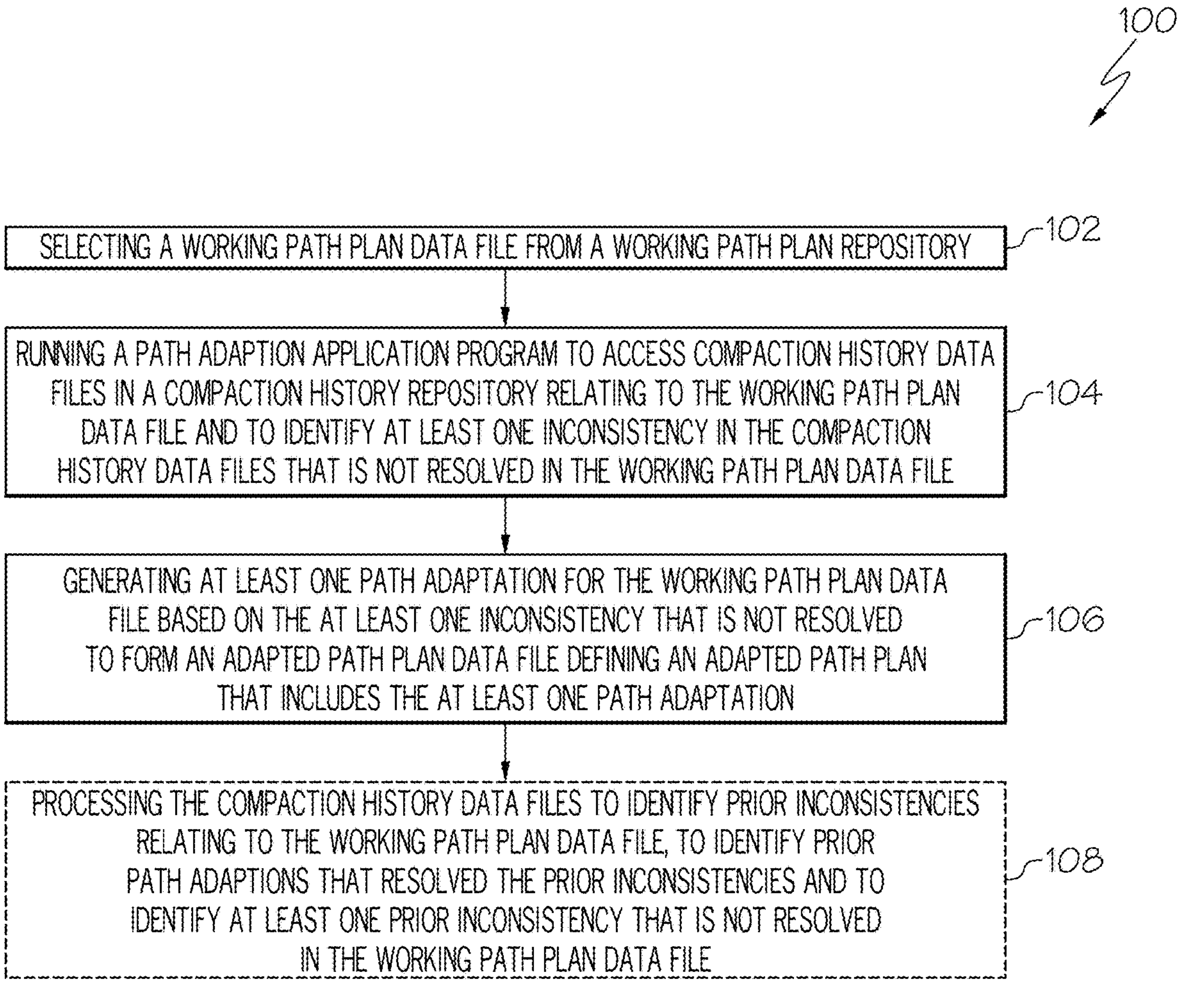
FIG. 1 is a flow diagram of an example of a method for developing a path plan for rollout compaction of a composite ply during composite manufacturing.
Figure 2:
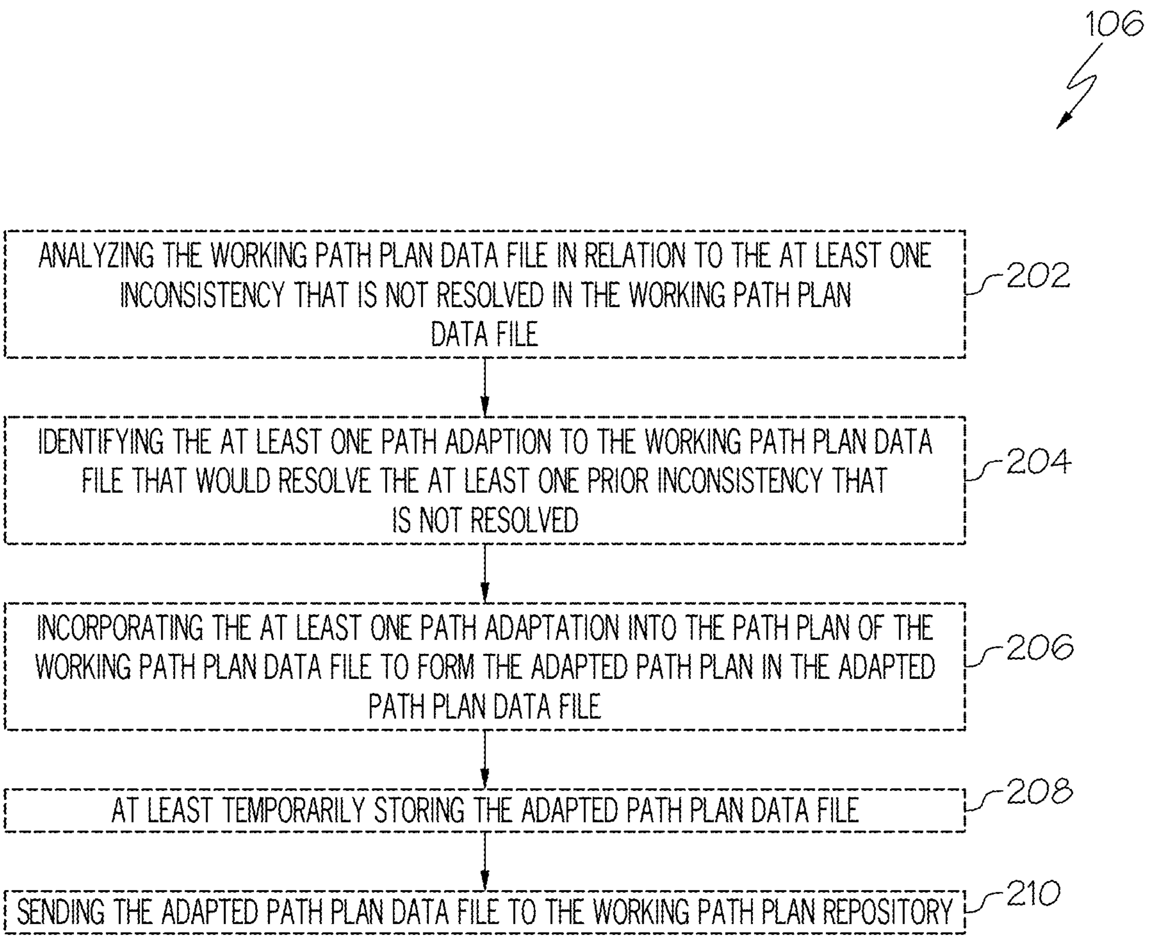
FIG. 2 is a flow diagram of an example of the generating of the at least one path adaptation to the path plan of FIG. 1.
Figure 3:
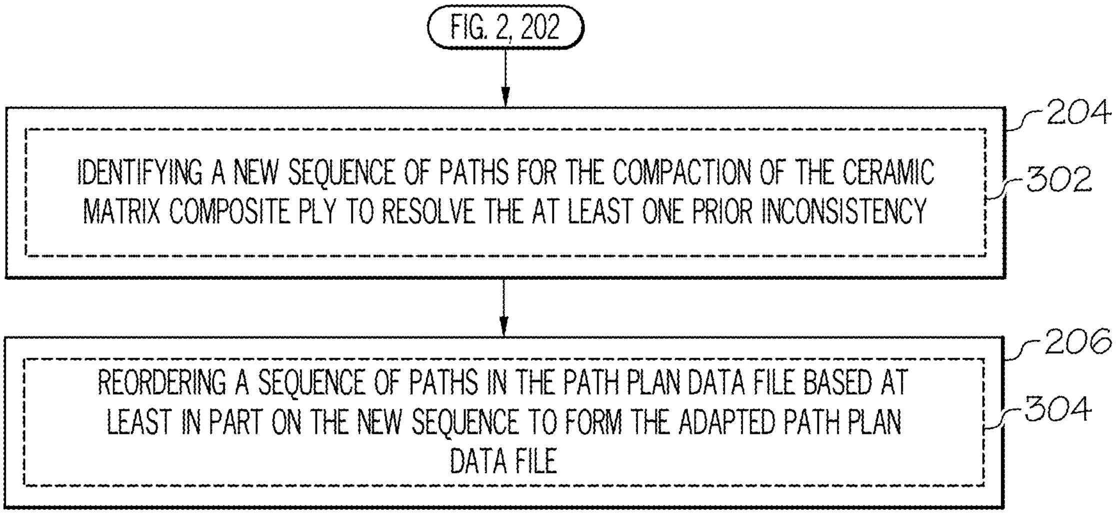
FIG. 3, in combination with FIG. 2, is a flow diagram of an example a path adaptation that reorders a sequence of paths in the path plan of FIG. 1.
Figure 4:
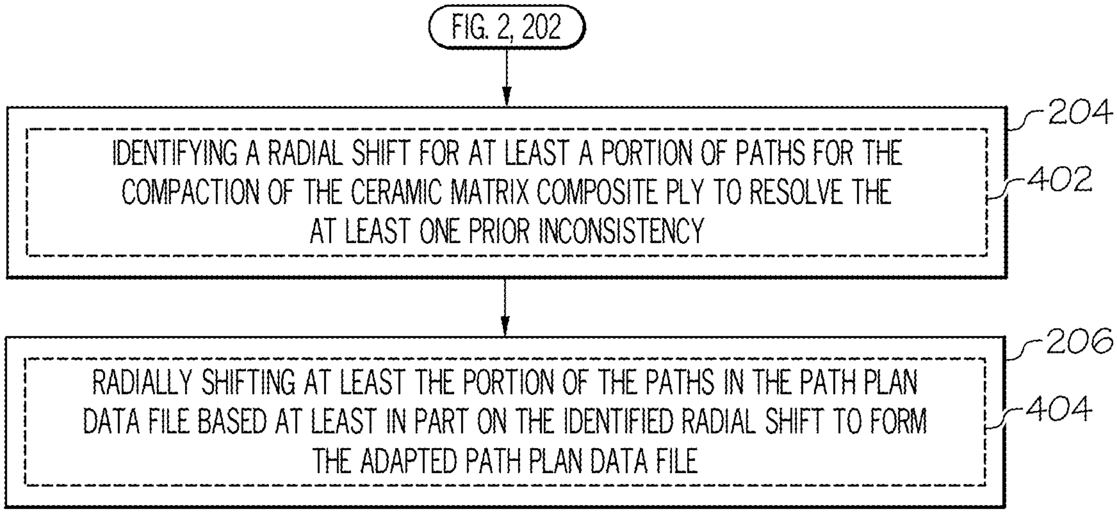
FIG. 4, in combination with FIG. 2, is a flow diagram of an example of a path adaptation that radially shifts a portion of paths in the path plan of FIG. 1.
Figure 5:
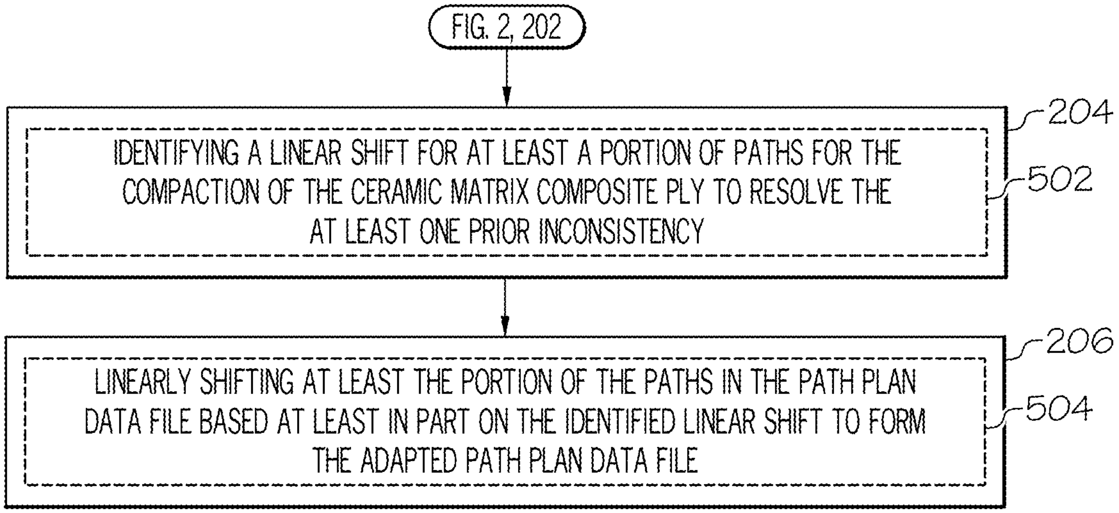
FIG. 5, in combination with FIG. 2, is a flow diagram of an example of a path adaptation that linearly shifts a portion of paths in the path plan of FIG. 1.
Figure 6:
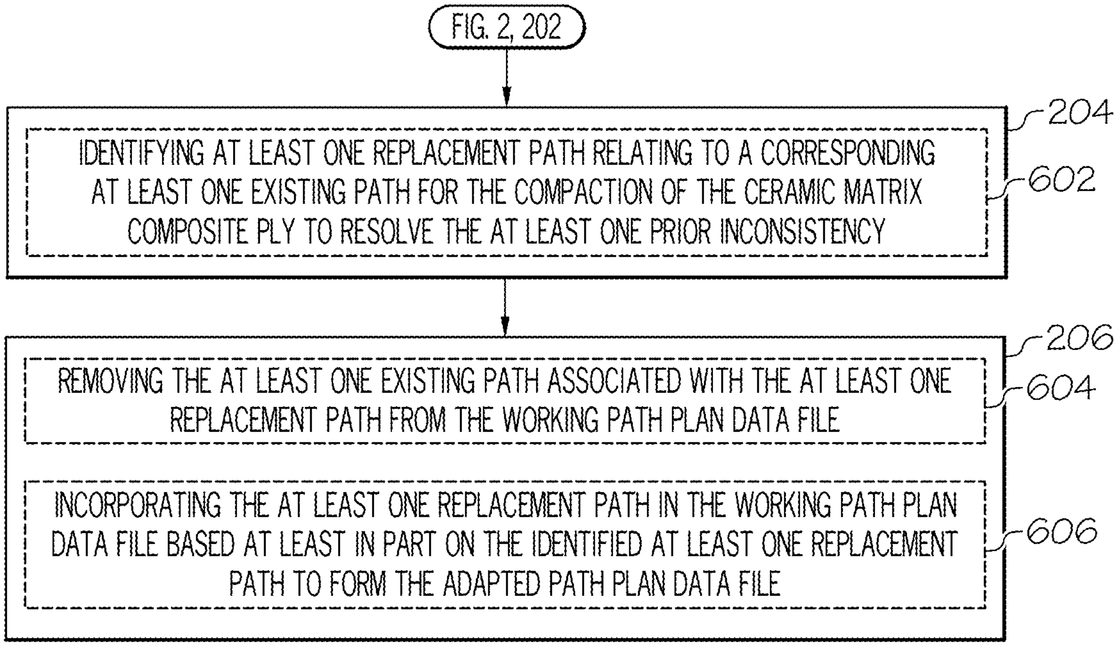
FIG. 6, in combination with FIG. 2, is a flow diagram of an example of a path adaptation that removes an existing path and replaces it with a new path in the path plan of FIG. 1.
Figure 7:
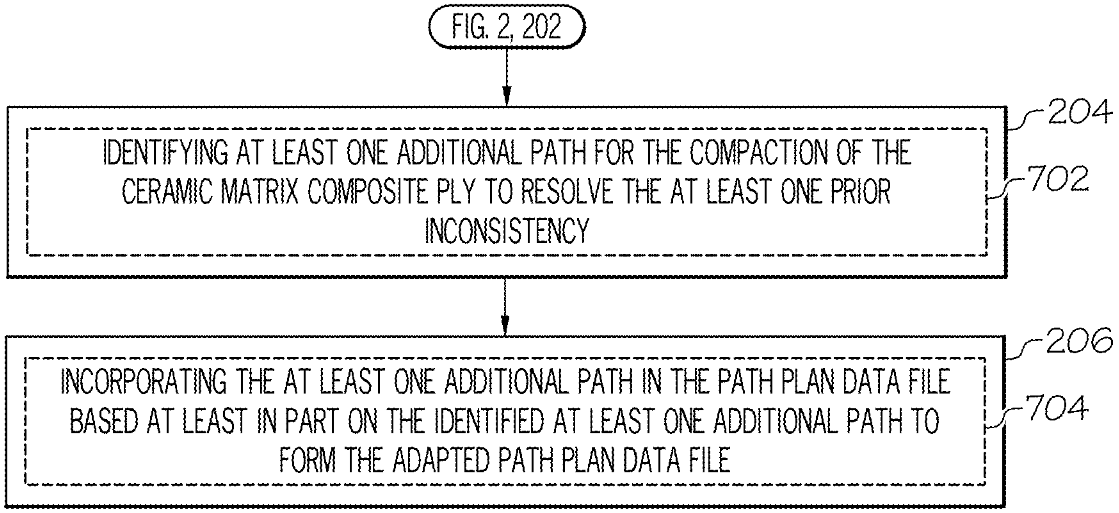
FIG. 7, in combination with FIG. 2, is a flow diagram of an example of a path adaptation that adds a new path to the path plan of FIG. 1.
Figure 8:
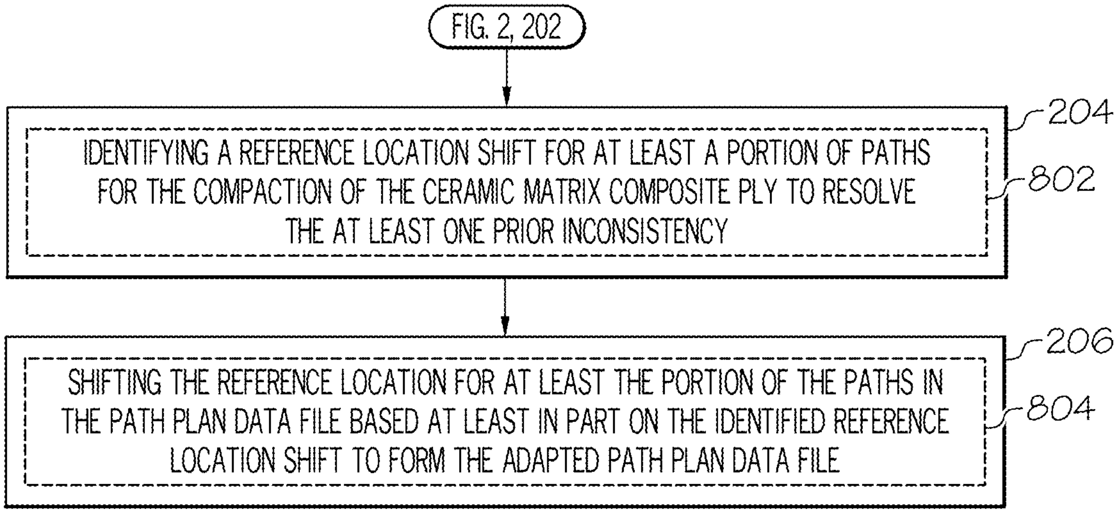
FIG. 8, in combination with FIG. 2, is a flow diagram of an example of a path adaptation that shifts a reference location for a portion of paths in the path plan of FIG. 1.
Figure 9:
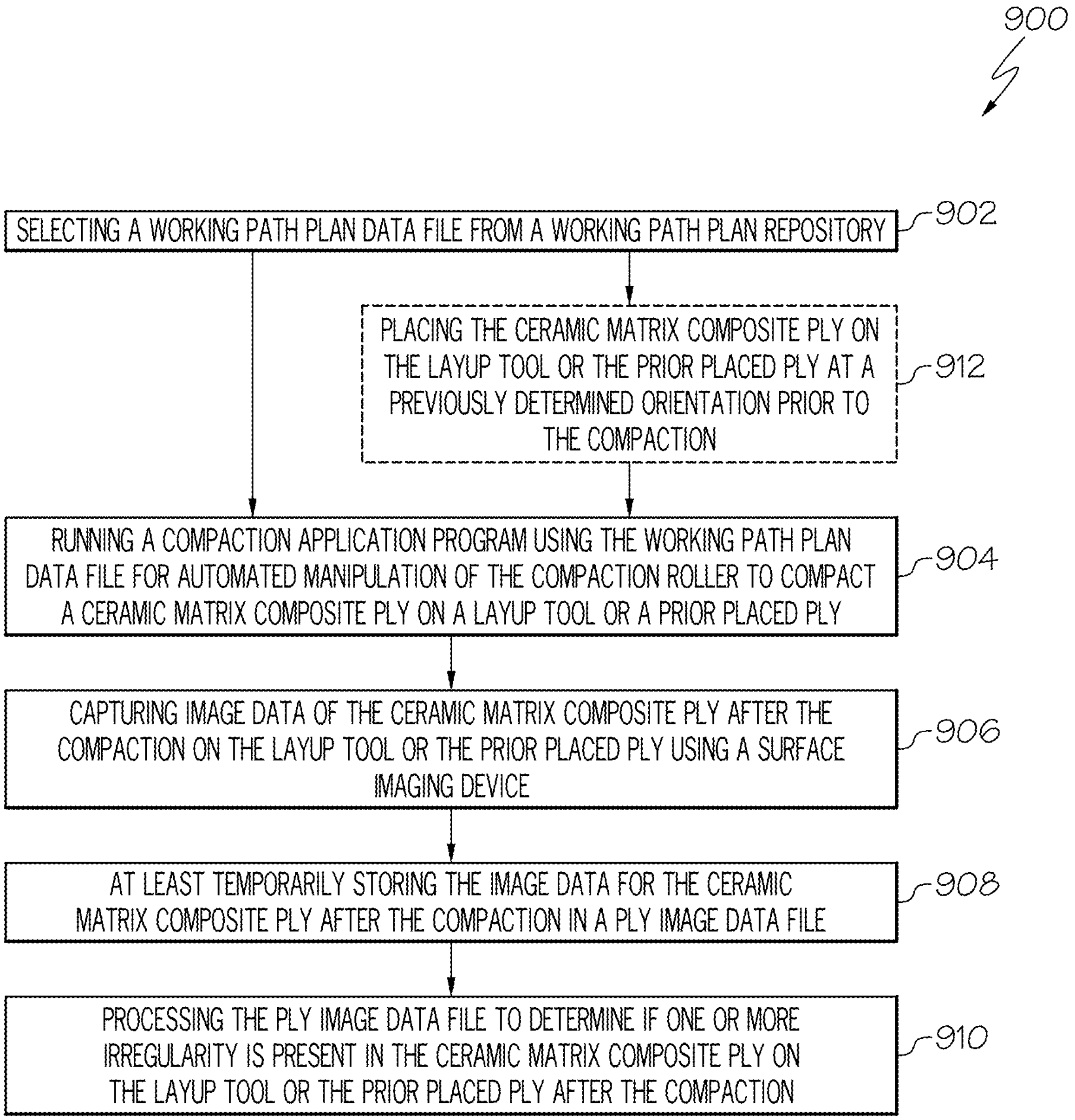
FIG. 9 is a flow diagram of another example of a method for developing a path plan for rollout compaction of a composite ply during composite manufacturing.
Figure 10:
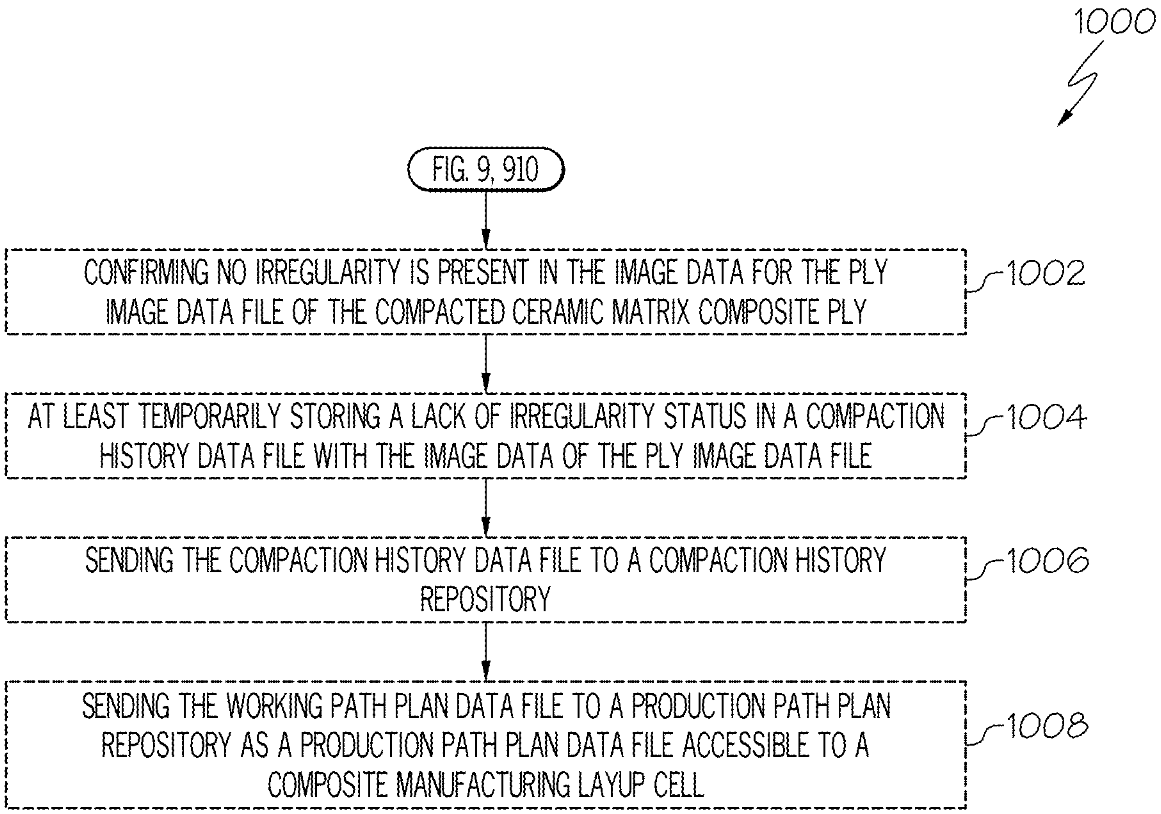
FIG. 10, in combination with FIG. 9, is a flow diagram of yet another example of a method for developing a path plan for rollout compaction of a composite ply during composite manufacturing.
Figure 11:
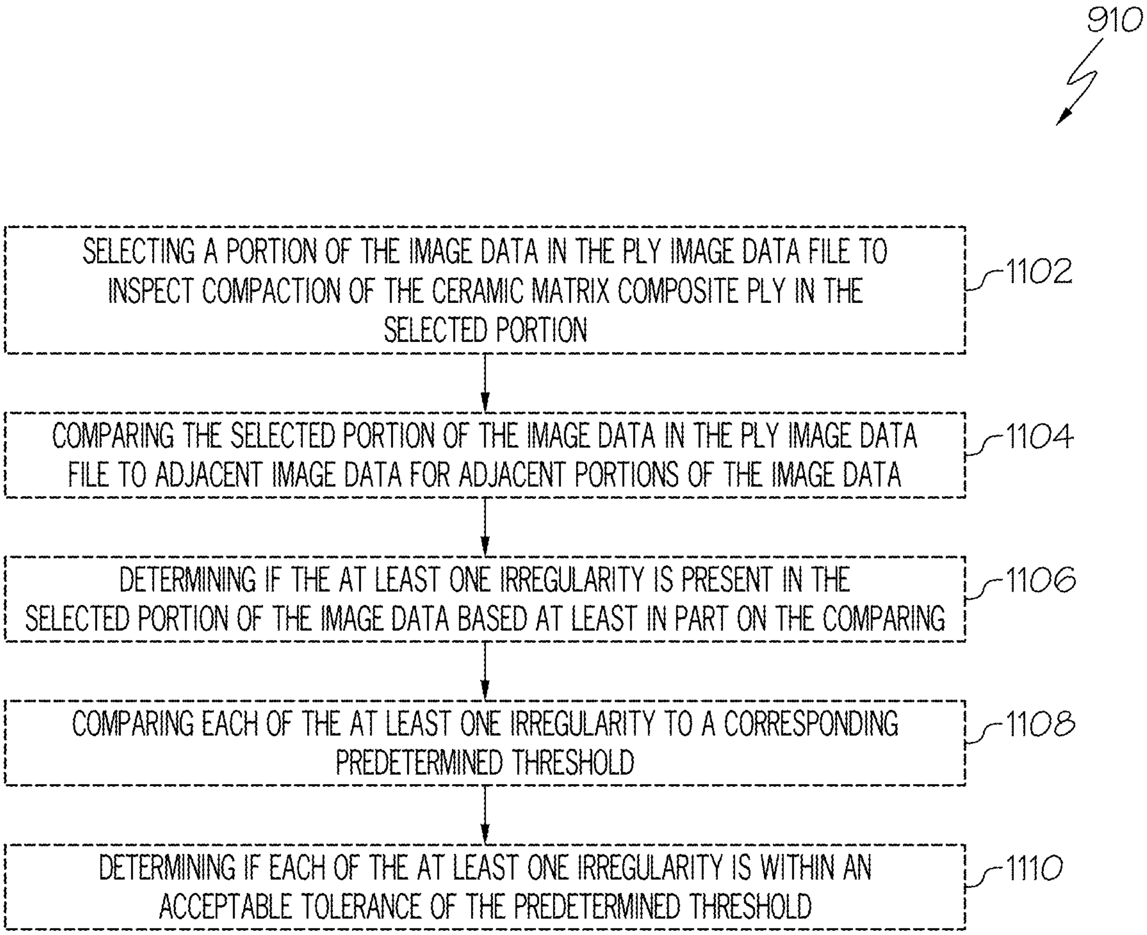
FIG. 11 is a flow diagram of an example of the processing of the ply image data file of FIG. 9.
Figure 12:
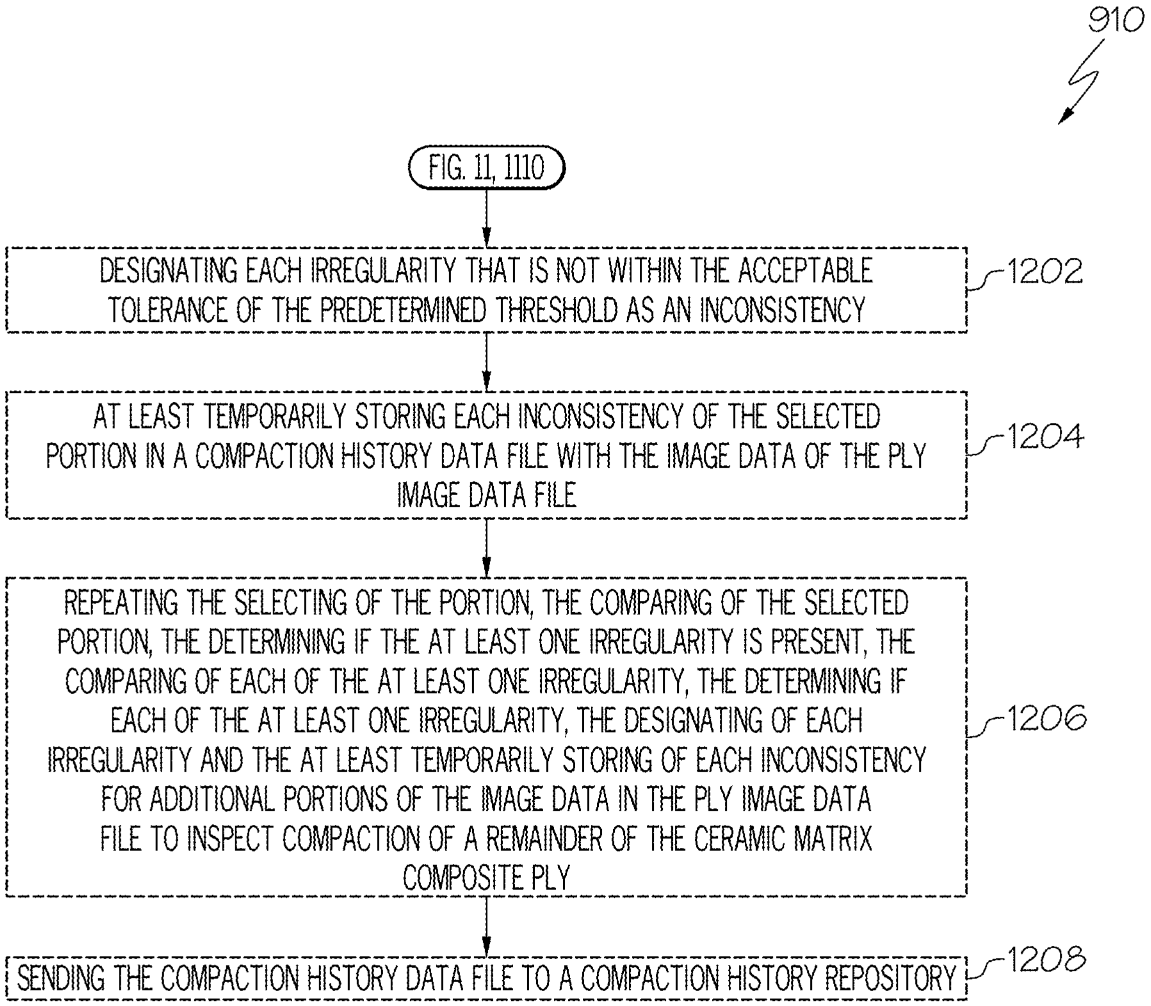
FIG. 12, in combination with FIG. 11, is a flow diagram of another example of the processing of the ply image data file of FIG. 1.
Figure 13:
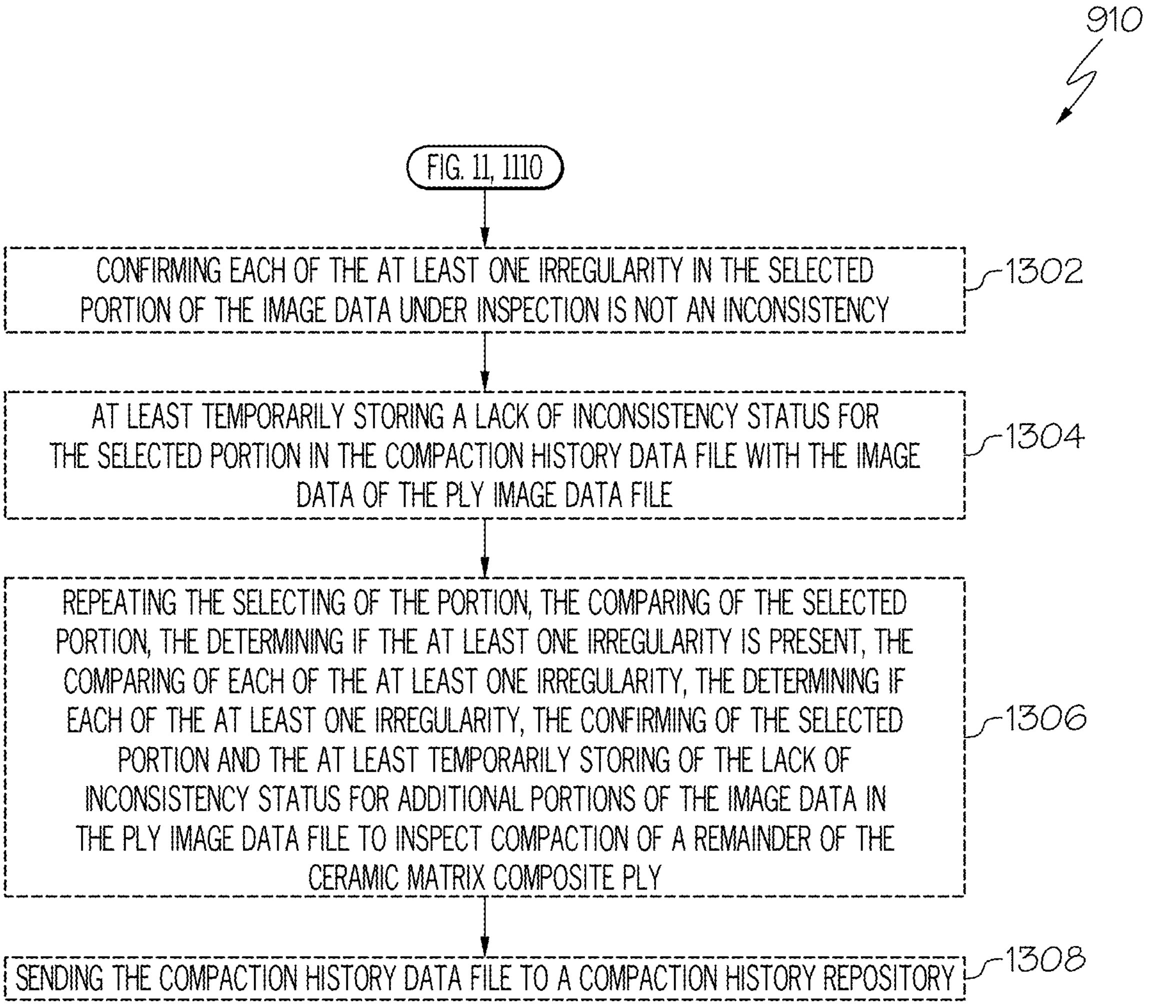
FIG. 13, in combination with FIG. 11, is a flow diagram of yet another example of the processing of the ply image data file of FIG. 1.
Figure 14:
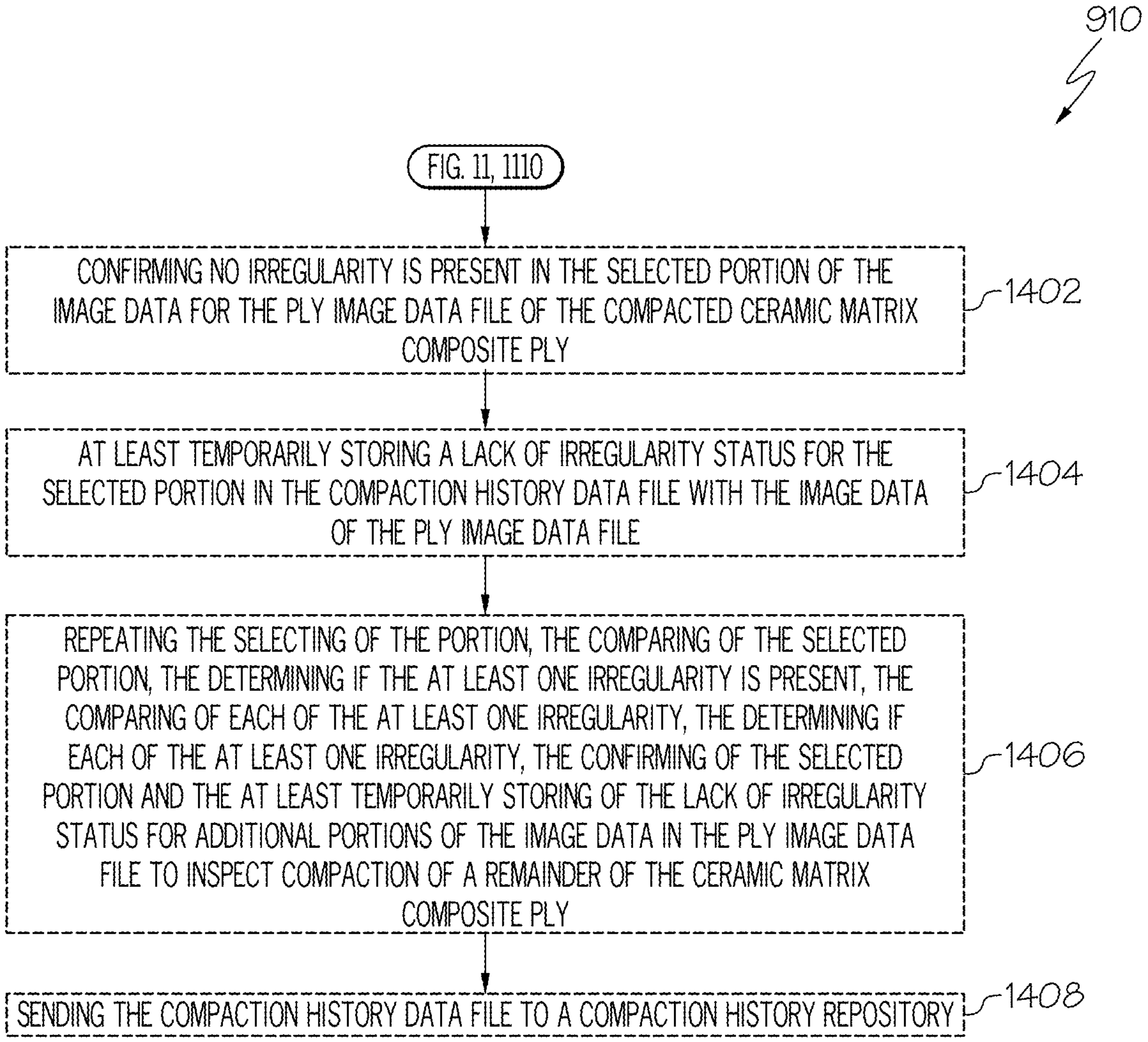
FIG. 14, in combination with FIG. 11, is a flow diagram of still another example of the processing of the ply image data file of FIG. 1.
Figure 15:
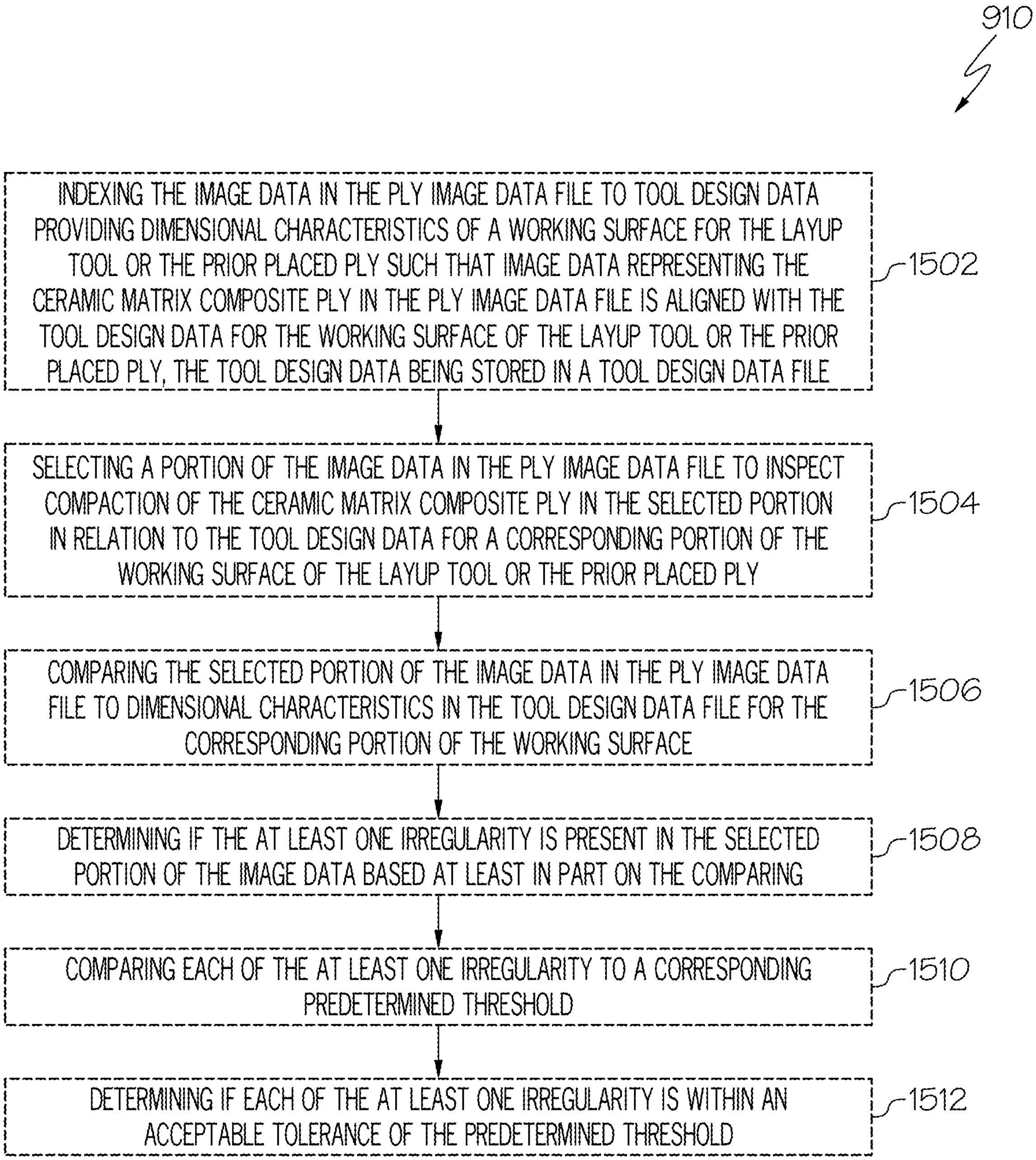
FIG. 15 is a flow diagram of still yet another example of the processing of the ply image data file of FIG. 9.
Figure 16:
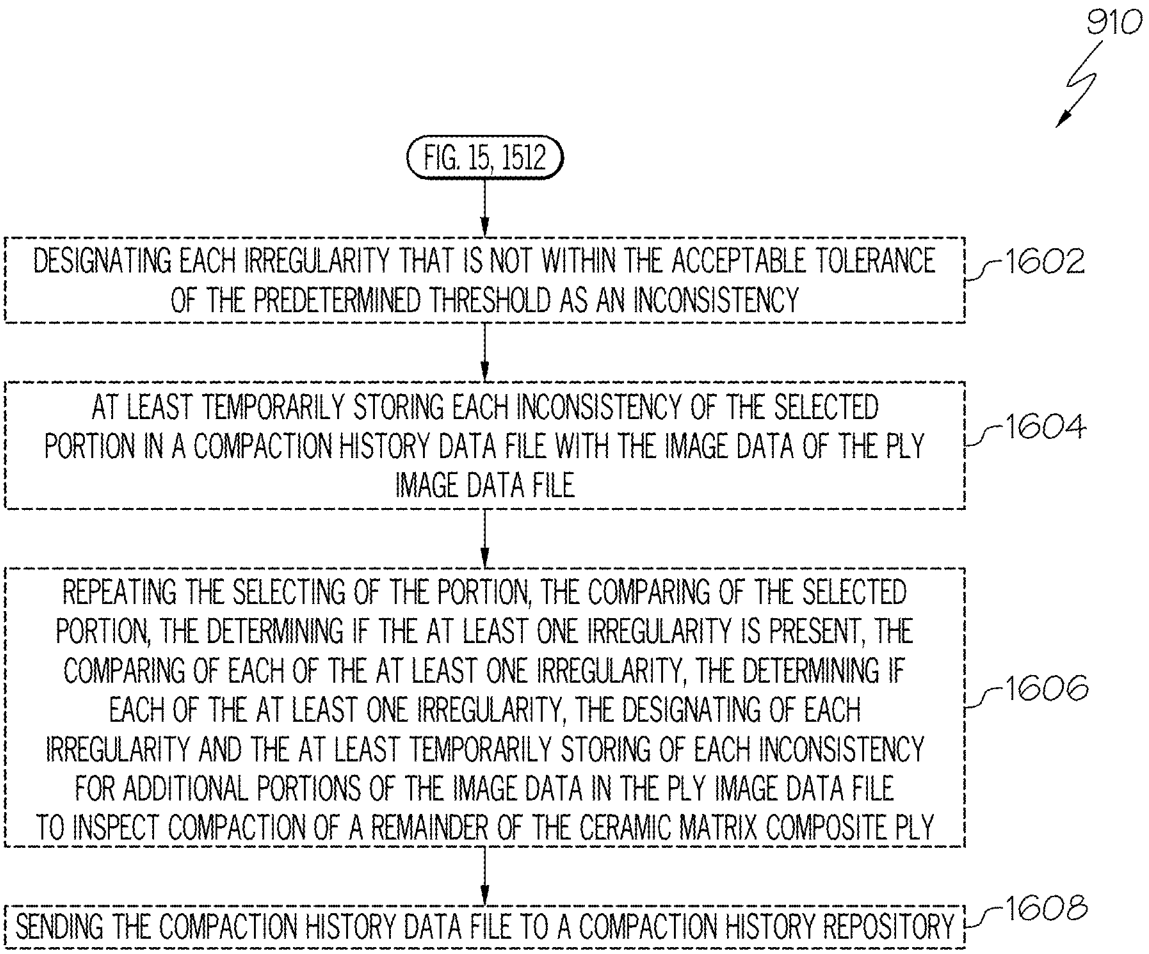
FIG. 16, in combination with FIG. 15, is a flow diagram of another example of the processing of the ply image data file of FIG. 1.
Figure 17:
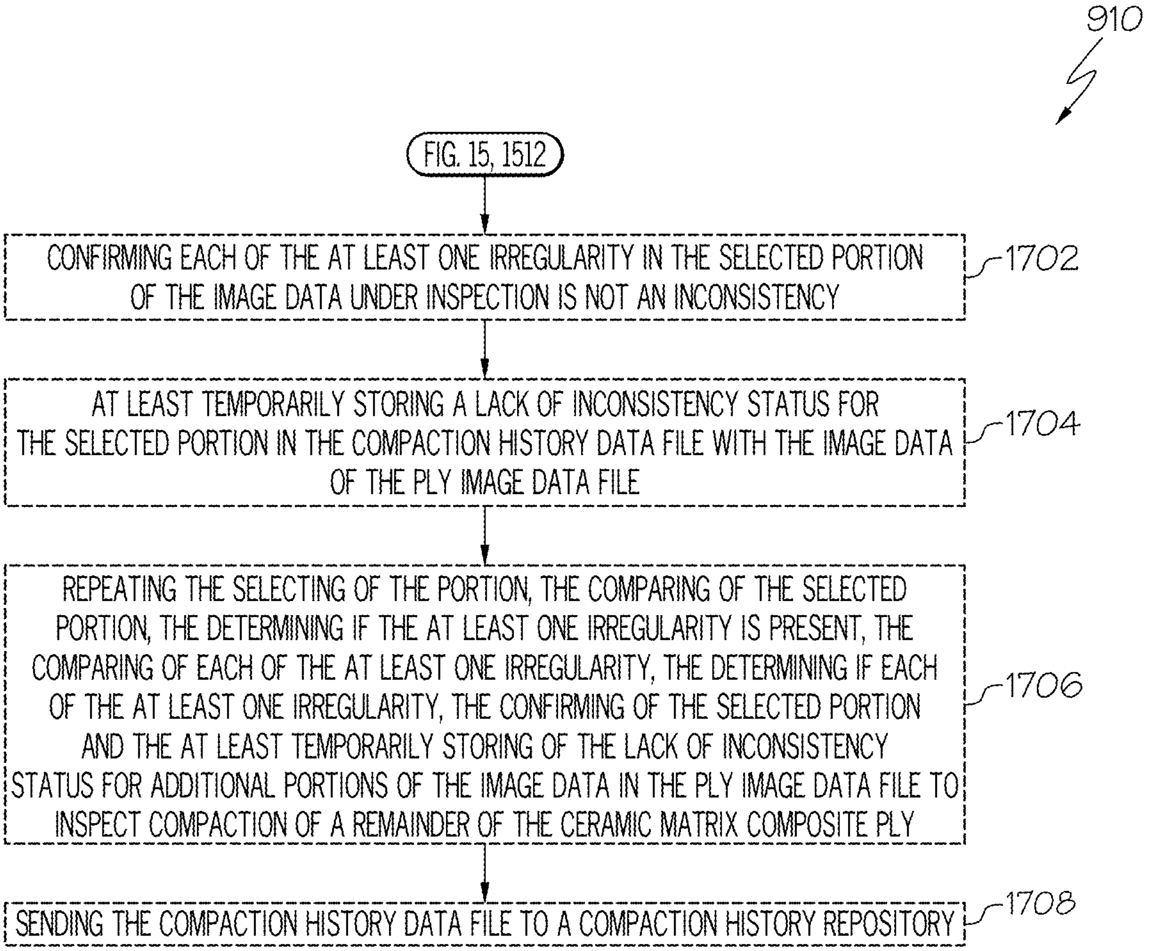
FIG. 17, in combination with FIG. 15, is a flow diagram of yet another example of the processing of the ply image data file of FIG. 1.
Figure 18:
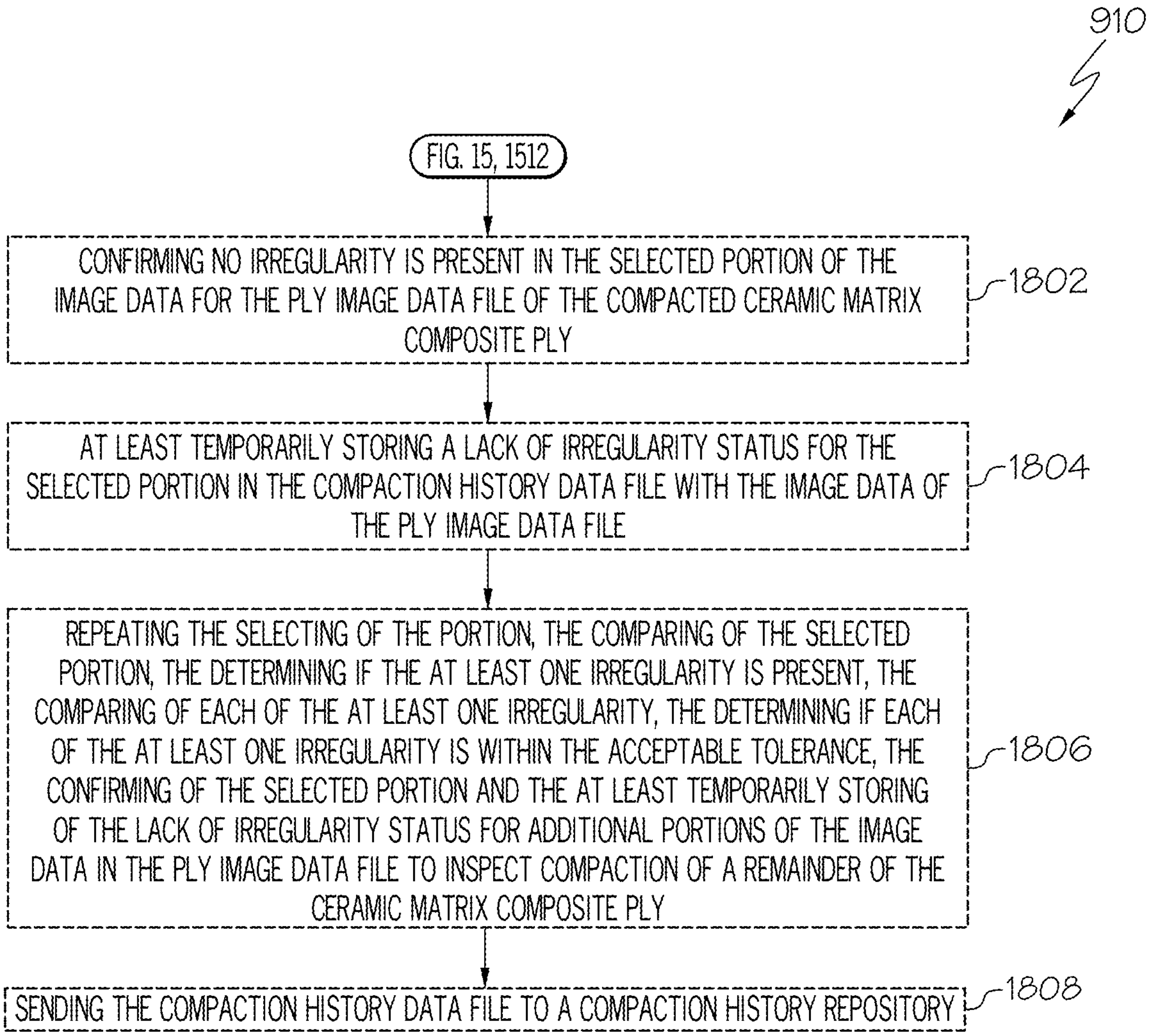
FIG. 18, in combination with FIG. 15, is a flow diagram of still another example of the processing of the ply image data file of FIG. 1.

Referring generally to FIGS. 9-18, 31-35 and 37A-D, by way of examples, the present disclosure is directed to a method 900, 1000 for developing a path plan 3500 for rollout compaction of a composite ply during composite manufacturing 3402. FIGS. 9 and 11-18 disclose various examples of method 900. FIGS. 9 and 10 disclose various examples of method 1000. FIG. 31 discloses an example of a path planning development environment 3100 for composite manufacturing 3402. FIG. 32 discloses an example of at least one central storage device 3200. FIG. 33 discloses an example of a path plan test bed 3300. FIG. 34 discloses an example of a composite manufacturing layup cell 3400. FIG. 35 discloses an example an example of a path plan 3500 for a ceramic matrix composite ply 3106 in which ceramic reinforcement fibers 3508 are at a zero-degree orientation 3702. FIGS. 37A-D disclose examples of composite plies in which reinforcement fibers are at a zero-degree orientation 3702, a 45-degree orientation 3704, a 90-degree orientation 3706 and a −45-degree orientation 3708.

With reference again to FIGS. 9, 31-35 and 37A-D, in one or more examples, a method 900 (see FIG. 9) for developing a path plan 3500 for rollout compaction of a composite ply during composite manufacturing 3402 includes selecting 902 a working path plan data file 3104 from a working path plan repository 3202. At 904, a compaction application program 3306 is run using the working path plan data file 3104 for automated manipulation of a compaction roller 3102 to compact a ceramic matrix composite ply 3106 on a layup tool 3108 or on a prior placed ply. At 906, image data of the ceramic matrix composite ply 3106 is captured after compaction on the layup tool 3108 or on the prior placed ply using a surface imaging device 3308. At 908, the image data for the ceramic matrix composite ply 3106 after the compaction is at least temporarily stored in a ply image data file 3310. At 910, the ply image data file 3310 is processed to determine if one or more irregularity is present in the ceramic matrix composite ply 3106 on the layup tool 3108 or on the prior placed ply after the compaction. In another example of the method 900, the composite manufacturing 3402 includes ceramic matrix composite manufacturing.

In yet another example of the method 900, the selecting 902 of the working path plan data file 3104 is based at least in part on identification of the ceramic matrix composite ply 3106, identification of the layup tool 3108 upon which the ceramic matrix composite ply 3106 is to be compacted and identification of an orientation 3506 for the ceramic matrix composite ply 3106 on the layup tool 3108 or on the prior placed ply. In a further example, the identification of the ceramic matrix composite ply 3106 is based at least in part on selection of a desired composition 3522 of the ceramic matrix composite ply 3106 from a plurality of ceramic matrix composite plies 3106 having a corresponding plurality of available compositions 3522. In another further example, the identification of the layup tool 3108 is based at least in part on selection of a desired geometry 3322 of the layup tool 3108 from a plurality of layup tools 3108 having a corresponding plurality of available geometries 3322. In yet another further example, the identification of the orientation 3506 of the ceramic matrix composite ply 3106 is based at least in part on selection of a desired orientation 3506 of ceramic reinforcement fibers 3508 within the ceramic matrix composite ply 3106 from a plurality of available orientations 3506 for the ceramic reinforcement fibers 3508. In an even further example, the plurality of available orientations 3506 include a zero-degree orientation 3702, a 45-degree orientation 3704, a 60-degree orientation, a 90-degree orientation 3706, a −45-degree orientation 3708, a −60-degree orientation or any other suitable orientation.

In still another example, the method 900 also includes placing 912 the ceramic matrix composite ply 3106 on the layup tool 3108 or on the prior placed ply at a previously determined orientation 3506 prior to the compaction. In a further example, the previously determined orientation 3506 includes a zero-degree orientation 3702, a 45-degree orientation 3704, a 60-degree orientation, a 90-degree orientation 3706, a −45-degree orientation 3708 or a −60-degree orientation.

In still yet another example of the method 900, the automated manipulation includes maneuvering the compaction roller 3102 along the path plan 3500. In another example of the method 900, the compaction roller 3102 includes an approximately three inch roller, a roller having a width ranging between approximately two inches and approximately four inches, a roller having a width ranging between approximately five inches and approximately seven inches, a roller having a width ranging between approximately eight inches and approximately ten inches, a roller having a width ranging between approximately eleven inches and approximately thirteen inches or any other suitable compaction roller. In yet another example of the method 900, the compaction roller 3102 is attached to an end effector 3312 of a robotic arm 3314.

In still another example of the method 900, the ceramic matrix composite ply 3106 includes ceramic reinforcement fibers 3508 and a ceramic matrix 3510. In a further example, the ceramic reinforcement fibers 3508 includes carbon reinforcement fibers 3524, silicon carbide reinforcement fibers 3526, alumina reinforcement fibers 3528, alumina silica reinforcement fibers 3530 or any other suitable ceramic reinforcement fibers in any suitable combination. In another further example, the ceramic matrix 3510 includes carbon material 3532, silicon carbide material 3534, alumina material 3536, alumina silica material 3538 or any other suitable ceramic material in any suitable combination. In yet another further example, the ceramic matrix 3510 is deposited on the ceramic reinforcement fibers 3508 to form the ceramic matrix composite ply 3106. In still another further example, the ceramic reinforcement fibers 3508 are embedded in the ceramic matrix 3510 to form the ceramic matrix composite ply 3106.

In still yet another example of the method 900, the layup tool 3108 includes a working surface 3302 upon which the ceramic matrix composite ply 3106 is placed during the composite manufacturing 3402. In a further example, the working surface 3302 of the layup tool 3108 is three-dimensional 3324. In another further example, the working surface 3302 of the layup tool 3108 includes a curved portion 3326, a double curved portion 3328, a contoured portion 3330, a geometrically-shaped portion 3332, a rising ramp portion 3334, a falling ramp portion 3336, a two-dimensional portion 3338 or any other suitable shaped portion in any suitable combination.

In another example of the method 900, the surface imaging device 3308 includes a three-dimensional camera, a color plus depth camera, a color camera, a depth camera, a depth sensor, a time-of-flight sensor, a red-green-blue plus depth camera, a stereo vision camera, a binocular vision camera, a laser profilometer, a light detection and ranging sensor or any other suitable surface imaging device.

In yet another example of the method 900, the selecting 902 of the working path plan data file 3104, the running 904 of the compaction application program 3306, the capturing 906 of the image data, the at least temporarily storing 908 the image data and the processing 910 of the ply image data file 3310 are performed by a test robot control system 3304 in a path plan test bed 3300.

In still another example of the method 900, the one or more irregularity includes at least one of a bubble in the ceramic matrix composite ply 3106, a blister in the ceramic matrix composite ply 3106, a crease in the ceramic matrix composite ply 3106, a wrinkle in the ceramic matrix composite ply 3106, a bridge in the ceramic matrix composite ply 3106, a void in the ceramic matrix composite ply 3106, an untacked edge in the ceramic matrix composite ply 3106, a free edge in the ceramic matrix composite ply 3106, a pleat in the ceramic matrix composite ply 3106 or any other suitable type of irregularity in any suitable combination.

With reference again to FIGS. 9, 10 and 31-35, in one or more examples, a method 1000 (see FIG. 10) for developing a path plan 3500 for rollout compaction of a composite ply during composite manufacturing 3402 includes the method 900 of FIG. 9. Where no irregularity is present after 910 of FIG. 9, the method 1000 continues from 910 to 1002 where the process confirms no irregularity is present in the image data for the ply image data file 3310 of the ceramic matrix composite ply 3106. At 1004, a lack of irregularity status is at least temporarily stored in a compaction history data file 3112 with the image data of the ply image data file 3310. At 1006, the compaction history data file 3112 is sent to a compaction history repository 3204. At 1008, the working path plan data file 3104 is sent to a production path plan repository 3206 as a production path plan data file 3316 accessible to a composite manufacturing layup cell 3400.

With reference again to FIGS. 9, 11-18 and 31-35, various additional examples of the method 900 (see FIG. 9) for developing a path plan 3500 for rollout compaction of a composite ply during composite manufacturing 3402 are disclosed. For example, where at least one irregularity is present, the processing 910 of the ply image data file 3310 includes selecting 1102 (see FIG. 11) a portion of the image data in the ply image data file 3310 to inspect compaction of the ceramic matrix composite ply 3106 in the selected portion. At 1104, the selected portion of the image data in the ply image data file 3310 is compared to adjacent image data for adjacent portions of the image data. At 1106, the process determines if the at least one irregularity is present in the selected portion of the image data based at least in part on the comparing.

In another example of the method 900, where the at least one irregularity is present, the processing 910 of the ply image data file 3310 also includes comparing 1108 each of the at least one irregularity to a corresponding predetermined threshold. At 1110, the process determines if each of the at least one irregularity is within an acceptable tolerance of the predetermined threshold.

In a further example, where one or more of the at least one irregularity is not within the acceptable tolerance of the predetermined threshold, the processing 910 of the ply image data file 3310 also includes designating 1202 (see FIG. 12) each irregularity that is not within the acceptable tolerance of the predetermined threshold as an inconsistency 3504. At 1204, each inconsistency 3504 of the selected portion is at least temporarily stored in a compaction history data file 3112 with the image data of the ply image data file 3310. In an even further example of the method 900, the processing 910 of the ply image data file 3310 also includes repeating 1206 the selecting 1102 of the portion, the comparing 1104 of the selected portion, the determining 1106 if the at least one irregularity is present, the comparing 1108 of each of the at least one irregularity, the determining 1110 if each of the at least one irregularity, the designating 1202 of each irregularity and the at least temporarily storing 1204 of each inconsistency 3504 the selected portion of the image data in the ply image data file 3310 to inspect compaction of a remainder of the ceramic matrix composite ply 3106. At 1208, the compaction history data file 3112 is sent to a compaction history repository 3204. In an even yet further example, the compaction history repository 3204 is accessible to at least one of a path planning development environment 3100 and a path plan test bed 3300.

In another further example, where each of the at least one irregularity is within the acceptable tolerance of the predetermined threshold, the processing 910 of the ply image data file 3310 also includes confirming 1302 (see FIG. 13) each of the at least one irregularity in the selected portion of the image data under inspection is not an inconsistency 3504. At 1304, a lack of inconsistency status for the selected portion is at least temporarily stored in a compaction history data file 3112 with the image data of the ply image data file 3310. In an even further example, the processing 910 of the ply image data file 3310 also includes repeating 1306 the selecting 1102 of the portion, the comparing 1104 of the selected portion, the determining 1106 if the at least one irregularity is present, the comparing 1108 of each of the at least one irregularity, the determining 1110 if each of the at least one irregularity, the confirming 1302 of the selected portion and the at least temporarily storing 1304 of the lack of inconsistency status for additional portions of the image data in the ply image data file 3310 to inspect compaction of a remainder of the ceramic matrix composite ply 3106. At 1308, the compaction history data file 3112 is sent to a compaction history repository 3204. In an even yet further example, the compaction history repository 3204 is accessible to at least one of a path planning development environment 3100 and a path plan test bed 3300.

In yet another further example, where no irregularity is present in the selected portion of the image data, the processing 910 of the ply image data file 3310 also includes confirming 1402 (see FIG. 14) no irregularity is present in the selected portion of the image data for the ply image data file 3310 of the ceramic matrix composite ply 3106. At 1404, a lack of irregularity status for the selected portion is at least temporarily stored in a compaction history data file 3112 with the image data of the ply image data file 3310. In an even further example, the processing 910 of the ply image data file 3310 also includes repeating 1406 the selecting 1102 of the portion, the comparing 1104 of the selected portion, the determining 1106 if the at least one irregularity is present, the comparing 1108 of each of the at least one irregularity, the determining 1110 if each of the at least one irregularity, the confirming 1402 of the selected portion and the at least temporarily storing 1404 of the lack of irregularity status for additional portions of the image data in the ply image data file 3310 to inspect compaction of a remainder of the ceramic matrix composite ply 3106. At 1408, the compaction history data file 3112 is sent to a compaction history repository 3204. In an even yet further example, the compaction history repository 3204 is accessible to at least one of a path planning development environment 3100 and a path plan test bed 3300.

With reference again to FIGS. 9, 11-18 and 31-35, various additional examples of the method 900 (see FIG. 9) for developing a path plan 3500 for rollout compaction of a composite ply during composite manufacturing 3402 are disclosed. For example, where at least one irregularity is present, the processing 910 of the ply image data file 3310 includes indexing 1502 (see FIG. 15) the image data in the ply image data file 3310 to tool design data providing dimensional characteristics of a working surface 3302 for the layup tool 3108 such that image data representing the ceramic matrix composite ply 3106 in the ply image data file 3310 is aligned with the tool design data for the working surface 3302 of the layup tool 3108. The tool design data being stored in a tool design data file 3318. At 1504, a portion of the image data in the ply image data file 3310 is selected to inspect compaction of the ceramic matrix composite ply 3106 in the selected portion in relation to the tool design data for a corresponding portion of the working surface 3302 of the layup tool 3108. At 1506, the selected portion of the image data in the ply image data file 3310 is compared to dimensional characteristics in the tool design data file 3318 for the corresponding portion of the working surface 3302. At 1508, the process determines if the at least one irregularity is present in the selected portion of the image data based at least in part on the comparing.

In another example of the method 900, where the at least one irregularity is present, the processing 910 of the ply image data file 3310 also includes comparing 1510 each of the at least one irregularity to a corresponding predetermined threshold. At 1512, the process determines if each of the at least one irregularity is within an acceptable tolerance of the predetermined threshold.

In a further example, where one or more of the at least one irregularity is not within the acceptable tolerance of the predetermined threshold, the processing 910 of the ply image data file 3310 also includes designating 1602 (see FIG. 16) each irregularity that is not within the acceptable tolerance of the predetermined threshold as an inconsistency 3504. At 1604, each inconsistency 3504 of the selected portion is at least temporarily stored in a compaction history data file 3112 with the image data of the ply image data file 3310. In an even further example, the processing 910 of the ply image data file 3310 also includes repeating 1606 the selecting 1504 of the portion, the comparing 1506 of the selected portion, the determining 1508 if the at least one irregularity is present, the comparing 1510 of each of the at least one irregularity, the determining 1512 if each of the at least one irregularity, the designating 1602 of each irregularity and the at least temporarily storing 1604 of each inconsistency 3504 of the selected portion of the image data in the ply image data file 3310 to inspect compaction of a remainder of the ceramic matrix composite ply 3106. At 1608, the compaction history data file 3112 is sent to a compaction history repository 3204. In an even yet further example, the compaction history repository 3204 is accessible to at least one of a path planning development environment 3100 and a path plan test bed 3300.

In another further example, where each of the at least one irregularity is within the acceptable tolerance of the predetermined threshold, the processing 910 of the ply image data file 3310 also includes confirming 1702 (see FIG. 17) each of the at least one irregularity in the selected portion of the image data under inspection is not an inconsistency 3504. At 1704, a lack of inconsistency status for the selected portion is at least temporarily stored in a compaction history data file 3112 with the image data of the ply image data file 3310. In an even further example, the processing 910 of the ply image data file 3310 also includes repeating 1706 the selecting 1504 of the portion, the comparing 1506 of the selected portion, the determining 1508 if the at least one irregularity is present, the comparing 1510 of each of the at least one irregularity, the determining 1512 if each of the at least one irregularity, the confirming 1702 of the selected portion and the at least temporarily storing 1704 of the lack of inconsistency status for additional portions of the image data in the ply image data file 3310 to inspect compaction of a remainder of the ceramic matrix composite ply 3106. At 1708, the compaction history data file 3112 is sent to a compaction history repository 3204. In an even yet further example, the compaction history repository 3204 is accessible to at least one of a path planning development environment 3100 and a path plan test bed 3300.

In yet another further example, where no irregularity is present in the selected portion of the image data, the processing 910 of the ply image data file 3310 also includes confirming 1802 (see FIG. 18) no irregularity is present in the selected portion of the image data for the ply image data file 3310 of the ceramic matrix composite ply 3106. At 1804, a lack of irregularity status for the selected portion is at least temporarily stored in a compaction history data file 3112 with the image data of the ply image data file 3310. In an even further example, the processing 910 of the ply image data file 3310 also includes repeating 1806 the selecting 1504 of the portion, the comparing 1506 of the selected portion, the determining 1508 if the at least one irregularity is present, the comparing 1510 of each of the at least one irregularity, the determining 1512 if each of the at least one irregularity is within the acceptable tolerance, the confirming 1802 of the selected portion and the at least temporarily storing 1804 of the lack of irregularity status for additional portions of the image data in the ply image data file 3310 to inspect compaction of a remainder of the ceramic matrix composite ply 3106. At 1808, the compaction history data file 3112 is sent to a compaction history repository 3204. In an even yet further example, the compaction history repository 3204 is accessible to at least one of a path planning development environment 3100 and a path plan test bed 3300.

Figure 19:
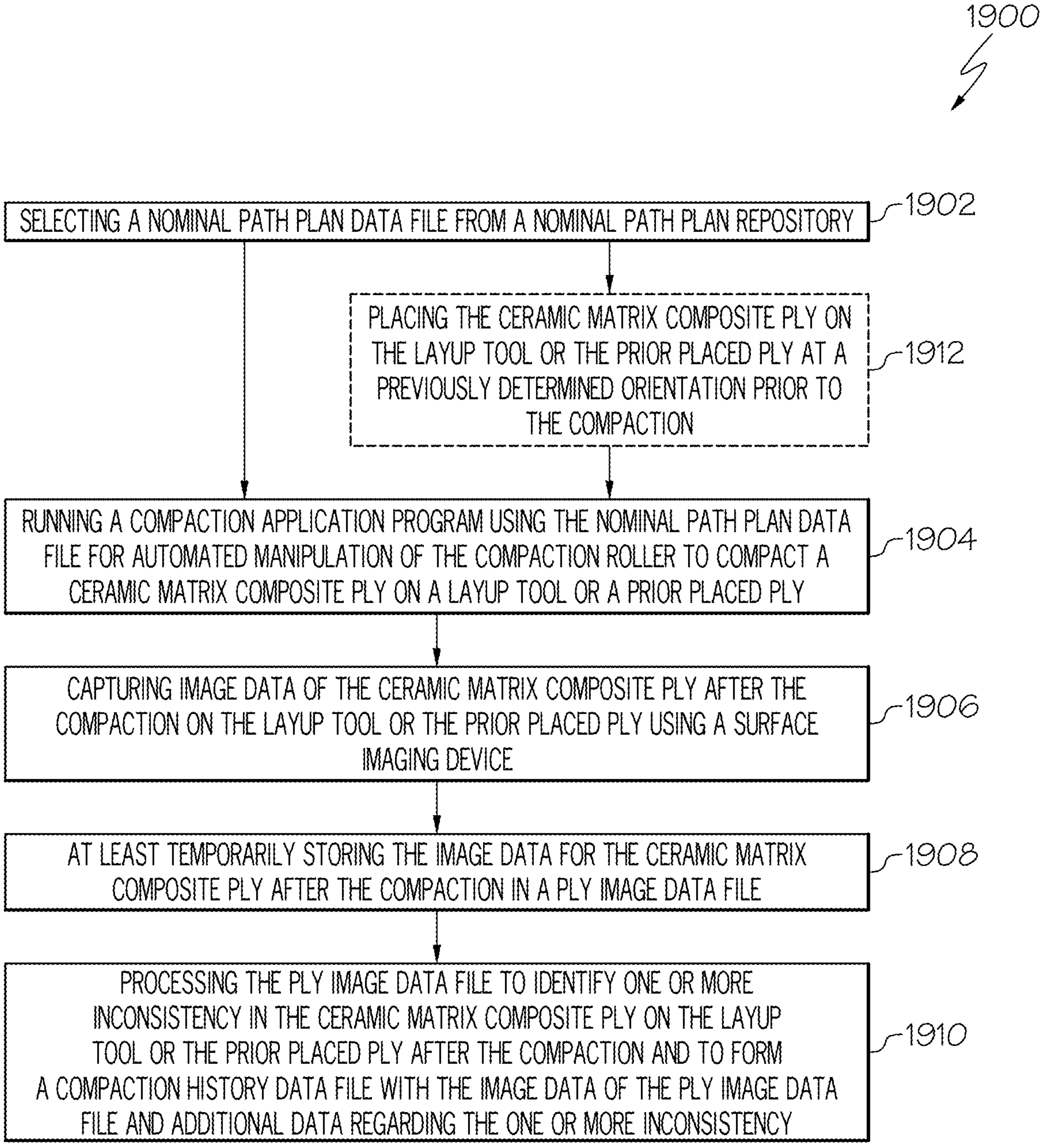
FIG. 19 is a flow diagram of still another example of a method for developing a path plan for rollout compaction of a composite ply during composite manufacturing.
Figure 20:
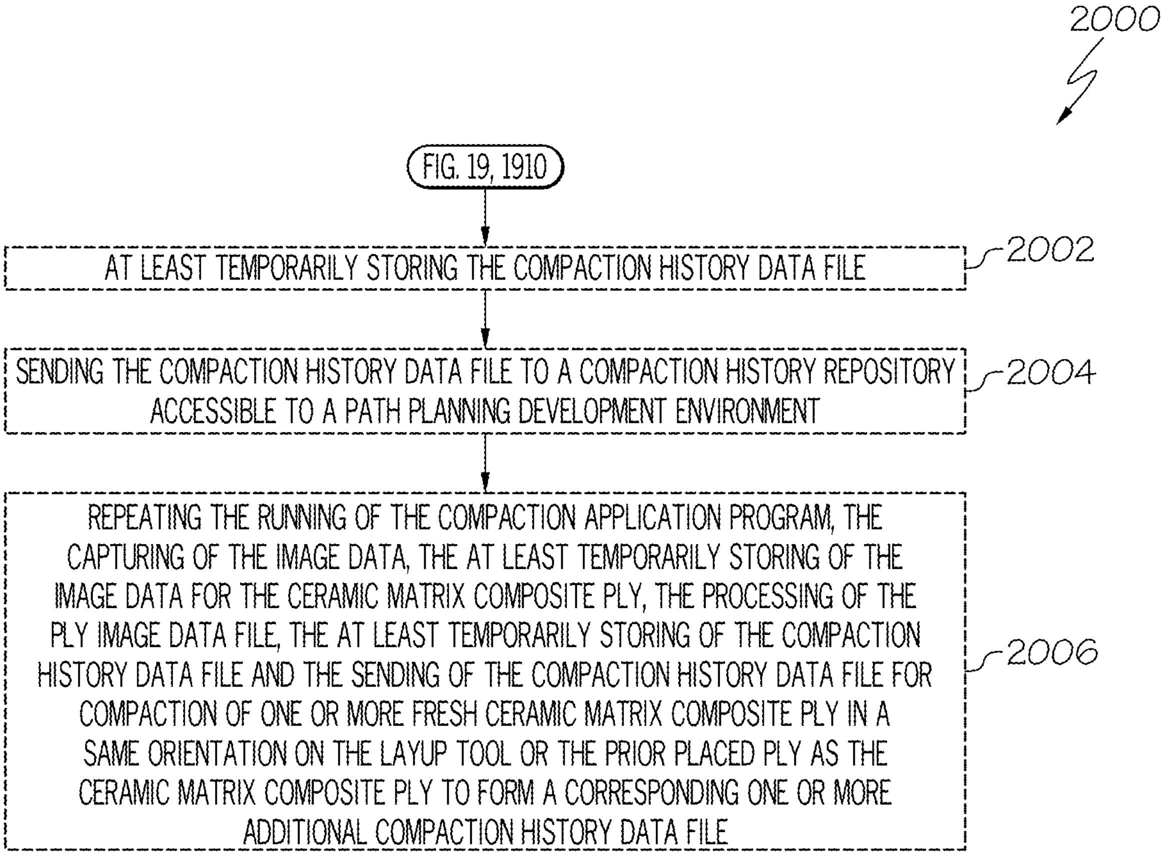
FIG. 20, in combination with FIG. 19, is a flow diagram of still yet another example of a method for developing a path plan for rollout compaction of a composite ply during composite manufacturing.
Figure 21:
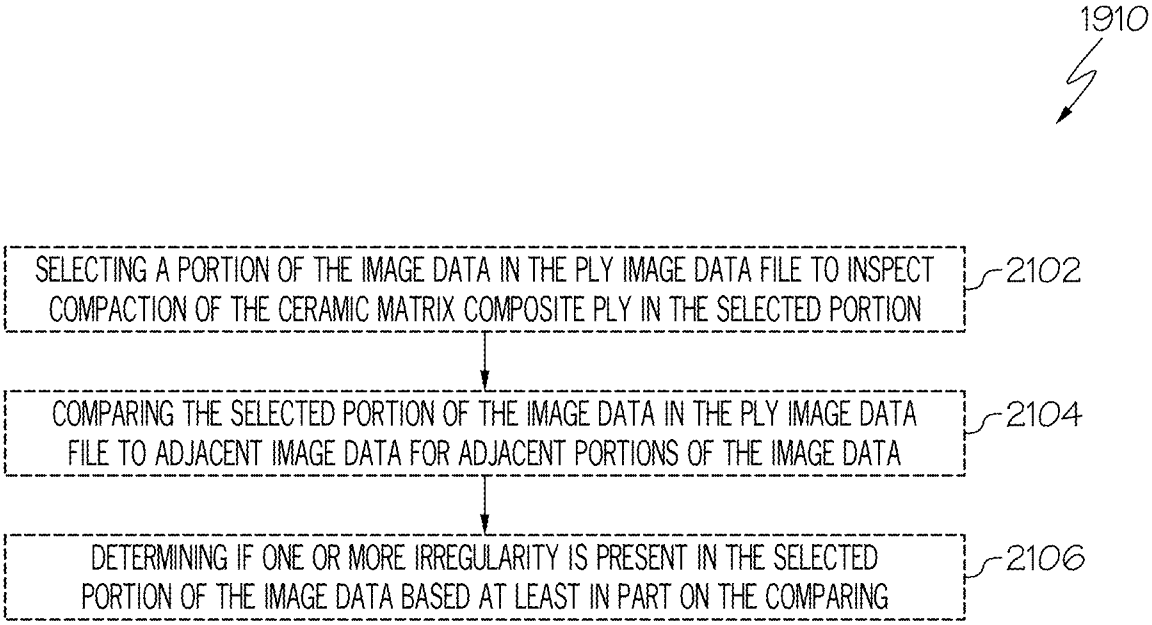
FIG. 21 is a flow diagram of an example of the processing of the ply image data file of FIG. 19.
Figure 22:
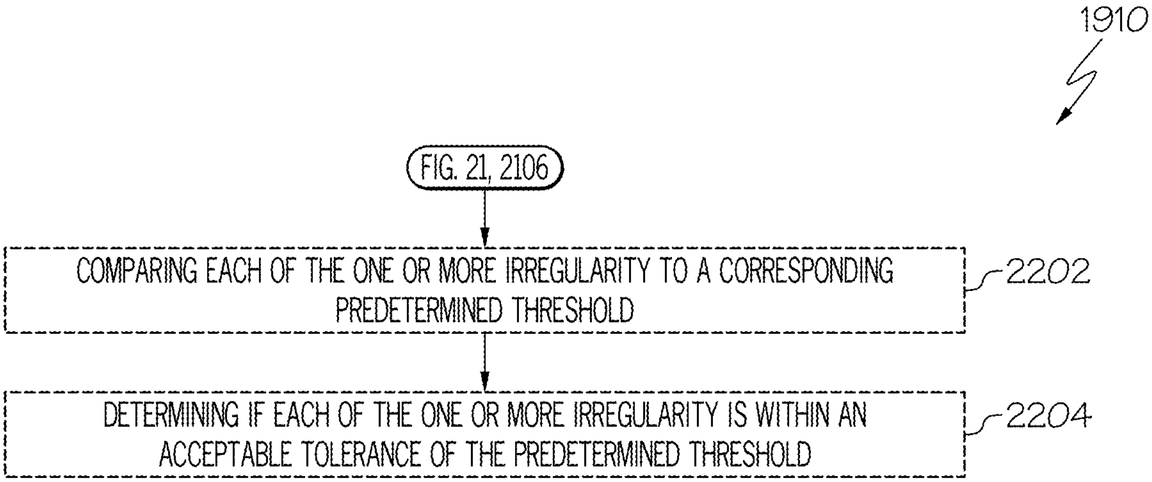
FIG. 22, in combination with FIG. 21, is a flow diagram of another example of the processing of the ply image data file of FIG. 19.
Figure 23:
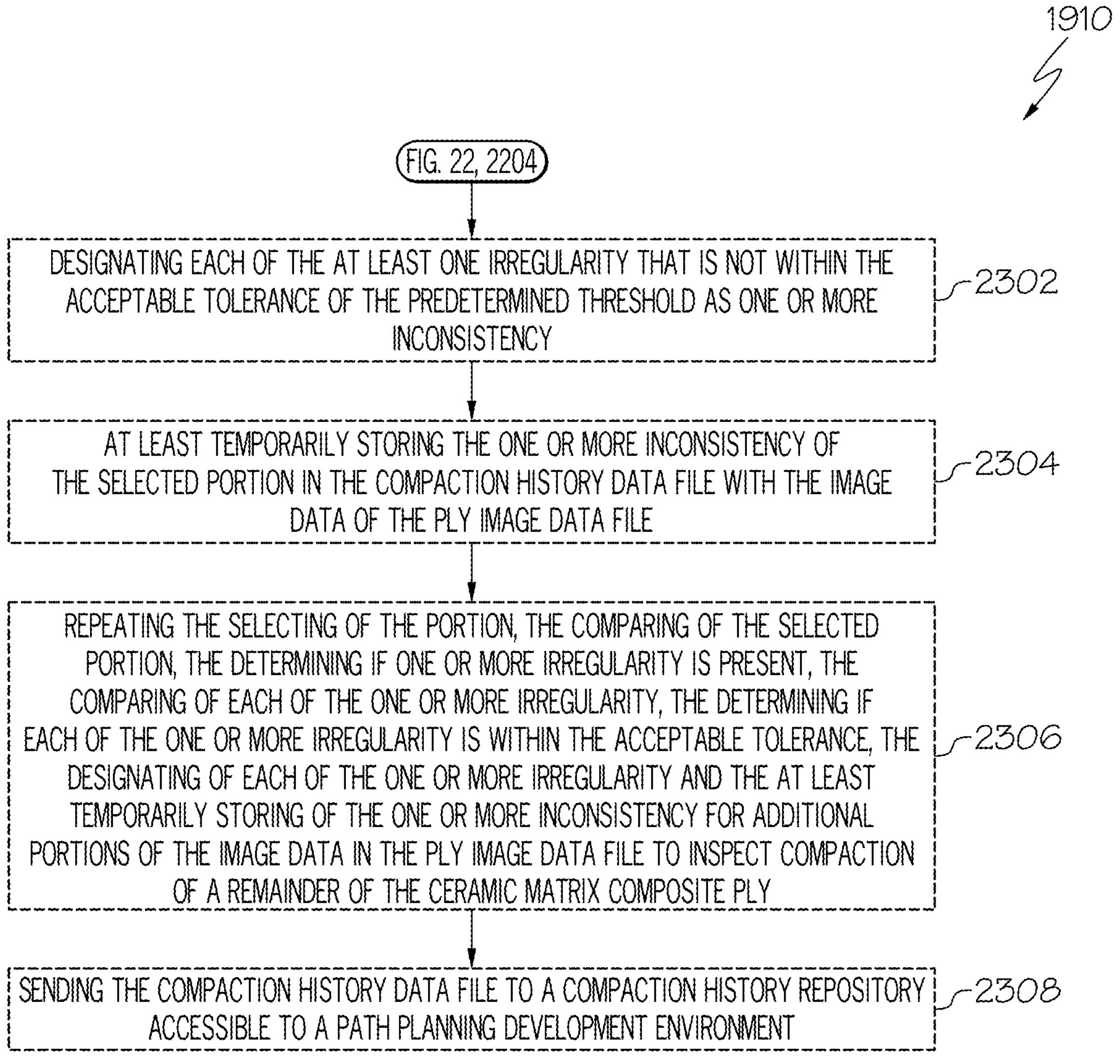
FIG. 23, in combination with FIGS. 21 and 22, is a flow diagram of yet another example of the processing of the ply image data file of FIG. 19.
Figure 24:
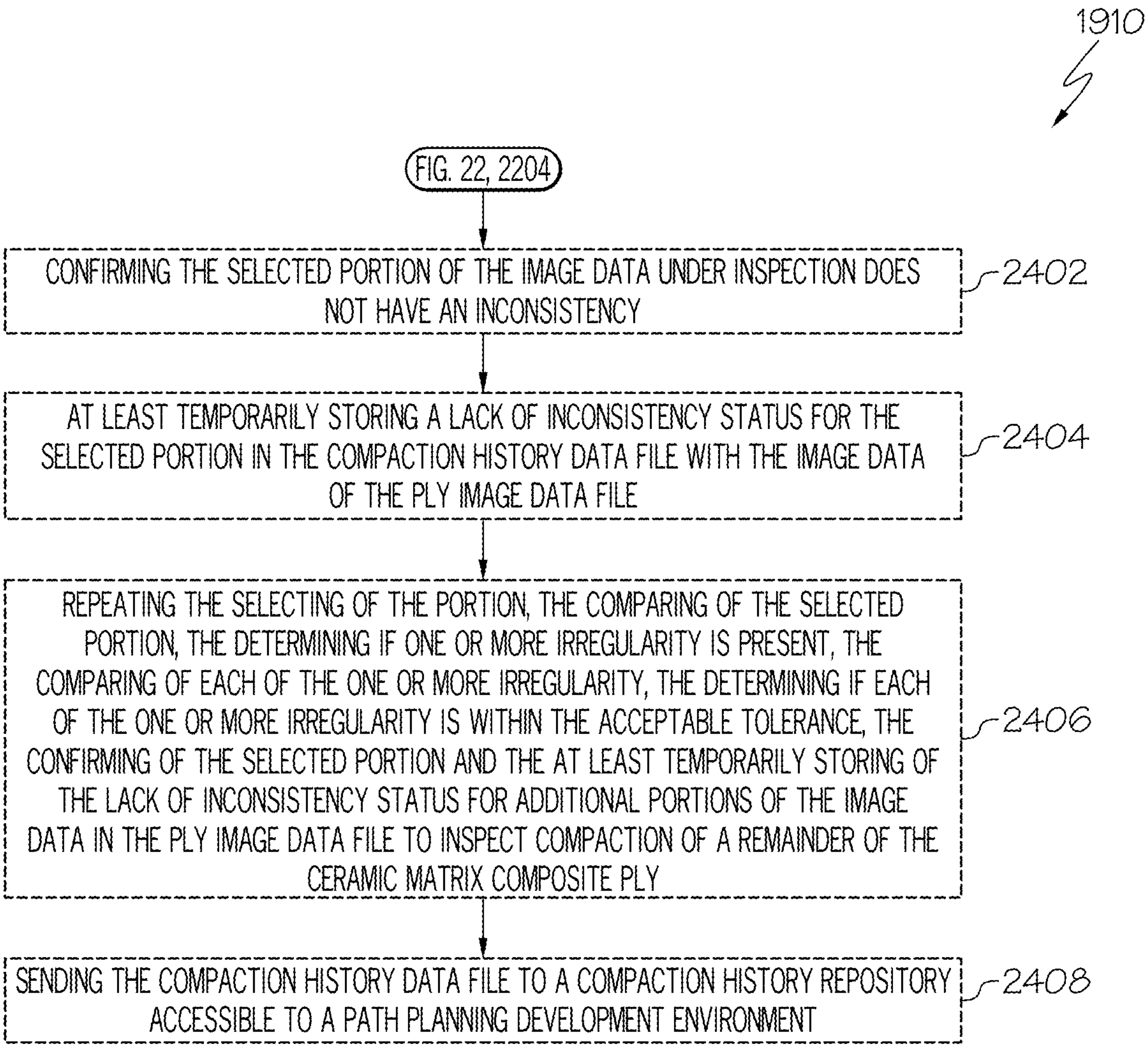
FIG. 24, in combination with FIGS. 21 and 22, is a flow diagram of still another example of the processing of the ply image data file of FIG. 19.
Figure 25:
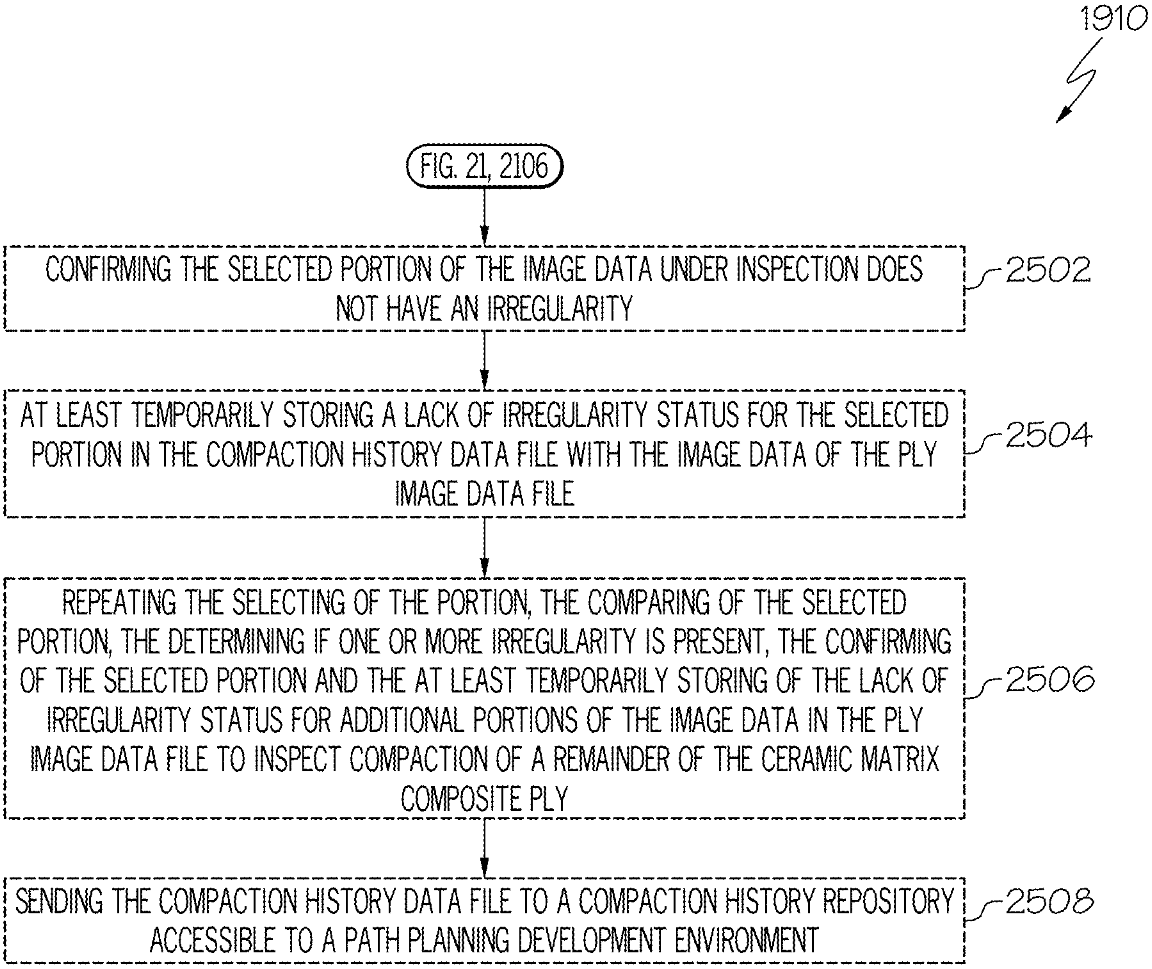
FIG. 25 in combination with FIG. 21, is a flow diagram of still yet another example of the processing of the ply image data file of FIG. 19.
Figure 26:
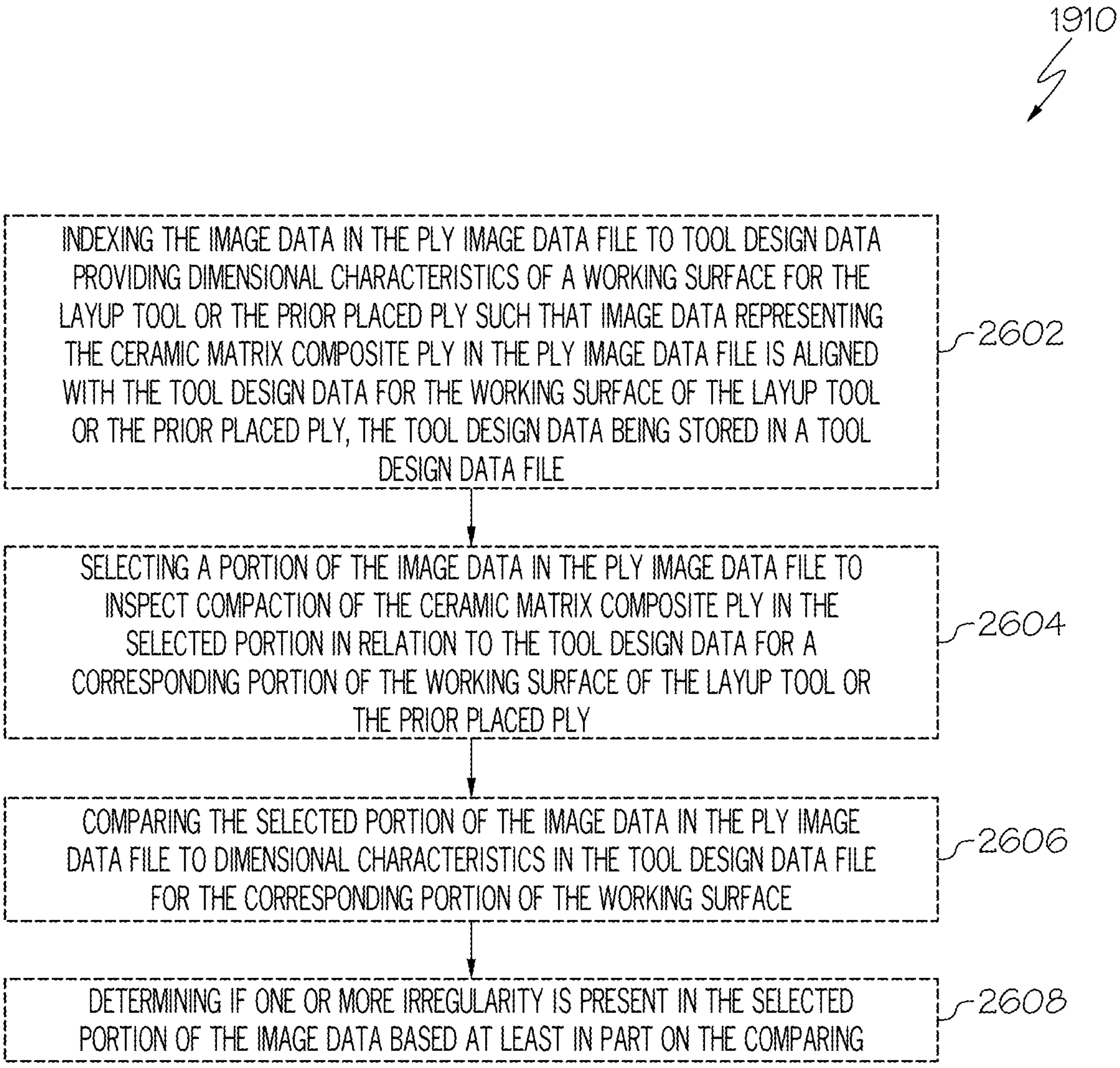
FIG. 26 is a flow diagram of another example of the processing of the ply image data file of FIG. 19.
Figure 27:
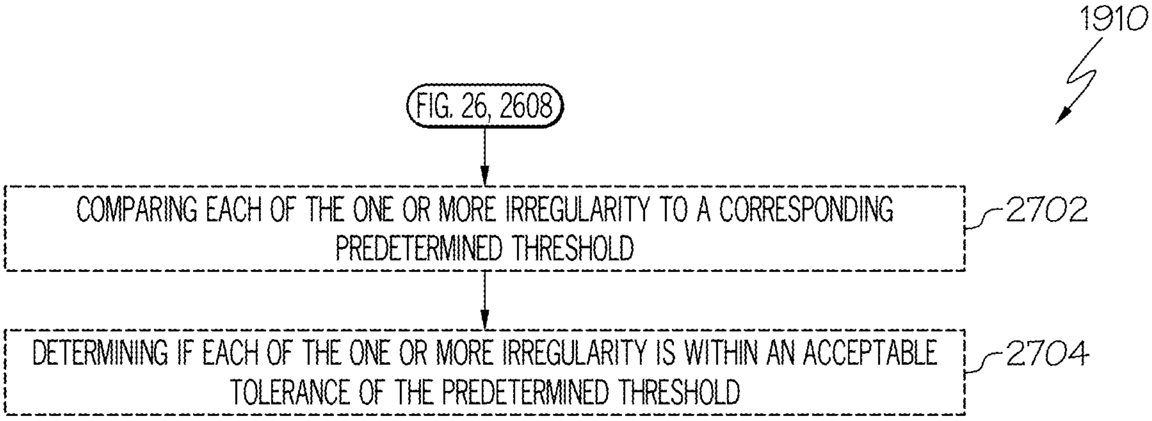
FIG. 27 in combination with FIG. 26, is a flow diagram of yet another example of the processing of the ply image data file of FIG. 19.
Figure 28:
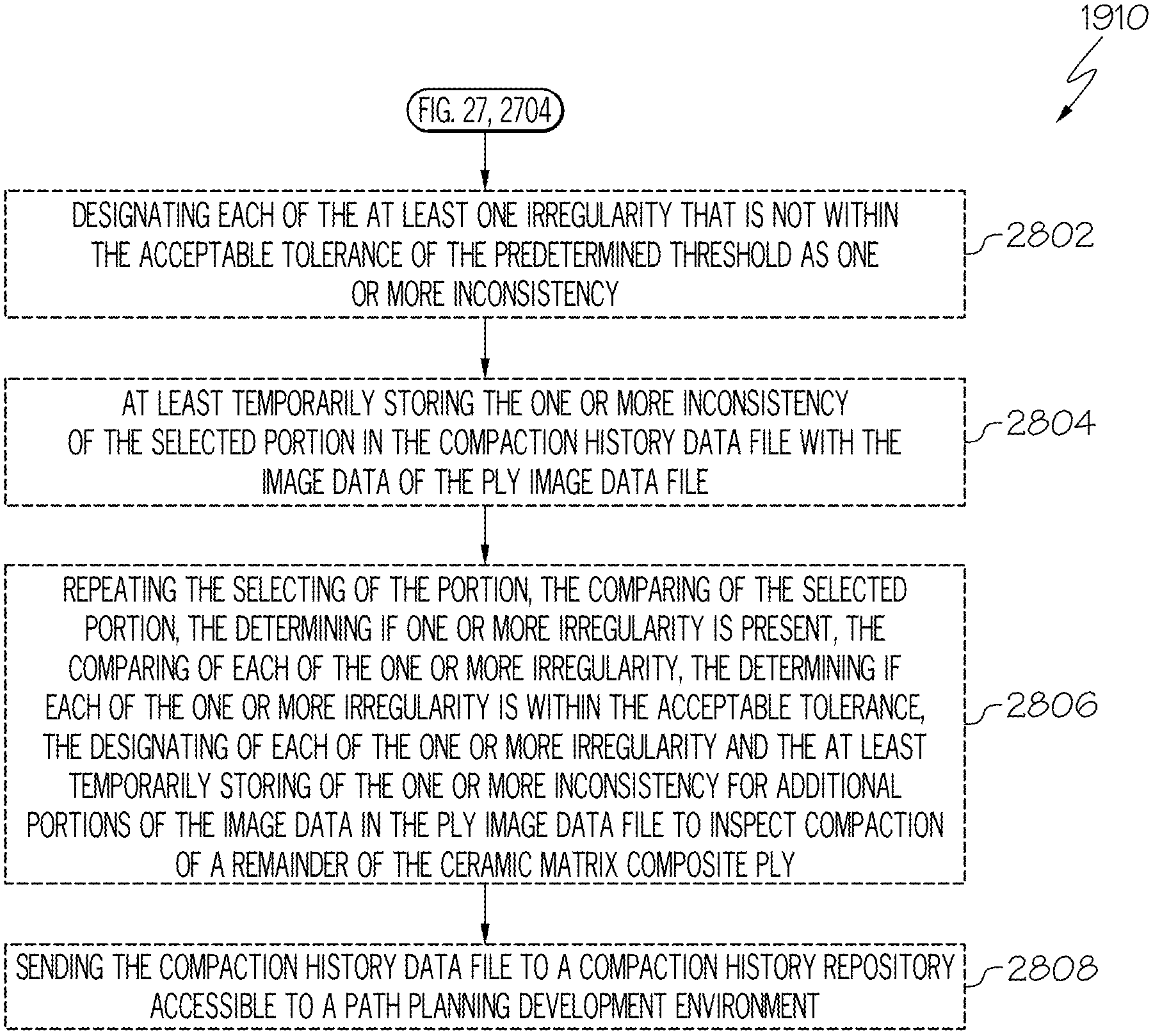
FIG. 28, in combination with FIGS. 26 and 27, is a flow diagram of still another example of the processing of the ply image data file of FIG. 19.
Figure 29:
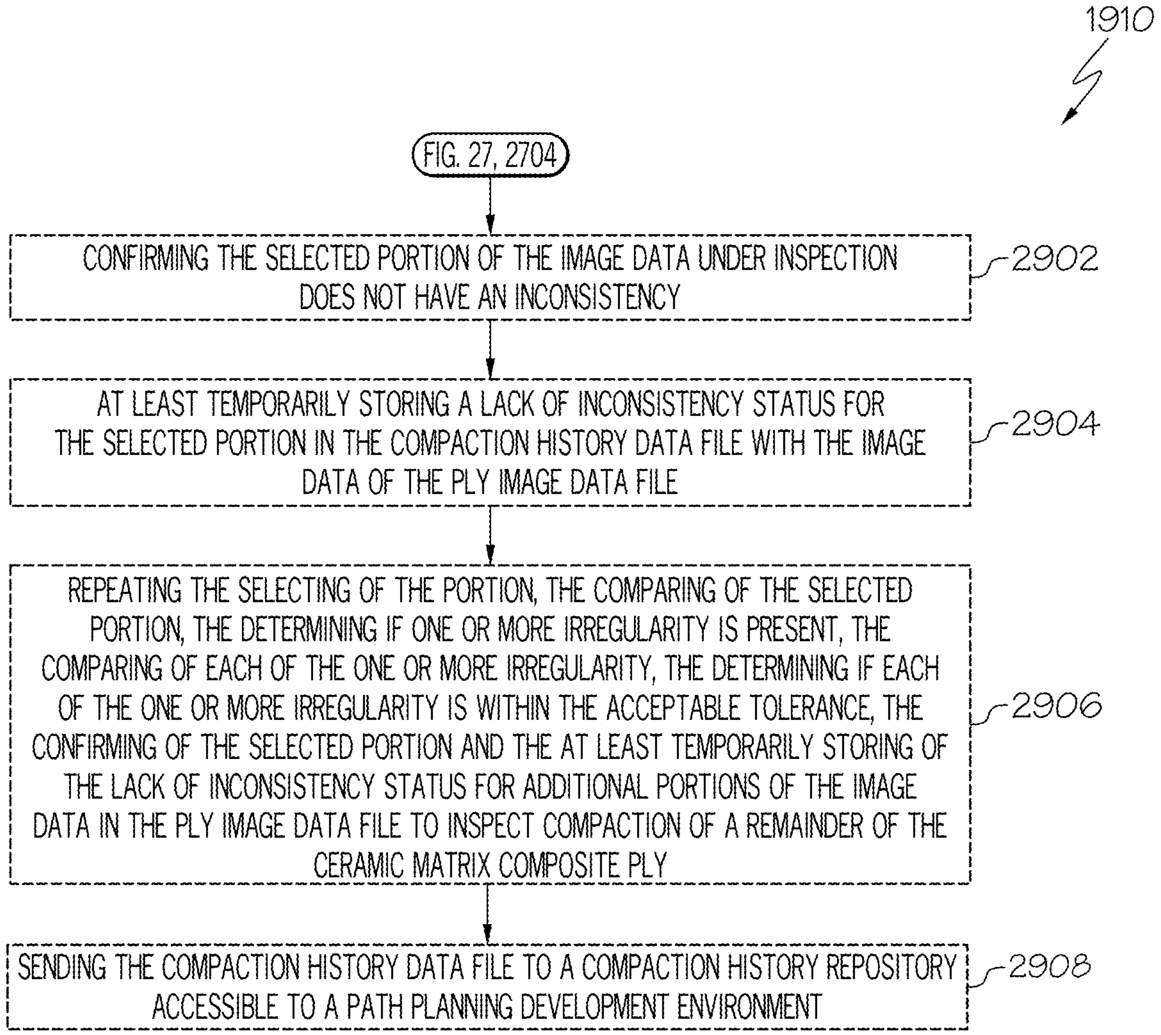
FIG. 29, in combination with FIGS. 26 and 27, is a flow diagram of still yet another example of the processing of the ply image data file of FIG. 19.
Figure 30:
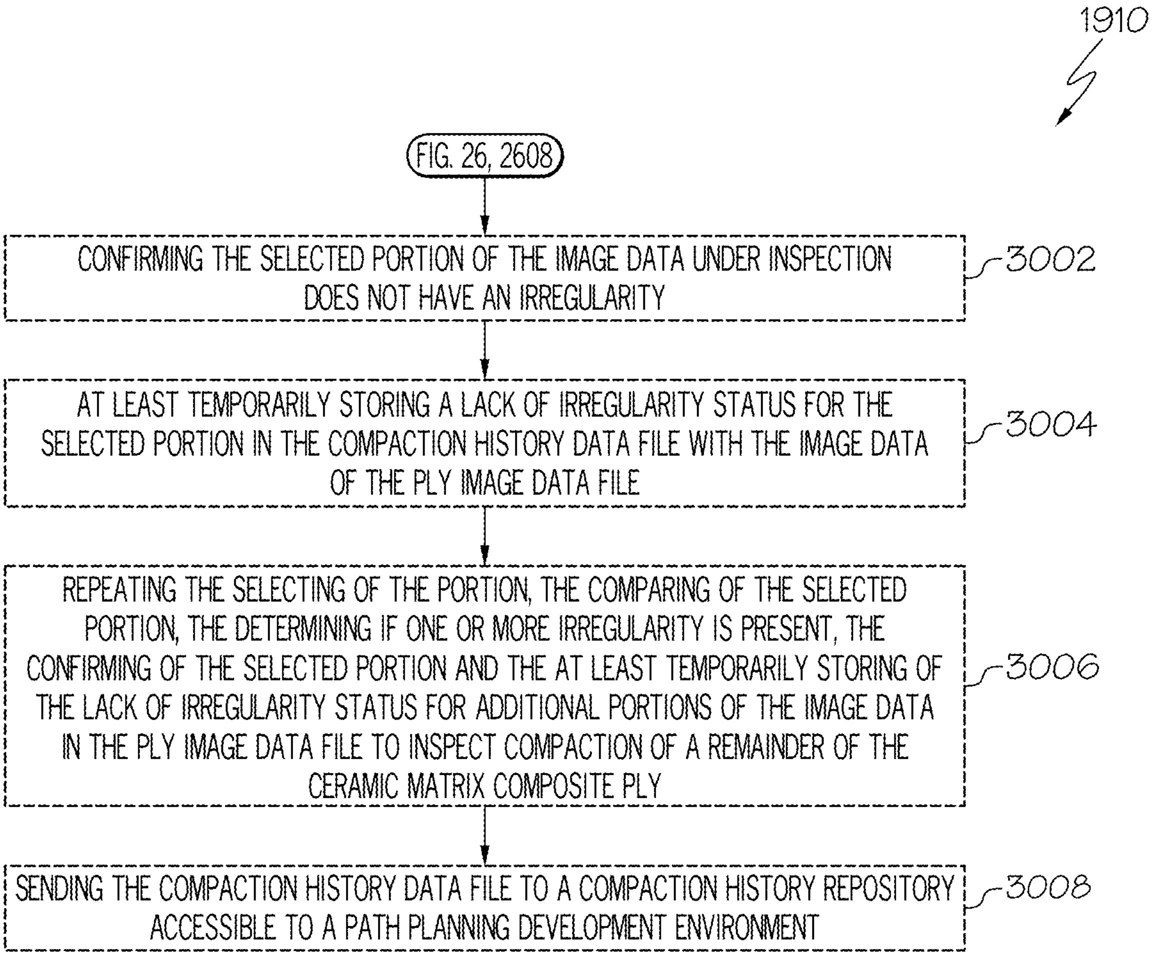
FIG. 30, in combination with FIG. 26, is a flow diagram of another example of the processing of the ply image data file of FIG. 19.

Referring generally to FIGS. 19-35 and 37A-D, by way of examples, the present disclosure is directed to a method 1900, 2000 for developing a path plan 3500 for rollout compaction of a composite ply during composite manufacturing 3402. FIGS. 19 and 21-30 disclose various examples of method 1900. FIGS. 19 and 20 disclose various examples of method 2000. FIG. 31 discloses an example of a path planning development environment 3100 for composite manufacturing 3402. FIG. 32 discloses an example of at least one central storage device 3200. FIG. 33 discloses an example of a path plan test bed 3300. FIG. 34 discloses an example of a composite manufacturing layup cell 3400. FIG. 35 discloses an example an example of a path plan 3500 for a ceramic matrix composite ply 3106 in which ceramic reinforcement fibers 3508 are at a zero-degree orientation 3702. FIGS. 37A-D disclose examples of composite plies in which reinforcement fibers are at a zero-degree orientation 3702, a 45-degree orientation 3704, a 90-degree orientation 3706 and a −45-degree orientation 3708.

With reference again to FIGS. 19, 31-35 and 37A-D, in one or more examples, a method 1900 (see FIG. 19) for developing a path plan 3500 for rollout compaction of a composite ply during composite manufacturing 3402 includes selecting 1902 a nominal path plan data file 3320 from a nominal path plan repository 3208. At 1904, a compaction application program 3306 is run using the nominal path plan data file 3320 for automated manipulation of a compaction roller 3102 to compact a ceramic matrix composite ply 3106 on a layup tool 3108 or on a prior placed ply. At 1906. image data of the ceramic matrix composite ply 3106 is captured after compaction on the layup tool 3108 or on the prior placed ply using a surface imaging device 3308. At 1908, the image data for the ceramic matrix composite ply 3106 after the compaction is at least temporarily stored in a ply image data file 3310. At 1910, the ply image data file 3310 is processed to identify one or more inconsistency 3504 in the ceramic matrix composite ply 3106 on the layup tool 3108 or on the prior placed ply after the compaction and to form a compaction history data file 3112 with the image data of the ply image data file 3310 and additional data regarding the one or more inconsistency 3504.

In another example of the method 1900, the selecting 1902 of the nominal path plan data file 3320 is based at least in part on identification of the ceramic matrix composite ply 3106, identification of the layup tool 3108 upon which the ceramic matrix composite ply 3106 is to be compacted and identification of an orientation 3506 for the ceramic matrix composite ply 3106 on the layup tool 3108 or on the prior placed ply. In a further example, the identification of the ceramic matrix composite ply 3106 is based at least in part on selection of a desired composition 3522 of the ceramic matrix composite ply 3106 from a plurality of ceramic matrix composite plies 3106 having a corresponding plurality of available compositions 3522. In another further example, the identification of the layup tool 3108 is based at least in part on selection of a desired geometry of the layup tool 3108 from a plurality of layup tools 3108 having a corresponding plurality of available geometries.

In yet another further example, the identification of the orientation 3506 of the ceramic matrix composite ply 3106 is based at least in part on selection of a desired orientation 3506 of ceramic reinforcement fibers 3508 within the ceramic matrix composite ply 3106 from a plurality of available orientations 3506 for the ceramic reinforcement fibers 3508. In an even further example, the plurality of available orientations 3506 includes at least one of a zero-degree orientation 3702, a 45-degree orientation 3704, a 60-degree orientation, a 90-degree orientation 3706, a −45-degree orientation 3708 and a −60-degree orientation.

In another example, the method 1900 also includes placing 1912 the ceramic matrix composite ply 3106 on the layup tool 3108 or on the prior placed ply at a previously determined orientation 3506 prior to the compaction. In a further example, the previously determined orientation 3506 includes a zero-degree orientation 3702, a 45-degree orientation 3704, a 60-degree orientation, a 90-degree orientation 3706, a −45-degree orientation 3708 or a −60-degree orientation.

In yet another example of the method 1900, the automated manipulation includes maneuvering the compaction roller 3102 along the path plan 3500. In still another example of the method 1900, the compaction roller 3102 includes an approximately three inch roller, a roller having a width ranging between approximately two inches and approximately four inches, a roller having a width ranging between approximately five inches and approximately seven inches, a roller having a width ranging between approximately eight inches and approximately ten inches, a roller having a width ranging between approximately eleven inches and approximately thirteen inches or any other suitable compaction roller. In still yet another example of the method 1900, the compaction roller 3102 is attached to an end effector 3312 of a robotic arm 3314.

In another example of the method 1900, the ceramic matrix composite ply 3106 includes ceramic reinforcement fibers 3508 and a ceramic matrix 3510. In a further example, the ceramic reinforcement fibers 3508 include carbon reinforcement fibers 3524, silicon carbide reinforcement fibers 3526, alumina reinforcement fibers 3528, alumina silica reinforcement fibers 3530 or any other suitable ceramic reinforcement fibers in any suitable combination. In another further example, the ceramic matrix 3510 includes carbon material 3532, silicon carbide material 3534, alumina material 3536, alumina silica material 3538 or any other suitable ceramic material in any suitable combination. In yet another further example, the ceramic matrix 3510 is deposited on the ceramic reinforcement fibers 3508 to form the ceramic matrix composite ply 3106. In still yet another further example, the ceramic reinforcement fibers 3508 are embedded in the ceramic matrix 3510 to form the ceramic matrix composite ply 3106.

In yet another example of the method 1900, the layup tool 3108 includes a working surface 3302 upon which the ceramic matrix composite ply 3106 is placed during the composite manufacturing 3402. In a further example, the working surface 3302 of the layup tool 3108 is three-dimensional 3324. In another further example, the working surface 3302 of the layup tool 3108 includes a curved portion 3326, a double curved portion 3328, a contoured portion 3330, a geometrically-shaped portion 3332, a rising ramp portion 3334, a falling ramp portion 3336, a two-dimensional portion 3338 or any other suitable shaped-portion in any suitable combination.

In still another example of the method 1900, the surface imaging device 3308 includes a three-dimensional camera, a color plus depth camera, a color camera, a depth camera, a depth sensor, a time-of-flight sensor, a red-green-blue plus depth camera, a stereo vision camera, a binocular vision camera, a laser profilometer, a light detection and ranging sensor or any other suitable surface imaging device.

In still yet another example of the method 1900, the selecting 1902 of the nominal path plan data file 3320, the running 1904 of the compaction application program 3306, the capturing 1906 of the image data, the at least temporarily storing 1908 of the image data and the processing 1910 of the ply image data file 3310 are performed by a test robot control system 3304 in a path plan test bed 3300.

In another example of the method 1900, the one or more inconsistency 3504 includes a bubble in the ceramic matrix composite ply 3106, a blister in the ceramic matrix composite ply 3106, a crease in the ceramic matrix composite ply 3106, a wrinkle in the ceramic matrix composite ply 3106, a bridge in the ceramic matrix composite ply 3106, a void in the ceramic matrix composite ply 3106, an untacked edge in the ceramic matrix composite ply 3106, a free edge in the ceramic matrix composite ply 3106, a pleat in the ceramic matrix composite ply 3106, or any other suitable type of inconsistency in any suitable combination.

With reference again to FIGS. 19, 20 and 31-35, in one or more examples, a method 2000 (see FIG. 20) for developing a path plan 3500 for rollout compaction of a composite ply during composite manufacturing 3402 includes the method 1900 of FIG. 19. The method 2000 continues from 1910 to 2002 where the compaction history data file 3112 is at least temporarily stored. At 2004, the compaction history data file 3112 is sent to a compaction history repository 3204 accessible to a path planning development environment 3100. In another example, the method 2000 also includes repeating 2006 the running 1904 of the compaction application program 3306, the capturing 1906 of the image data, the at least temporarily storing 1908 of the image data for the ceramic matrix composite ply 3106, the processing 1910 of the ply image data file 3310, the at least temporarily storing 2002 of the compaction history data file 3112 and the sending 2004 of the compaction history data file 3112 for compaction of one or more fresh ceramic matrix composite ply 3106 in a same orientation 3506 on the layup tool 3108 or on the prior placed ply as the ceramic matrix composite ply 3106 to form a corresponding one or more additional compaction history data file 3112. In a further example, the compaction history data file 3112 and the one or more additional compaction history data file 3112 form a training data set 3210 of compaction history data files 3112 in the compaction history repository 3204 accessible to the path planning development environment 3100. The training data set 3210 relating to the ceramic matrix composite ply 3106, the layup tool 3108 and the orientation 3506 of the ceramic matrix composite ply 3106 on the layup tool 3108 or on the prior placed ply.

With reference again to FIGS. 19 and 21-35, various additional examples of the method 1900 (see FIG. 19) for developing a path plan 3500 for rollout compaction of a composite ply during composite manufacturing 3402 are disclosed. For example, the processing 1910 of the ply image data file 3310 includes selecting 2102 (see FIG. 21) a portion of the image data in the ply image data file 3310 to inspect compaction of the ceramic matrix composite ply 3106 in the selected portion. At 2104, the selected portion of the image data in the ply image data file 3310 is compared to adjacent image data for adjacent portions of the image data. At 2106, the process determines if one or more irregularity is present in the selected portion of the image data based at least in part on the comparing.

In another example of the method 1900, where one or more irregularity is present, the processing 1910 of the ply image data file 3310 also includes comparing 2202 (see FIG. 22) each of the one or more irregularity to a corresponding predetermined threshold. At 2204, the process determines if each of the one or more irregularity is within an acceptable tolerance of the predetermined threshold.

In a further example, where at least one irregularity of the one or more irregularity is not within the acceptable tolerance of the predetermined threshold, the processing 1910 of the ply image data file 3310 also includes designating 2302 (see FIG. 23) each of the at least one irregularity that is not within the acceptable tolerance of the predetermined threshold as one or more inconsistency 3504. At 2304, the one or more inconsistency 3504 of the selected portion is at least temporarily stored in the compaction history data file 3112 with the image data of the ply image data file 3310. In an even further example, the processing 1910 of the ply image data file 3310 also includes repeating 2306 the selecting 2102 of the portion, the comparing 2104 of the selected portion, the determining 2106 if one or more irregularity is present, the comparing 2202 of each of the one or more irregularity, the determining 2204 if each of the one or more irregularity is within the acceptable tolerance, the designating 2302 of each of the one or more irregularity and the at least temporarily storing 2304 of the one or more inconsistency 3504 for additional portions of the image data in the ply image data file 3310 to inspect compaction of a remainder of the ceramic matrix composite ply 3106. At 2308, the compaction history data file 3112 is sent to a compaction history repository 3204 accessible to a path planning development environment 3100.

In another further example, where the one or more irregularity is within the acceptable tolerance of the predetermined threshold, the processing 1910 of the ply image data file 3310 also includes confirming 2402 (see FIG. 24) the selected portion of the image data under inspection does not have an inconsistency 3504. At 2404, a lack of inconsistency status for the selected portion is at least temporarily stored in the compaction history data file 3112 with the image data of the ply image data file 3310. In an even further example, the processing 1910 of the ply image data file 3310 also includes repeating 2406 the selecting 2102 of the portion, the comparing 2104 of the selected portion, the determining 2106 if one or more irregularity is present, the comparing 2202 of each of the one or more irregularity, the determining 2204 if each of the one or more irregularity is within the acceptable tolerance, the confirming 2402 of the selected portion and the at least temporarily storing 2404 of the lack of inconsistency status for additional portions of the image data in the ply image data file 3310 to inspect compaction of a remainder of the ceramic matrix composite ply 3106. At 2408, the compaction history data file 3112 is sent to a compaction history repository 3204 accessible to a path planning development environment 3100.

In yet another example of the method 1900, where no irregularity is present in the selected portion of the image data, the processing 1910 of the ply image data file 3310 also includes confirming 2502 (see FIG. 25) the selected portion of the image data under inspection does not have an irregularity. At 2504, a lack of irregularity status for the selected portion is at least temporarily stored in the compaction history data file 3112 with the image data of the ply image data file 3310. In a further example, the processing 1910 of the ply image data file 3310 also includes repeating 2506 the selecting 2102 of the portion, the comparing 2104 of the selected portion, the determining 2106 if one or more irregularity is present, the confirming 2502 of the selected portion and the at least temporarily storing 2504 of the lack of irregularity status for additional portions of the image data in the ply image data file 3310 to inspect compaction of a remainder of the ceramic matrix composite ply 3106. At 2508, the compaction history data file 3112 is sent to a compaction history repository 3204 accessible to a path planning development environment 3100.

With reference again to FIGS. 19 and 21-35, various additional examples of the method 1900 (see FIG. 19) for developing a path plan 3500 for rollout compaction of a composite ply during composite manufacturing 3402 are disclosed. For example, the processing 1910 of the ply image data file 3310 includes indexing 2602 (see FIG. 26)

the image data in the ply image data file 3310 to tool design data providing dimensional characteristics of a working surface 3302 for the layup tool 3108 such that image data representing the ceramic matrix composite ply 3106 in the ply image data file 3310 is aligned with the tool design data for the working surface 3302 of the layup tool 3108. The tool design data being stored in a tool design data file 3318. At 2604, a portion of the image data in the ply image data file 3310 is selected to inspect compaction of the ceramic matrix composite ply 3106 in the selected portion in relation to the tool design data for a corresponding portion of the working surface 3302 of the layup tool 3108. At 2606, the selected portion of the image data in the ply image data file 3310 is compared to dimensional characteristics in the tool design data file 3318 for the corresponding portion of the working surface 3302. At 2608, the process determines if one or more irregularity is present in the selected portion of the image data based at least in part on the comparing.

In another example of the method 1900, where one or more irregularity is present, the processing 1910 of the ply image data file 3310 also includes comparing 2702 (see FIG. 27) each of the one or more irregularity to a corresponding predetermined threshold. At 2704, the process determines if each of the one or more irregularity is within an acceptable tolerance of the predetermined threshold.

In a further example, where at least one irregularity of the one or more irregularity is not within the acceptable tolerance of the predetermined threshold, the processing 1910 of the ply image data file 3310 also includes designating 2802 (see FIG. 28) each of the at least one irregularity that is not within the acceptable tolerance of the predetermined threshold as one or more inconsistency 3504. At 2804, the one or more inconsistency 3504 of the selected portion is at least temporarily stored in the compaction history data file 3112 with the image data of the ply image data file 3310. In an even further example, the processing 1910 of the ply image data file 3310 also includes repeating 2806 the selecting 2604 of the portion, the comparing 2606 of the selected portion, the determining 2608 if one or more irregularity is present, the comparing 2702 of each of the one or more irregularity, the determining 2704 if each of the one or more irregularity is within the acceptable tolerance, the designating 2802 of each of the one or more irregularity and the at least temporarily storing 2804 of the one or more inconsistency 3504 for additional portions of the image data in the ply image data file 3310 to inspect compaction of a remainder of the ceramic matrix composite ply 3106. At 2808, the compaction history data file 3112 is sent to a compaction history repository 3204 accessible to a path planning development environment 3100.

In another further example, where the one or more irregularity is within the acceptable tolerance of the predetermined threshold, the processing 1910 of the ply image data file 3310 also includes confirming 2902 (see FIG. 29) the selected portion of the image data under inspection does not have an inconsistency 3504. At 2904, a lack of inconsistency status for the selected portion is at least temporarily stored in the compaction history data file 3112 with the image data of the ply image data file 3310. In an even further example, the processing 1910 of the ply image data file 3310 also includes repeating 2906 the selecting 2604 of the portion, the comparing 2606 of the selected portion, the determining 2608 if one or more irregularity is present, the comparing 2702 of each of the one or more irregularity, the determining 2704 if each of the one or more irregularity is within the acceptable tolerance, the confirming 2902 of the selected portion and the at least temporarily storing 2904 of the lack of inconsistency status for additional portions of the image data in the ply image data file 3310 to inspect compaction of a remainder of the ceramic matrix composite ply 3106. At 2908, the compaction history data file 3112 is sent to a compaction history repository 3204 accessible to a path planning development environment 3100.

In yet another example of the method 1900, where no irregularity is present in the selected portion of the image data, the processing 1910 of the ply image data file 3310 also includes confirming 3002 (see FIG. 30) the selected portion of the image data under inspection does not have an irregularity. At 3004, a lack of irregularity status for the selected portion is at least temporarily stored in the compaction history data file 3112 with the image data of the ply image data file 3310. In a further example, the processing 1910 of the ply image data file 3310 also includes repeating 3006 the selecting 2604 of the portion, the comparing 2606 of the selected portion, the determining 2608 if one or more irregularity is present, the confirming 3002 of the selected portion and the at least temporarily storing 3004 of the lack of irregularity status for additional portions of the image data in the ply image data file 3310 to inspect compaction of a remainder of the ceramic matrix composite ply 3106. At 3008, the compaction history data file 3112 is sent to a compaction history repository 3204 accessible to a path planning development environment 3100.

With reference again to FIG. 30, an example of a path planning development environment 3100 includes at least one computing device 3116 in operative communication with at least one central storage device 3200 via a communication network 3118. The at least one computing device 3116 may also be in communication with a path plan test bed 3300 and a composite manufacturing layup cell 3400 via the communication network 3118. The at least one computing device 3116 includes at least one processor 3120 and associated memory 3122, a network interface 3124, at least one application program storage device 3126 and at least one data storage device 3128. The at least one computing device 3116 may also include a user input device 3130 and a user display device 3132. The at least one processor 3120 in operative communication with the network interface 3124, the at least one application program storage device 3126, the at least one data storage device 3128, the user input device 3130 and the user display device 3132. The network interface 3124 in operative communication with the communication network 3118. The at least one application program storage device 3126 storing a path adaptation application program 3110. The at least one data storage device 3128 storing a working path plan data file 3104, a compaction history data file 3112 and an adapted path plan data file 3114. The path plan test bed 3300 may include a compaction roller 3102, a ceramic matrix composite ply 3106, a layup tool 3108 and a surface imaging device 3308. The composite manufacturing layup cell 3400 may include a compaction roller 3102, a ceramic matrix composite ply 3106, a layup tool 3108 and a surface imaging device 3308.

With reference again to FIG. 32, an example of at least one central storage device 3200 includes a working path plan repository 3202 and a compaction history repository 3204. The at least one central storage device 3200 may also include a production path plan repository 3206 and a nominal path plan repository 3208. The working path plan repository 3202 stores at least one working path plan data file 3104 and at least one adapted path plan data file 3114. The compaction history repository 3204 stores at least one compaction history data file 3112. The compaction history repository 3204 may also store a training data set 3210 with at least one compaction history data file 3112. The production path plan repository 3206 may store at least one production path plan data file 3316. The nominal path plan repository 3208 may store at least one nominal path plan data file 3320.

With reference again to FIG. 33, an example of a path plan test bed 3300 includes a test robot control system 3304, at least one robotic arm 3314, at least one end effector 3312, a compaction roller 3102, a surface imaging device 3308, a ceramic matrix composite ply 3106 and a layup tool 3108. The test robot control system 3304 in operative communication with the at least one robotic arm 3314. The test robot control system 3304 also in operative communication with at least one central storage device 3200 via a communication network 3118. The at least one end effector 3312 is attached to the at least one robotic arm 3314. The compaction roller 3102 and the surface imaging device 3308 attached to the at least one end effector 3312. The layup tool 3108 includes a working surface 3302. The characteristics of the layup tool 3108 may include a geometry 3322, being three-dimensional 3324, a curved portion 3326, a double curved portion 3328, a contoured portion 3330, a geometrically-shaped portion 3332, a rising ramp portion 3334, a falling ramp portion 3336 and a two-dimensional portion 3338.

The test robot control system 3304 includes at least one processor 3340 and associated memory 3342, a network interface 3344, at least one application program storage device 3346 and at least one data storage device 3348. The test robot control system 3304 may also include a user input device 3350 and a user display device 3352. The test robot control system 3304 in operative communication with the network interface 3344, the at least one application program storage device 3346, the at least one data storage device 3348, the user input device 3350 and the user display device 3352. The network interface 3344 in operative communication with the communication network 3118. The at least one application program storage device 3346 storing a path adaptation application program 3110. The at least one application program storage device 3346 may also store a compaction application program 3306. The at least one data storage device 3348 storing a working path plan data file 3104, a compaction history data file 3112 and an adapted path plan data file 3114. The at least one data storage device 3348 may also store a ply image data file 3310, a production path plan data file 3316, a tool design data file 3318 and a nominal path plan data file 3320.

With reference again to FIG. 34, an example of a composite manufacturing layup cell 3400 may include a cell robot control system 3404, at least one robotic arm 3314, at least one end effector 3312, a compaction roller 3102, a surface imaging device 3308, a ceramic matrix composite ply 3106 and a layup tool 3108. The cell robot control system 3404 is in operative communication with the at least one robotic arm 3314. The cell robot control system 3404 also in operative communication with at least one central storage device 3200 via a communication network 3118. The at least one end effector 3312 is attached to the at least one robotic arm 3314. The compaction roller 3102 and the surface imaging device 3308 attached to the at least one end effector 3312. The layup tool 3108 includes a working surface 3302.

The cell robot control system 3404 may include at least one processor 3406 and associated memory 3408, a network interface 3410, at least one application program storage device 3412, at least one data storage device 3414, a user input device 3416 and a user display device 3418. The cell robot control system 3404 in operative communication with the network interface 3410, the at least one application program storage device 3412, the at least one data storage device 3414, the user input device 3416 and the user display device 3418. The network interface 3410 in operative communication with the communication network 3118. The at least one application program storage device 3412 may store a compaction application program 3306. The at least one data storage device 3414 may store a production path plan data file 3316.

Examples of methods 100, 900, 1000, 1900, 2000 for developing a path plan 3500 for rollout compaction of a composite ply during composite manufacturing 3402 may be related to or used in the context of aircraft design and manufacture. Although an aircraft example is described, the examples and principles disclosed herein may be applied to other products in the aerospace industry and other industries, such as the automotive industry, the space industry, the construction industry and other design and manufacturing industries. Accordingly, in addition to aircraft, the examples and principles disclosed herein may apply to methods for composite manufacturing in the design and manufacture of various types of vehicles and in the design and construction of various types of transportation structures.

The preceding detailed description refers to the accompanying drawings, which illustrate specific examples described by the present disclosure. Other examples having different structures and operations do not depart from the scope of the present disclosure. Like reference numerals may refer to the same feature, element, or component in the different drawings. Throughout the present disclosure, any one of a plurality of items may be referred to individually as the item and a plurality of items may be referred to collectively as the items and may be referred to with like reference numerals. Moreover, as used herein, a feature, element, component, or step preceded with the word "a" or "an" should be understood as not excluding a plurality of features, elements, components, or steps, unless such exclusion is explicitly recited.

Illustrative, non-exhaustive examples, which may be, but are not necessarily, claimed, of the subject matter according to the present disclosure are provided above. Reference herein to "example" means that one or more feature, structure, element, component, characteristic, and/or operational step described in connection with the example is included in at least one aspect, embodiment, and/or implementation of the subject matter according to the present disclosure. Thus, the phrases "an example," "another example," "one or more examples," and similar language throughout the present disclosure may, but do not necessarily, refer to the same example. Further, the subject matter characterizing any one example may, but does not necessarily, include the subject matter characterizing any other example. Moreover, the subject matter characterizing any one example may be, but is not necessarily, combined with the subject matter characterizing any other example.

As used herein, a system, apparatus, control system, device, computing device, processor, structure, article, element, component, or hardware "configured to" perform a specified function is indeed capable of performing the specified function without any alteration, rather than merely having potential to perform the specified function after further modification. In other words, the system, apparatus, device, control system, computing device, processor, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, control system, device, computing device, processor, structure, article, element, component, or hardware that enable the system, apparatus, control system, device, computing device, processor, structure, article, element, component, or hardware to perform the specified function without further modification. For purposes of this disclosure, a system, apparatus, device, control system, device, computing device, processor, structure, article, element, component, or hardware described as being "configured to" perform a particular function may additionally or alternatively be described as being "adapted to" and/or as being "operative to" perform that function.

Unless otherwise indicated, the terms "first," "second," "third," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, the phrase "at least one of," when used with a list of items, means different combinations of one or more of the listed items may be used and only one of each item in the list may be needed. For example, "at least one of item A, item B, and item C" may include, without limitation, item A or item A and item B. This example also may include item A, item B, and item C, or item B and item C. In other examples, "at least one of" may be, for example, without limitation, two of item A, one of item B, and ten of item C; four of item B and seven of item C; and other suitable combinations. As used herein, the term "and/or" and the "/" symbol includes any and all combinations of one or more of the associated listed items.

As used herein, the terms "coupled," "coupling," and similar terms refer to two or more elements that are joined, linked, fastened, attached, connected, put in communication, or otherwise associated (e.g., mechanically, electrically, fluidly, optically, electromagnetically) with one another. In various examples, the elements may be associated directly or indirectly. As an example, element A may be directly associated with element B. As another example, element A may be indirectly associated with element B, for example, via another element C. It will be understood that not all associations among the various disclosed elements are necessarily represented. Accordingly, couplings other than those depicted in the figures may also exist.

As used herein, the term "approximately" refers to or represents a condition that is close to, but not exactly, the stated condition that still performs the desired function or achieves the desired result. As an example, the term "approximately" refers to a condition that is within an acceptable predetermined tolerance or accuracy, such as to a condition that is within 10% of the stated condition. However, the term "approximately" does not exclude a condition that is exactly the stated condition. As used herein, the term "substantially" refers to a condition that is essentially the stated condition that performs the desired function or achieves the desired result.

In FIGS. 1-30 and 38, referred to above, the blocks may represent operations, steps, and/or portions thereof, and lines connecting the various blocks do not imply any particular order or dependency of the operations or portions thereof. It will be understood that not all dependencies among the various disclosed operations are necessarily represented. FIGS. 1-30 and 38 and the accompanying disclosure describing the operations of the disclosed methods set forth herein should not be interpreted as necessarily determining a sequence in which the operations are to be performed. Rather, although one illustrative order is indicated, it is to be understood that the sequence of the operations may be modified when appropriate. Accordingly, modifications, additions and/or omissions may be made to the operations illustrated and certain operations may be performed in a different order or simultaneously. Additionally, those skilled in the art will appreciate that not all operations described need be performed.

FIGS. 31-36 and 37A-D, referred to above, may represent functional elements, features, or components thereof and do not necessarily imply any particular structure. Accordingly, modifications, additions and/or omissions may be made to the illustrated structure. Additionally, those skilled in the art will appreciate that not all elements, features, and/or components described and illustrated in FIGS. 31-36 and 37A-D, referred to above, need be included in every example and not all elements, features, and/or components described herein are necessarily depicted in each illustrative example. Accordingly, some of the elements, features, and/or components described and illustrated in FIGS. 31-36 and 37A-D may be combined in various ways without the need to include other features described and illustrated in FIGS. 31-36 and 37A-D, other drawing figures, and/or the accompanying disclosure, even though such combination or combinations are not explicitly illustrated herein. Similarly, additional features not limited to the examples presented, may be combined with some or all the features shown and described herein. Unless otherwise explicitly stated, the schematic illustrations of the examples depicted in FIGS. 31-36 and 37A-D, referred to above, are not meant to imply structural limitations with respect to the illustrative example. Rather, although one illustrative structure is indicated, it is to be understood that the structure may be modified when appropriate. Accordingly, modifications, additions and/or omissions may be made to the illustrated structure. Furthermore, elements, features, and/or components that serve a similar, or at least substantially similar, purpose are labeled with like numbers in each of FIGS. 31-36 and 37A-D, and such elements, features, and/or components may not be discussed in detail herein with reference to each of FIGS. 31-36 and 37A-D. Similarly, all elements, features, and/or components may not be labeled in each of FIGS. 31-36 and 37A-D, but reference numerals associated therewith may be utilized herein for consistency.

Further, references throughout the present specification to features, advantages, or similar language used herein do not imply that all the features and advantages that may be realized with the examples disclosed herein should be, or are in, any single example. Rather, language referring to the features and advantages is understood to mean that a specific feature, advantage, or characteristic described in connection with an example is included in at least one example. Thus, discussion of features, advantages, and similar language used throughout the present disclosure may, but does not necessarily, refer to the same example.

Figure 39:
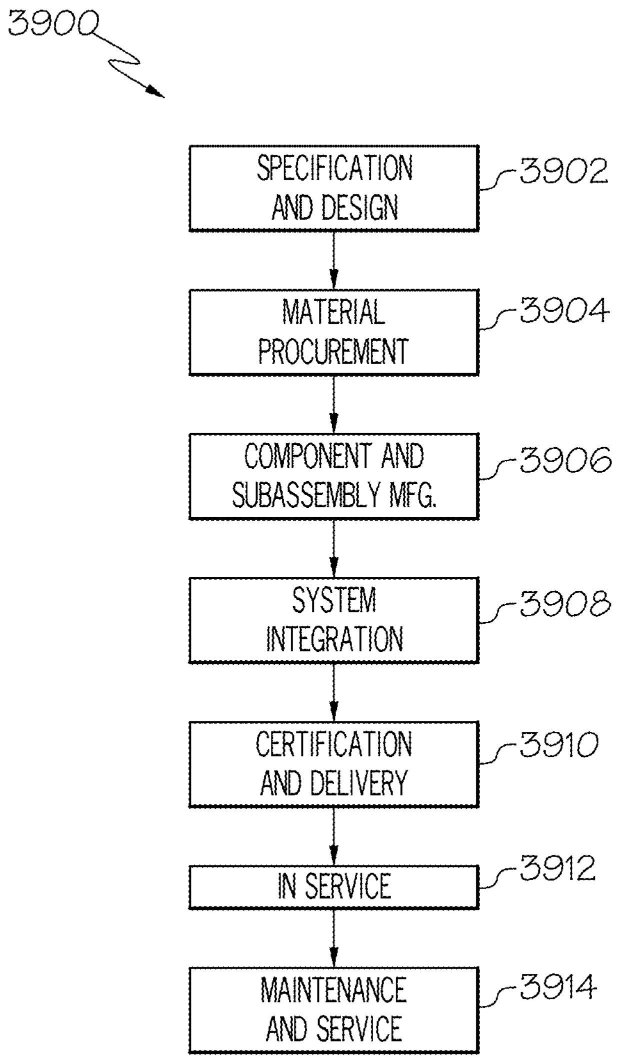
FIG. 39 is a block diagram of aircraft production and service methodology.
Figure 40:
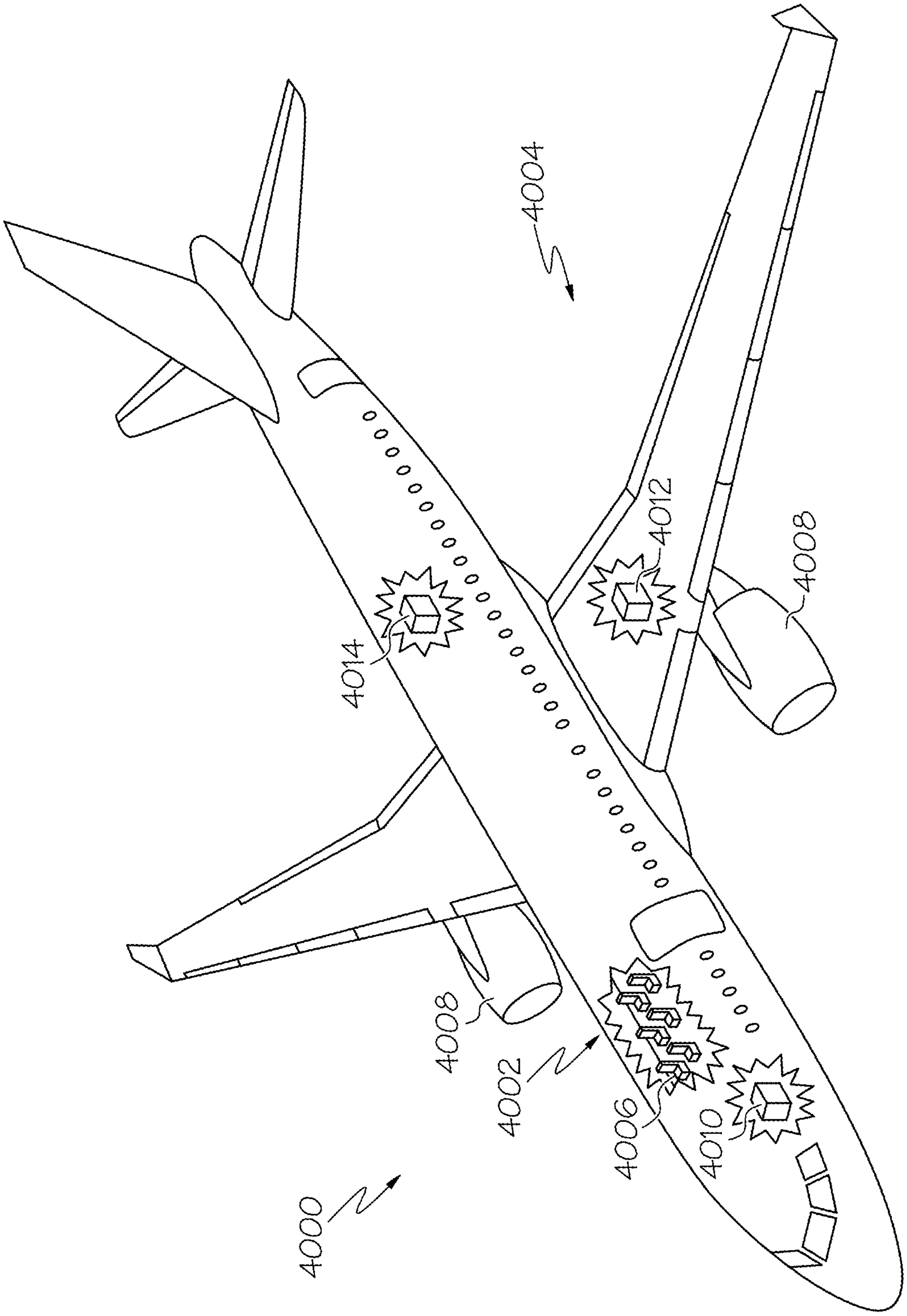
FIG. 40 is a schematic illustration of an aircraft.

Examples of the subject matter disclosed herein may be described in the context of aircraft manufacturing and service method 3900 as shown in FIG. 39 and aircraft 4000 as shown in FIG. 40. In one or more examples, the disclosed methods for developing a path plan for rollout compaction of a composite ply during composite manufacturing may be used in aircraft manufacturing. During pre-production, the service method 3900 may include specification and design (block 3902) of aircraft 4000 and material procurement (block 3904). During production, component and subassembly manufacturing (block 3906) and system integration (block 3908) of aircraft 4000 may take place. Thereafter, aircraft 4000 may go through certification and delivery (block 3910) to be placed in service (block 3912). While in service, aircraft 4000 may be scheduled for routine maintenance and service (block 3914). Routine maintenance and service may include modification, reconfiguration, refurbishment, etc. of one or more systems of aircraft 4000.

Each of the processes of the service method 3900 may be performed or carried out by a system integrator, a third party, and/or an operator (e.g., a customer). For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

As shown in FIG. 40, aircraft 4000 produced by the service method 3900 may include airframe 4002 with a plurality of high-level systems 4004 and interior 4006. Examples of high-level systems 4004 include one or more of propulsion system 4008, electrical system 4010, hydraulic system 4012, and environmental system 4014. Any number of other systems may be included. Although an aerospace example is shown, the principles disclosed herein may be applied to other industries, such as the automotive industry. Accordingly, in addition to aircraft 4000, the principles disclosed herein may apply to other vehicles, e.g., land vehicles, marine vehicles, space vehicles, etc.

The disclosed methods for developing a path plan for rollout compaction of a composite ply during composite manufacturing may be employed during any one or more of the stages of the manufacturing and service method 3900. For example, components or subassemblies corresponding to component and subassembly manufacturing (block 3906) may be fabricated or manufactured in a manner similar to components or subassemblies produced while aircraft 4000 is in service (block 3912). Also, one or more examples of the tooling set(s), system(s), method(s), or any combination thereof may be utilized during production stages (block 3906 and block 3908), for example, by substantially expediting assembly of or reducing the cost of aircraft 4000. Similarly, one or more examples of the tooling set, system or method realizations, or a combination thereof, may be utilized, for example and without limitation, while aircraft 4000 is in service (block 3912) and/or during maintenance and service (block 3914).

The described features, advantages, and characteristics of one example may be combined in any suitable manner in one or more other examples. One skilled in the relevant art will recognize that the examples described herein may be practiced without one or more of the specific features or advantages of a particular example. In other instances, additional features and advantages may be recognized in certain examples that may not be present in all examples. Furthermore, although various examples of the methods 100, 900, 1000, 1900, 2000 for developing a path plan for rollout compaction of a composite ply during composite manufacturing have been shown and described, modifications may occur to those skilled in the art upon reading the specification. The present application includes such modifications and is limited only by the scope of the claims.

What is claimed is:

1. A method for developing a path plan for rollout compaction of a composite ply during composite manufacturing, comprising:

selecting a working path plan data file from a working path plan repository, the working path plan data file defining the path plan for a compaction roller to compact a ceramic matrix composite ply on a layup tool or on a prior placed ply on the layup tool;

running a path adaptation application program to access compaction history data files in a compaction history repository relating to the working path plan data file and to identify at least one inconsistency in the compaction history data files that is not resolved in the working path plan data file; and generating at least one path adaptation for the working path plan data file based on the at least one inconsistency that is not resolved to form an adapted path plan data file defining an adapted path plan that includes the at least one path adaptation.

2. The method of claim 1, the running of the path adaptation application program comprising:

processing the compaction history data files to identify prior inconsistencies relating to the working path plan data file, to identify prior path adaptations that resolved the prior inconsistencies and to identify at least one prior inconsistency that is not resolved in the working path plan data file.

3. The method of claim 2, the generating of the at least one path adaptation comprising:

analyzing the working path plan data file in relation to the at least one prior inconsistency that is not resolved in the working path plan data file;

identifying the at least one path adaptation to the working path plan data file that would resolve the at least one prior inconsistency that is not resolved; and incorporating the at least one path adaptation into the working path plan data file to form the adapted path plan in the adapted path plan data file.

4. The method of claim 3, the generating of the at least one path adaptation further comprising:

at least temporarily storing the adapted path plan data file; and sending the adapted path plan data file to the working path plan repository.

5. The method of claim 3, the identifying of the at least one path adaptation comprising:

identifying a new sequence of paths for compaction of the ceramic matrix composite ply to resolve the at least one prior inconsistency, and the incorporating the at least one path adaptation comprising:

reordering a sequence of paths in the working path plan data file based at least in part on the new sequence of paths to form the adapted path plan data file.

6. The method of claim 3, the identifying of the at least one path adaptation comprising:

identifying a radial shift for at least a portion of paths for compaction of the ceramic matrix composite ply to resolve the at least one prior inconsistency, and the incorporating the at least one path adaptation comprising:

radially shifting at least the portion of the paths in the working path plan data file based at least in part on the identified radial shift to form the adapted path plan data file.

7. The method of claim 3, the identifying of the at least one path adaptation comprising:

identifying a linear shift for at least a portion of paths for compaction of the ceramic matrix composite ply to resolve the at least one prior inconsistency, and the incorporating the at least one path adaptation comprising:

linearly shifting at least the portion of the paths in the working path plan data file based at least in part on the identified linear shift to form the adapted path plan data file.

8. The method of claim 3, the identifying of the at least one path adaptation comprising:

identifying at least one replacement path to replace a corresponding at least one existing path for compaction of the ceramic matrix composite ply to resolve the at least one prior inconsistency, and the incorporating the at least one path adaptation comprising:

removing the at least one existing path associated with the at least one replacement path from the working path plan data file; and incorporating the at least one replacement path in the working path plan data file based at least in part on the identified at least one replacement path to form the adapted path plan data file.

9. The method of claim 3, the identifying of the at least one path adaptation comprising:

identifying at least one additional path for compaction of the ceramic matrix composite ply to resolve the at least one prior inconsistency, and the incorporating the at least one path adaptation comprising:

incorporating the at least one additional path in the working path plan data file based at least in part on the identified at least one additional path to form the adapted path plan data file.

10. The method of claim 3, the identifying of the at least one path adaptation comprising:

identifying a reference location shift for at least a portion of paths for compaction of the ceramic matrix composite ply to resolve the at least one prior inconsistency, and the incorporating the at least one path adaptation comprising:

shifting a reference location for at least the portion of the paths in the working path plan data file based at least in part on the identified reference location shift to form the adapted path plan data file.

11. A method for developing a path plan for rollout compaction of a composite ply during composite manufacturing, comprising:

selecting a working path plan data file from a working path plan repository;

running a compaction application program using the working path plan data file for automated manipulation of a compaction roller to compact a ceramic matrix composite ply on a layup tool or on a prior placed ply on the layup tool;

capturing image data of the ceramic matrix composite ply after compaction on the layup tool or on the prior placed ply using a surface imaging device;

at least temporarily storing the image data for the ceramic matrix composite ply after the compaction in a ply image data file; and processing the ply image data file to determine if one or more irregularity is present in the ceramic matrix composite ply on the layup tool or on the prior placed ply after the compaction, wherein where at least one irregularity is present, the processing of the ply image data file comprising:

selecting a portion of the image data in the ply image data file to inspect compaction of the ceramic matrix composite ply in the selected portion;

comparing the selected portion of the image data in the ply image data file to adjacent image data for adjacent portions of the image data; and determining if the at least one irregularity is present in the selected portion of the image data based at least in part on the comparing;

the method further comprising running a path adaptation application program to access a compaction history data file in a compaction history repository relating to the working path plan data file and to identify at least one inconsistency in the compaction history data file that is not resolved in the working path plan data file; and generating at least one path adaptation for the working path plan data file based on the at least one inconsistency that is not resolved to form an adapted path plan data file defining an adapted path plan that includes the at least one path adaptation.

12. The method of claim 11, further comprising:

placing the ceramic matrix composite ply on the layup tool or on the prior placed ply at a previously determined orientation prior to the compaction.

13. The method of claim 11, wherein where no irregularity is present, the method further comprising:

confirming no irregularity is present in the image data for the ply image data file of the ceramic matrix composite ply;

at least temporarily storing a lack of irregularity status in the compaction history data file with the image data of the ply image data file;

sending the compaction history data file to a compaction history repository; and sending the working path plan data file to a production path plan repository as a production path plan data file accessible to a composite manufacturing layup cell.

14. The method of claim 11, wherein where the at least one irregularity is present, the processing of the ply image data file further comprising:

comparing each of the at least one irregularity to a corresponding predetermined threshold; and determining if each of the at least one irregularity is within an acceptable tolerance of the predetermined threshold.

15. The method of claim 11, wherein where the at least one irregularity is present, the processing of the ply image data file comprising:

indexing the image data in the ply image data file to tool design data providing dimensional characteristics of a working surface for the layup tool such that image data representing the ceramic matrix composite ply in the ply image data file is aligned with the tool design data for the working surface of the layup tool, the tool design data being stored in a tool design data file;

selecting a portion of the image data in the ply image data file to inspect compaction of the ceramic matrix composite ply in the selected portion in relation to the tool design data for a corresponding portion of the working surface of the layup tool;

comparing the selected portion of the image data in the ply image data file to dimensional characteristics in the tool design data file for the corresponding portion of the working surface; and determining if the at least one irregularity is present in the selected portion of the image data based at least in part on the comparing.

16. A method for developing a path plan for rollout compaction of a composite ply during composite manufacturing, comprising:

selecting a nominal path plan data file from a nominal path plan repository;

running a compaction application program using the nominal path plan data file for automated manipulation of a compaction roller to compact a ceramic matrix composite ply on a layup tool or on a prior placed ply on the layup tool;

capturing image data of the ceramic matrix composite ply after compaction on the layup tool or on the prior placed ply using a surface imaging device;

at least temporarily storing the image data for the ceramic matrix composite ply after the compaction in a ply image data file; and processing the ply image data file to identify one or more inconsistency in the ceramic matrix composite ply on the layup tool or on the prior placed ply after the compaction and to form a compaction history data file with the image data of the ply image data file and additional data regarding the one or more inconsistency, the processing of the ply image data file comprising:

selecting a portion of the image data in the ply image data file to inspect compaction of the ceramic matrix composite ply in the selected portion;

comparing the selected portion of the image data in the ply image data file to adjacent image data for adjacent portions of the image data; and determining if one or more irregularity is present in the selected portion of the image data based at least in part on the comparing, wherein the selecting of the nominal path plan data file is based at least in part on identification of the ceramic matrix composite ply based at least in part on selection of a desired composition of the ceramic matrix composite ply from a plurality of ceramic matrix composite plies having a corresponding plurality of available compositions.

17. The method of claim 16, further comprising:

placing the ceramic matrix composite ply on the layup tool or on the prior placed ply at a previously determined orientation prior to the compaction.

18. The method of claim 16, further comprising:

at least temporarily storing the compaction history data file; and sending the compaction history data file to a compaction history repository accessible to a path planning development environment.

19. The method of claim 16, wherein where one or more irregularity is present, the processing of the ply image data file further comprising:

comparing each of the one or more irregularity to a corresponding predetermined threshold; and determining if each of the one or more irregularity is within an acceptable tolerance of the predetermined threshold.

20. The method of claim 16, the processing of the ply image data file comprising:

indexing the image data in the ply image data file to tool design data providing dimensional characteristics of a working surface for the layup tool such that image data representing the ceramic matrix composite ply in the ply image data file is aligned with the tool design data for the working surface of the layup tool, the tool design data being stored in a tool design data file;

selecting a portion of the image data in the ply image data file to inspect compaction of the ceramic matrix composite ply in the selected portion in relation to the tool design data for a corresponding portion of the working surface of the layup tool;

comparing the selected portion of the image data in the ply image data file to dimensional characteristics in the tool design data file for the corresponding portion of the working surface; and determining if one or more irregularity is present in the selected portion of the image data based at least in part on the comparing.

* * * * *